(12) United States Patent
Nakatsuka et al.

(10) Patent No.: US 6,583,534 B1
(45) Date of Patent: Jun. 24, 2003

(54) PIEZOELECTRIC TRANSFORMER, PIEZOELECTRIC TRANSFORMER DRIVE CIRCUIT, PIEZOELECTRIC TRANSFORMER DRIVE METHOD AND COLD CATHODE TUBE DRIVE APPARATUS USING PIEZOELECTRIC TRANSFORMER

(75) Inventors: Hiroshi Nakatsuka, Neyagawa (JP); Katsunori Moritoki, Takatsuki (JP); Toshiyuki Asahi, Osaka (JP); Kojiro Okuyama, Ikoma (JP); Osamu Kawasaki, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/588,079

(22) Filed: Jun. 5, 2000

(30) Foreign Application Priority Data

| Jun. 7, 1999 | (JP) | ............................................ 11-160074 |
| Jul. 19, 1999 | (JP) | ............................................ 11-205160 |
| Jan. 13, 2000 | (JP) | ........................................ 2000-004981 |

(51) Int. Cl.$^7$ ............................................. H01L 41/08
(52) U.S. Cl. .................. 310/359; 310/316.01; 310/366
(58) Field of Search ................................ 310/358, 359, 310/316.01, 317, 319

(56) References Cited

U.S. PATENT DOCUMENTS

| 3,736,446 A | * | 5/1973 | Berlincourt et al. .... 310/359 X |
| 3,790,826 A | * | 2/1974 | Kawada ...................... 310/359 |
| 5,872,419 A | * | 2/1999 | Hall et al. ................... 310/359 |

OTHER PUBLICATIONS

Japanese Patent Laid–Open No. Hei 11–68185 with Abstracts and a partial translation.

* cited by examiner

Primary Examiner—Mark O. Budd
(74) Attorney, Agent, or Firm—Smith, Gambrell & Russell, LLP

(57) ABSTRACT

The piezoelectric transformer of the present invention has a piezoelectric element 109 mainly formed of a piezoelectric material, primary electrodes 101U and 101D which are formed on the piezoelectric element 109 and to which a voltage is applied, a secondary electrode 102 which is formed on the piezoelectric element 109 and from which a voltage higher than the voltage applied to the primary electrode is output, and a sensor electrode 103 which is formed on the piezoelectric element 109 and from which a voltage lower than the output voltage of the secondary electrode is output.

3 Claims, 38 Drawing Sheets

P: polarization direction

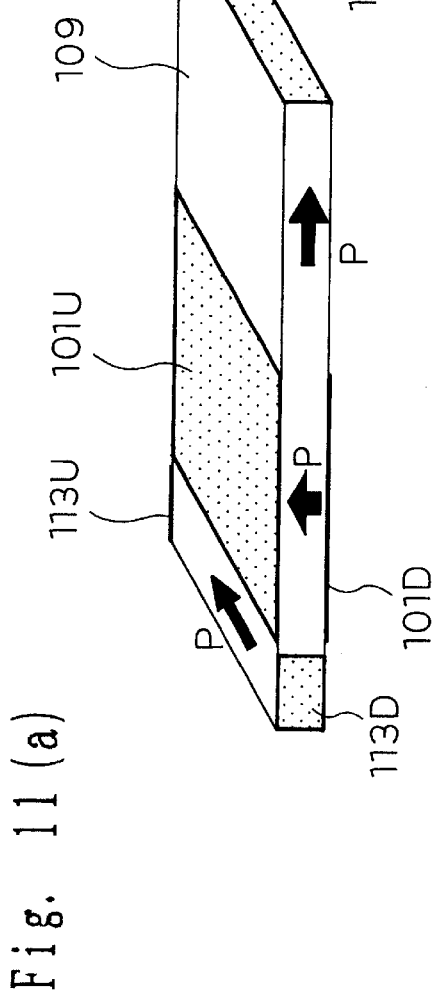
Fig. 11(a)
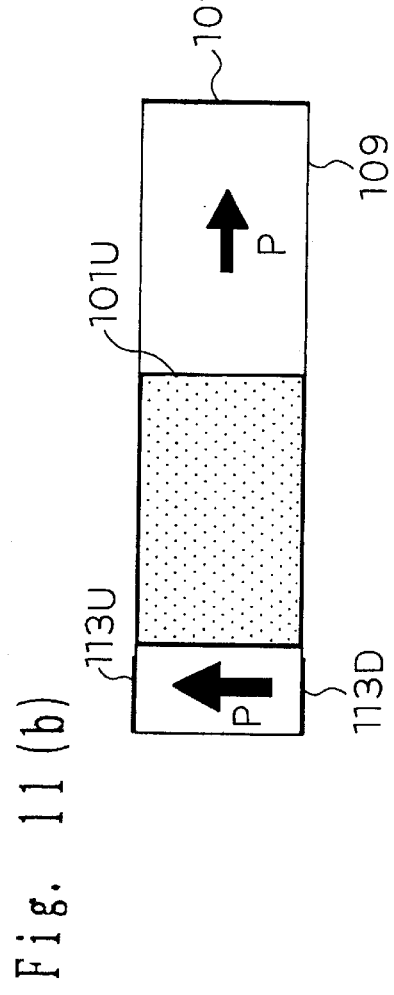
Fig. 11(b)
P: polarization direction P: polarization direction

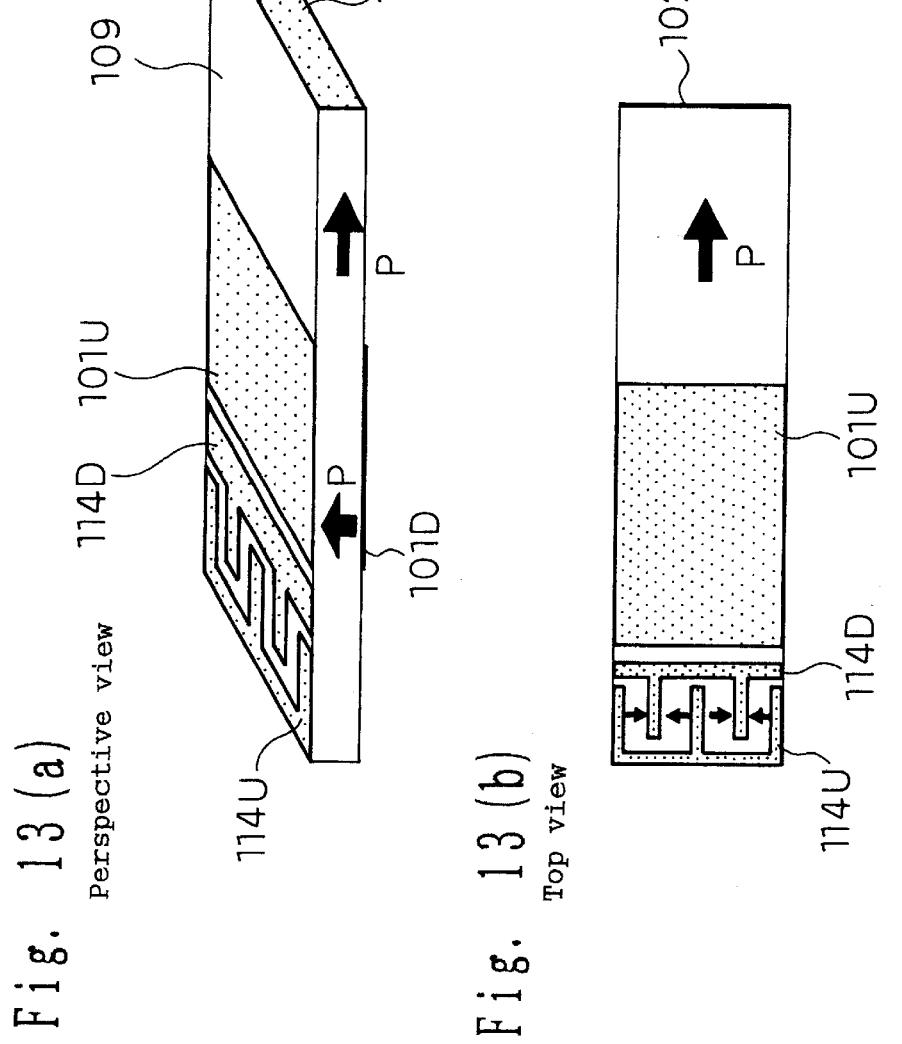
Fig. 13(a) Perspective view
Fig. 13(b) Top view
P: polarization direction

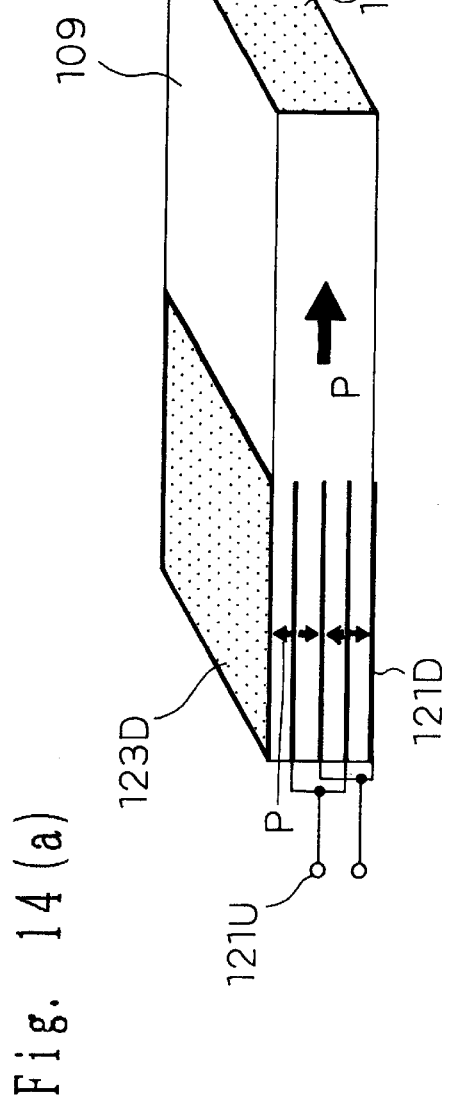
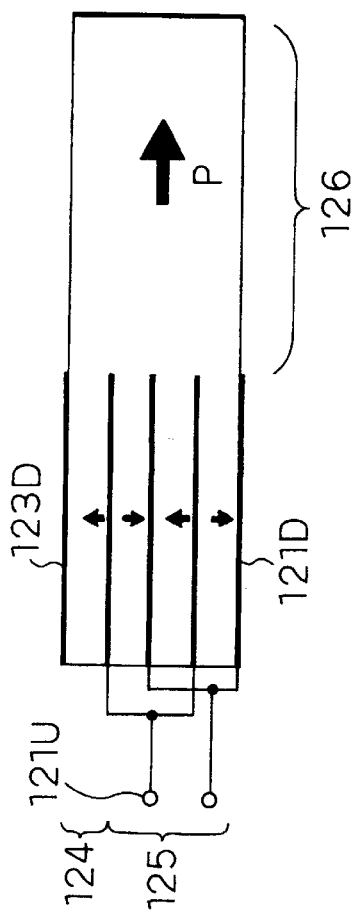
Fig. 14(a)
Fig. 14(b)
P: polarization direction

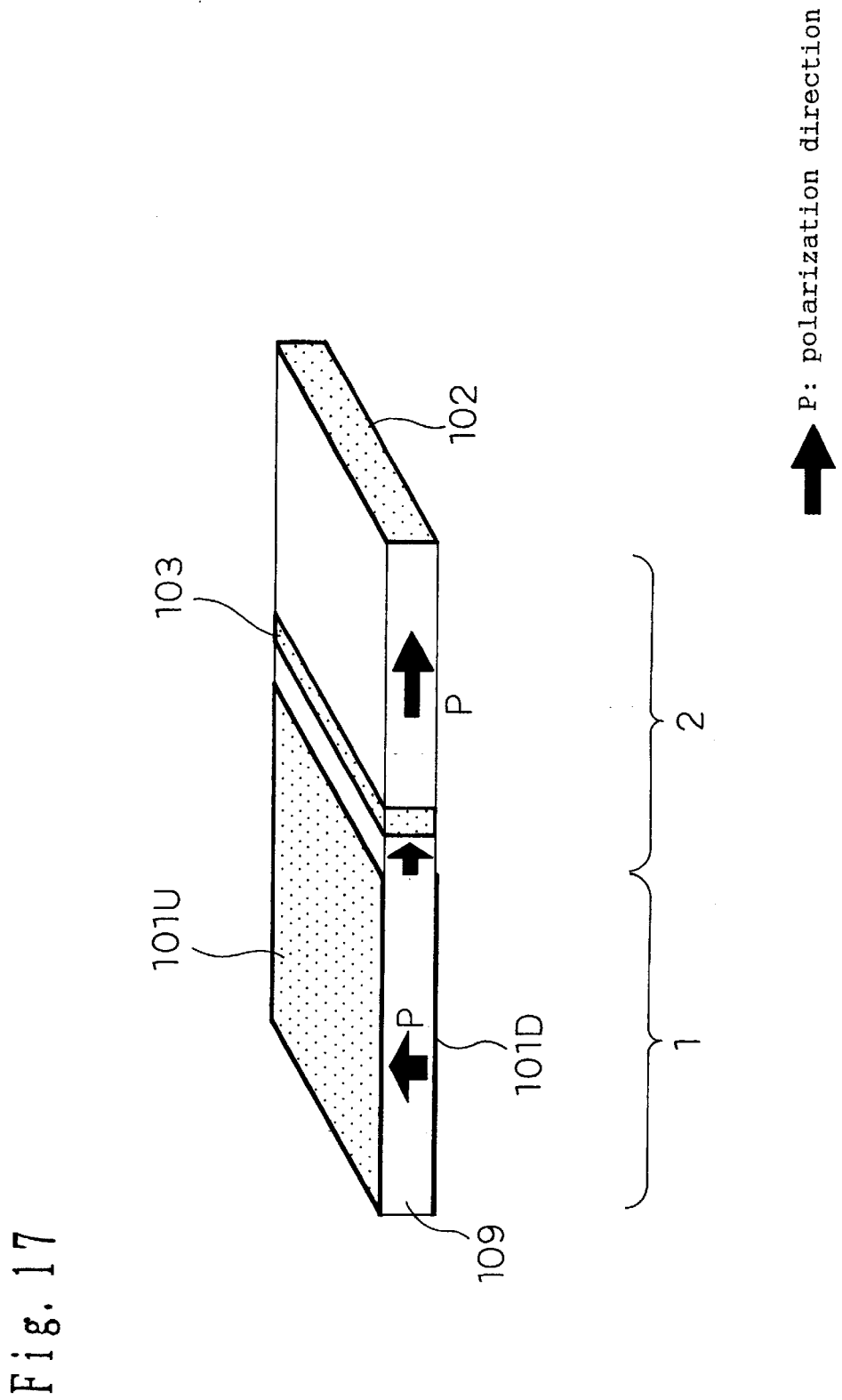

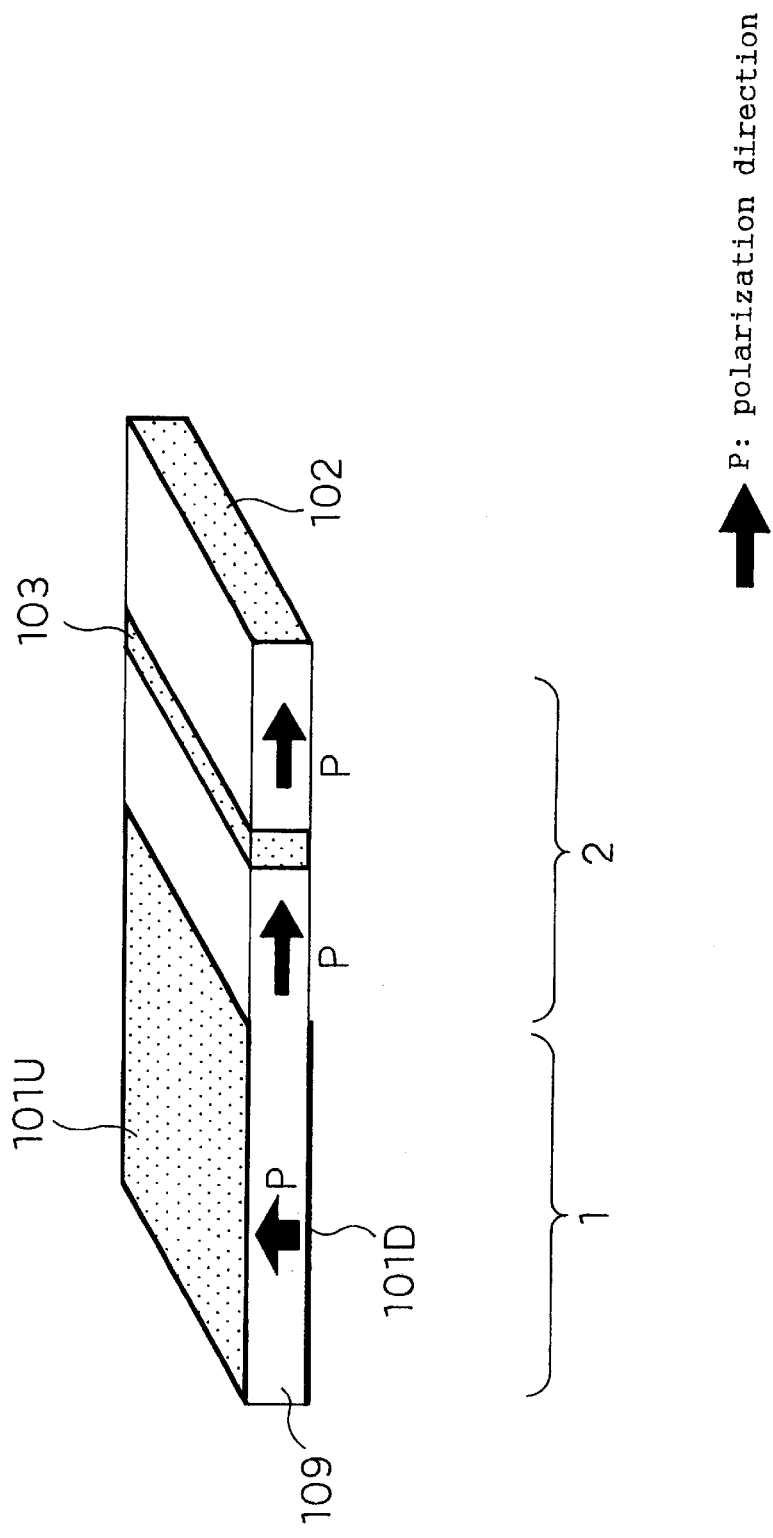

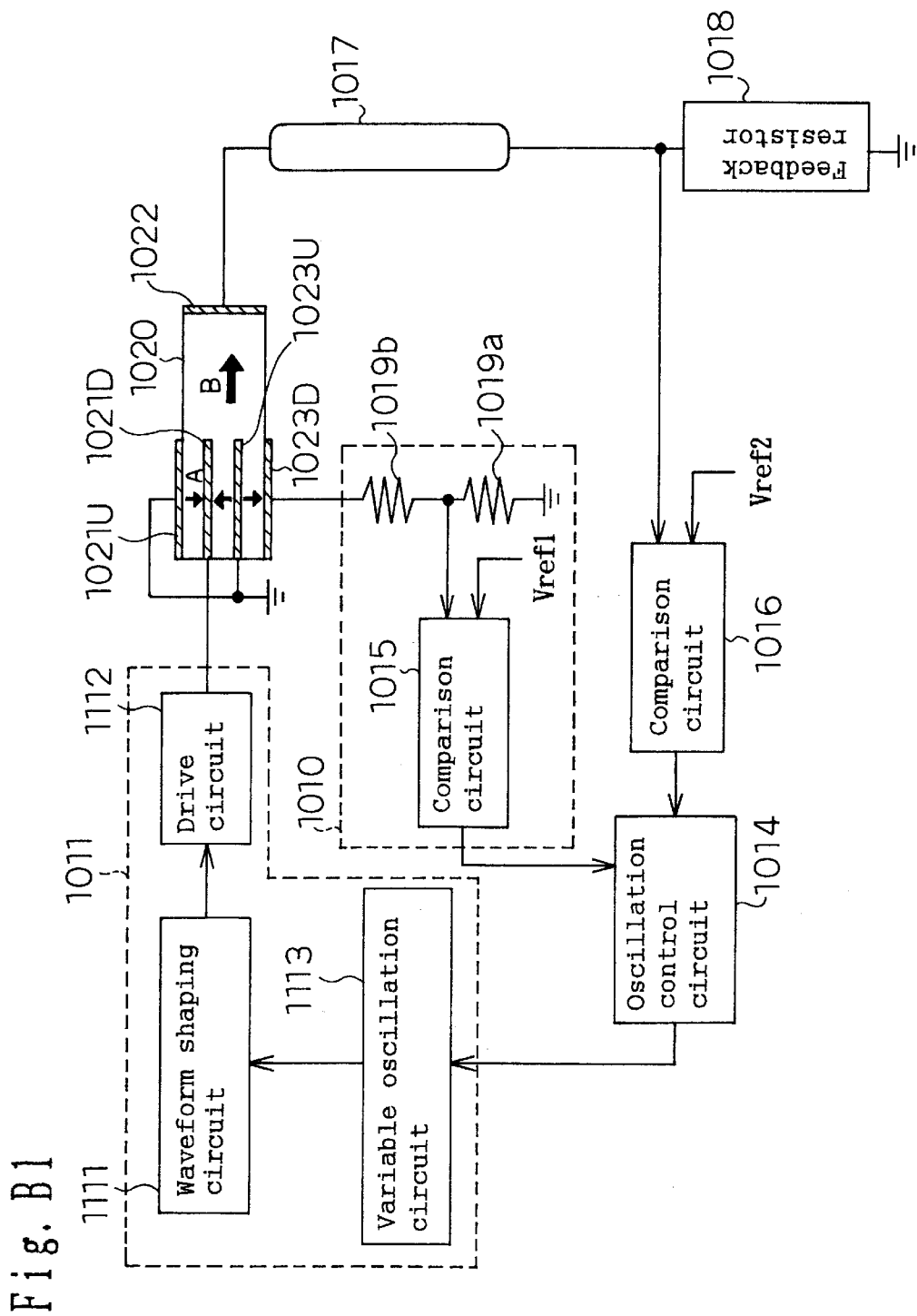

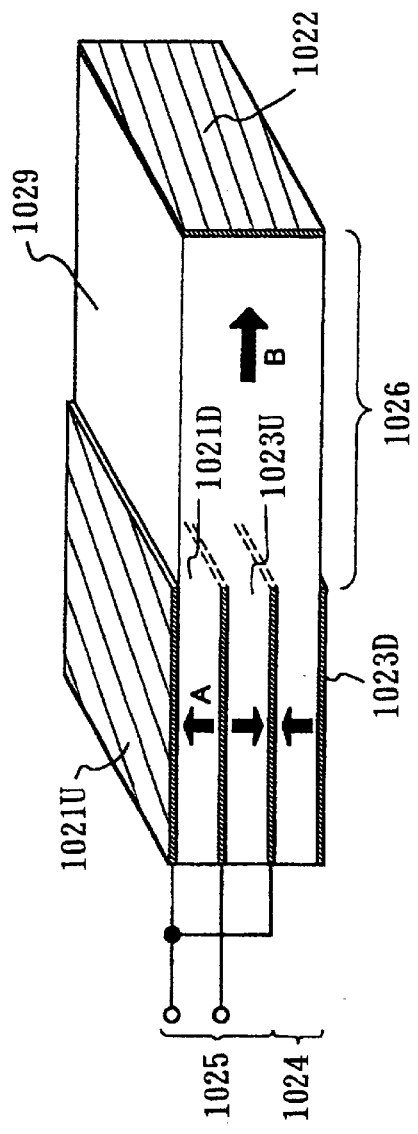
Fig. B2 (a)
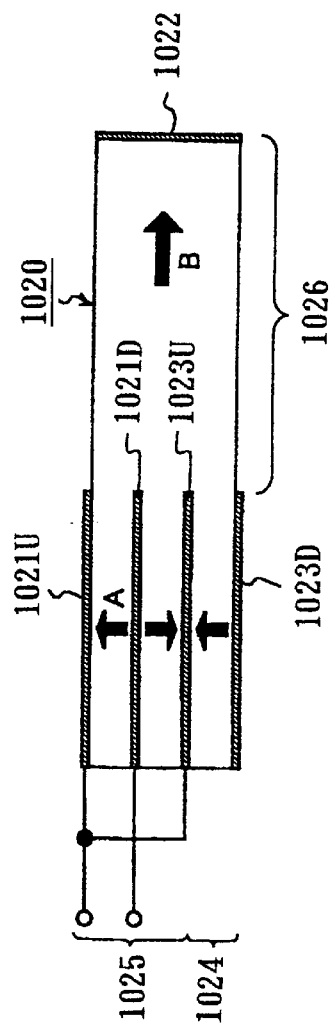
Fig. B2 (b)

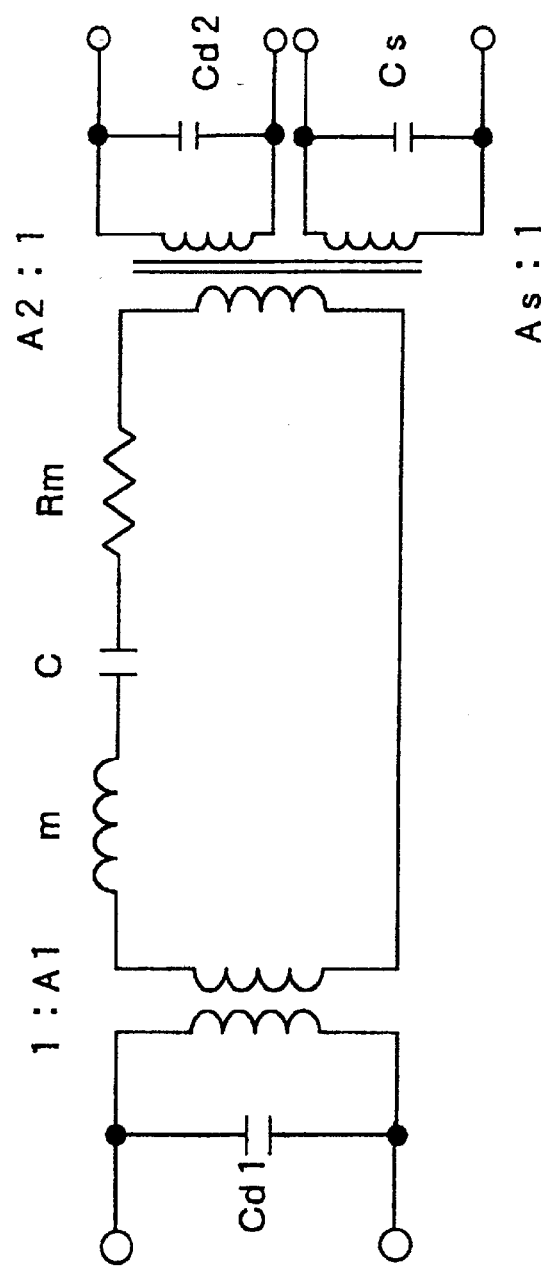
Fig. B3

Fig. B4 (a)
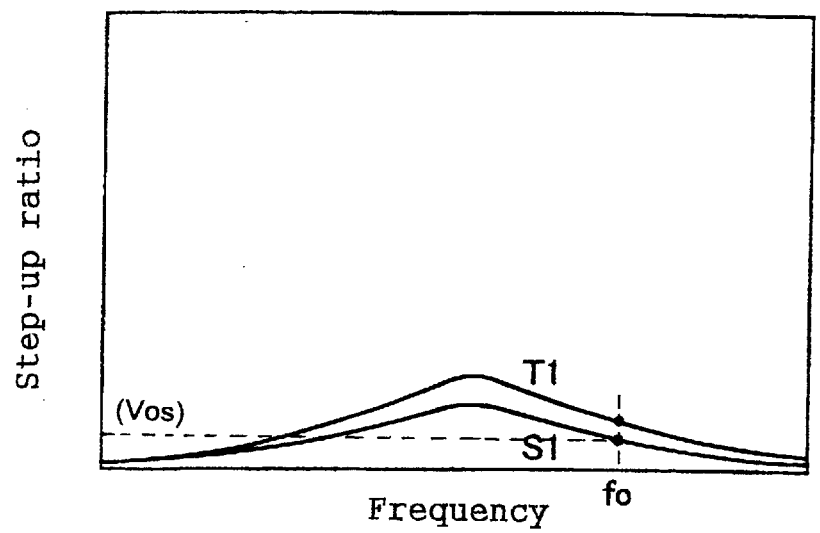
Fig. B4 (b)
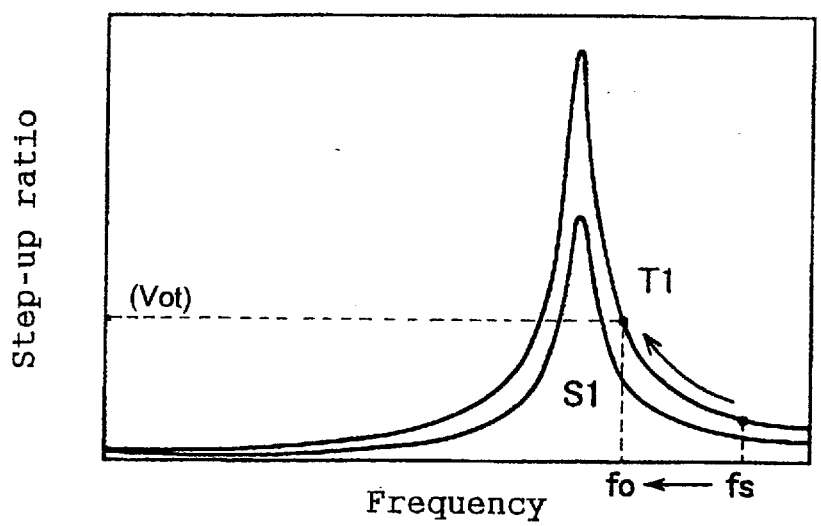

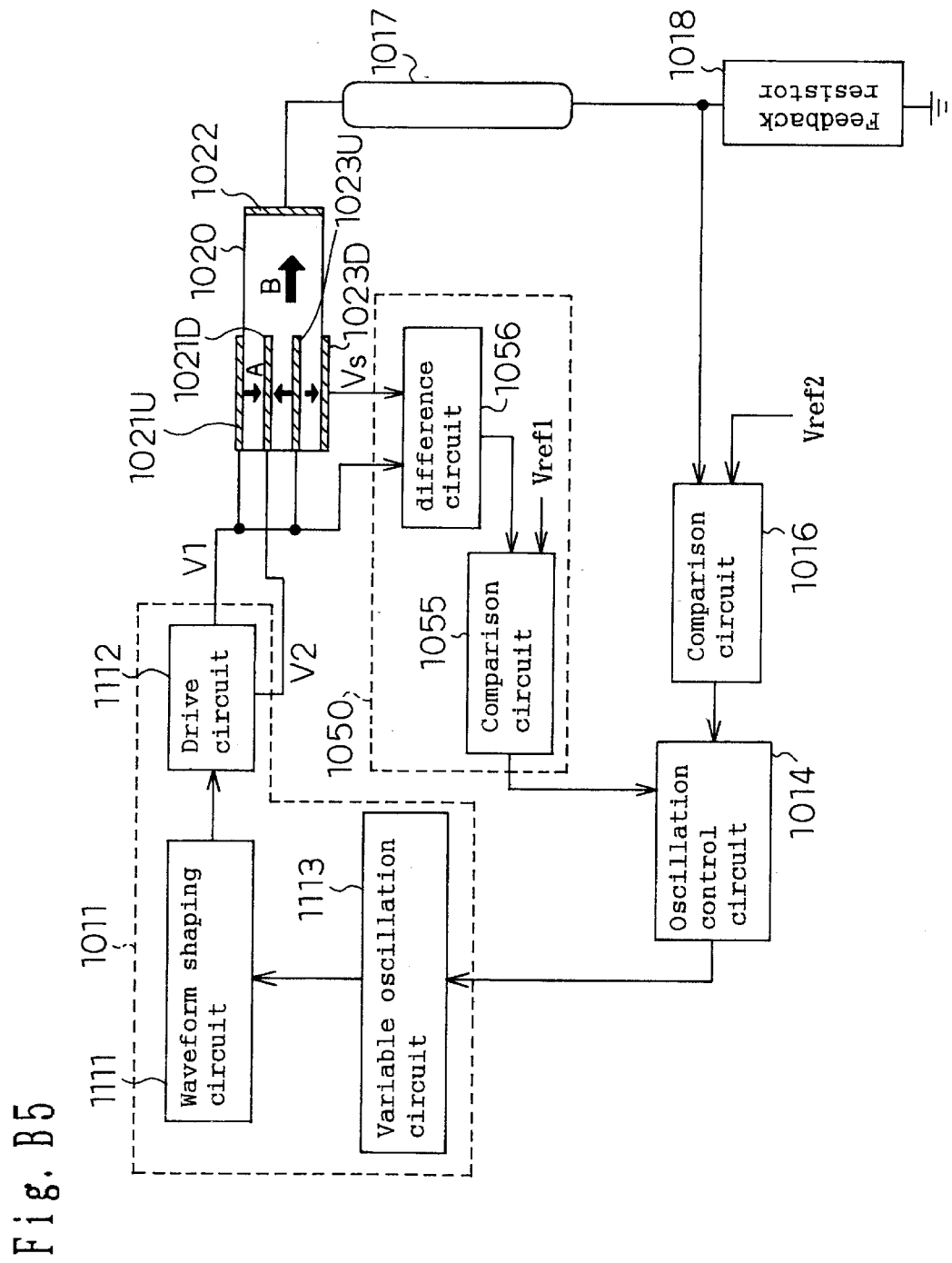
Fig. B5

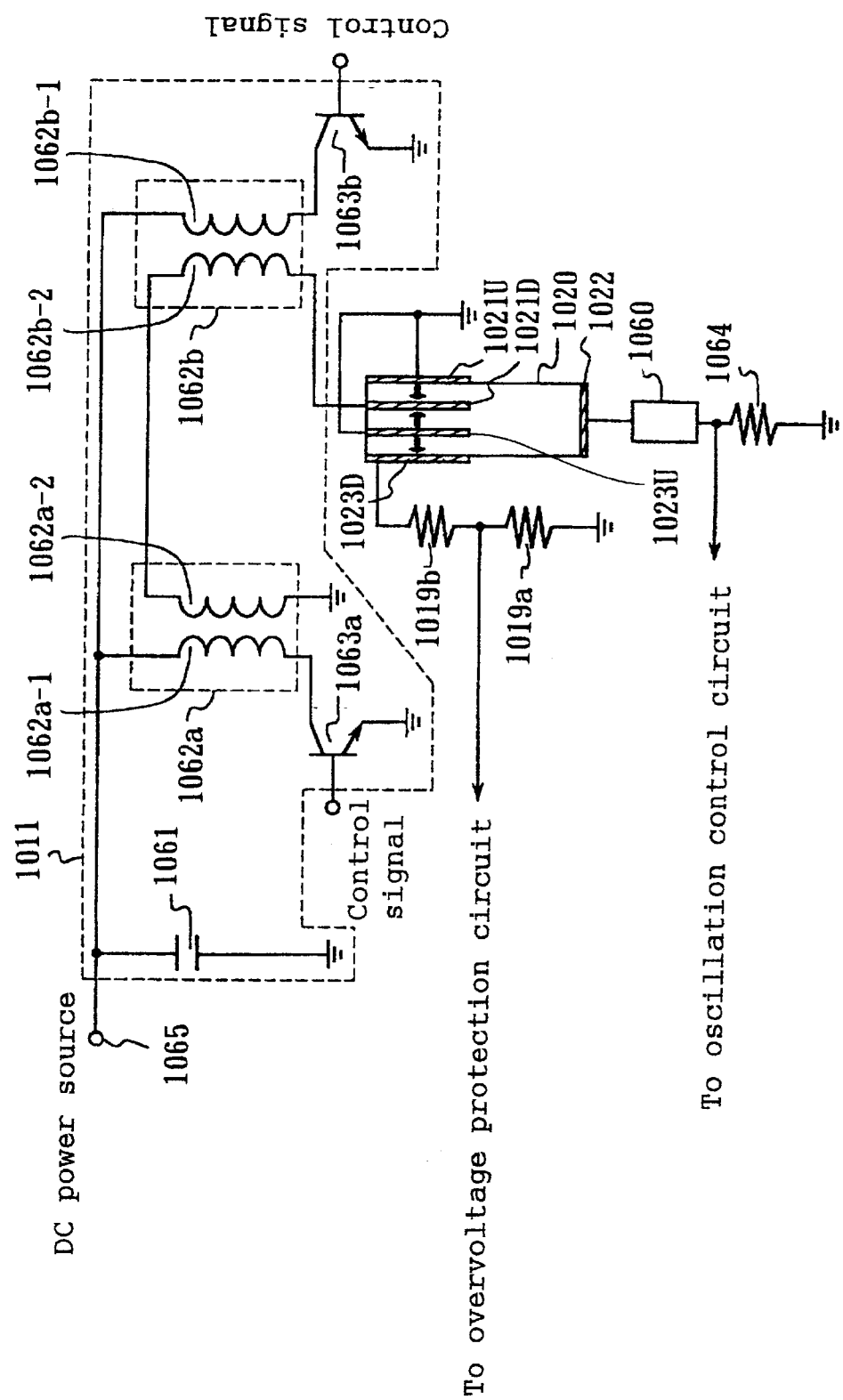
Fig. B6

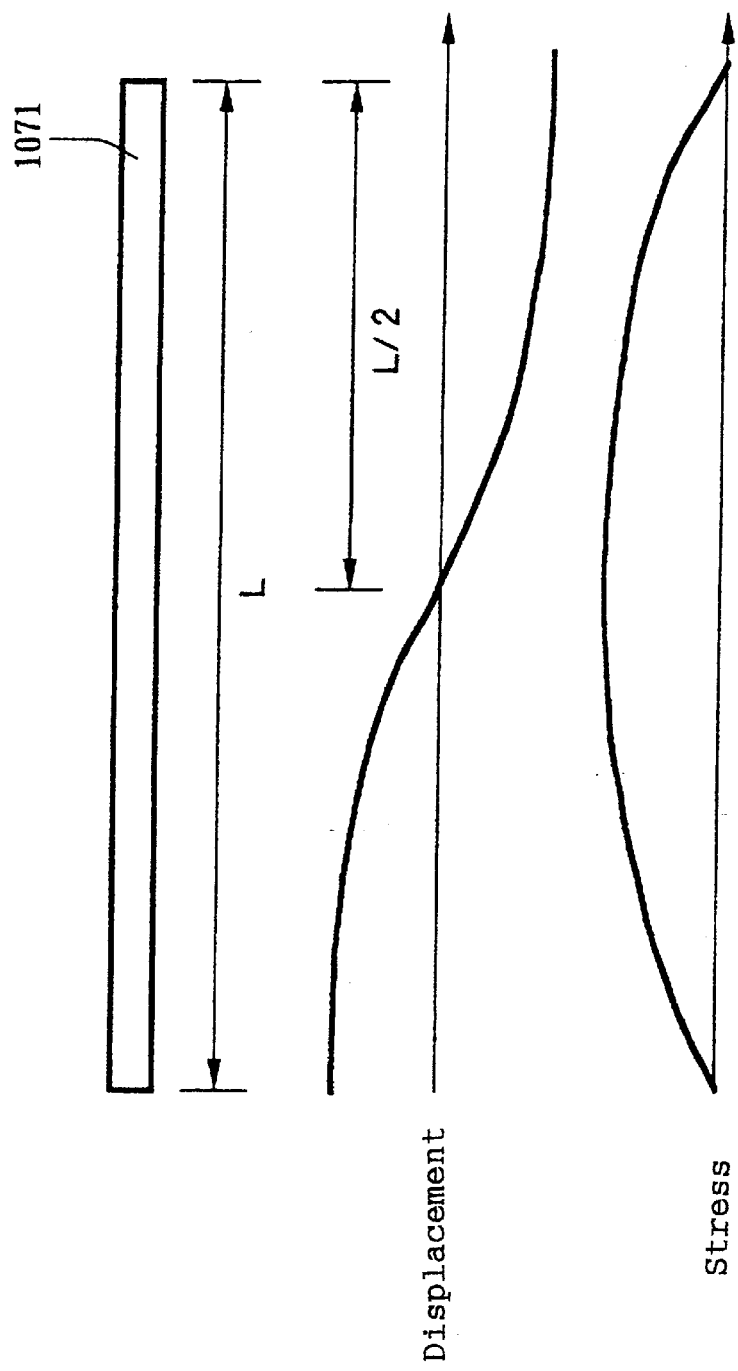
Fig. B7

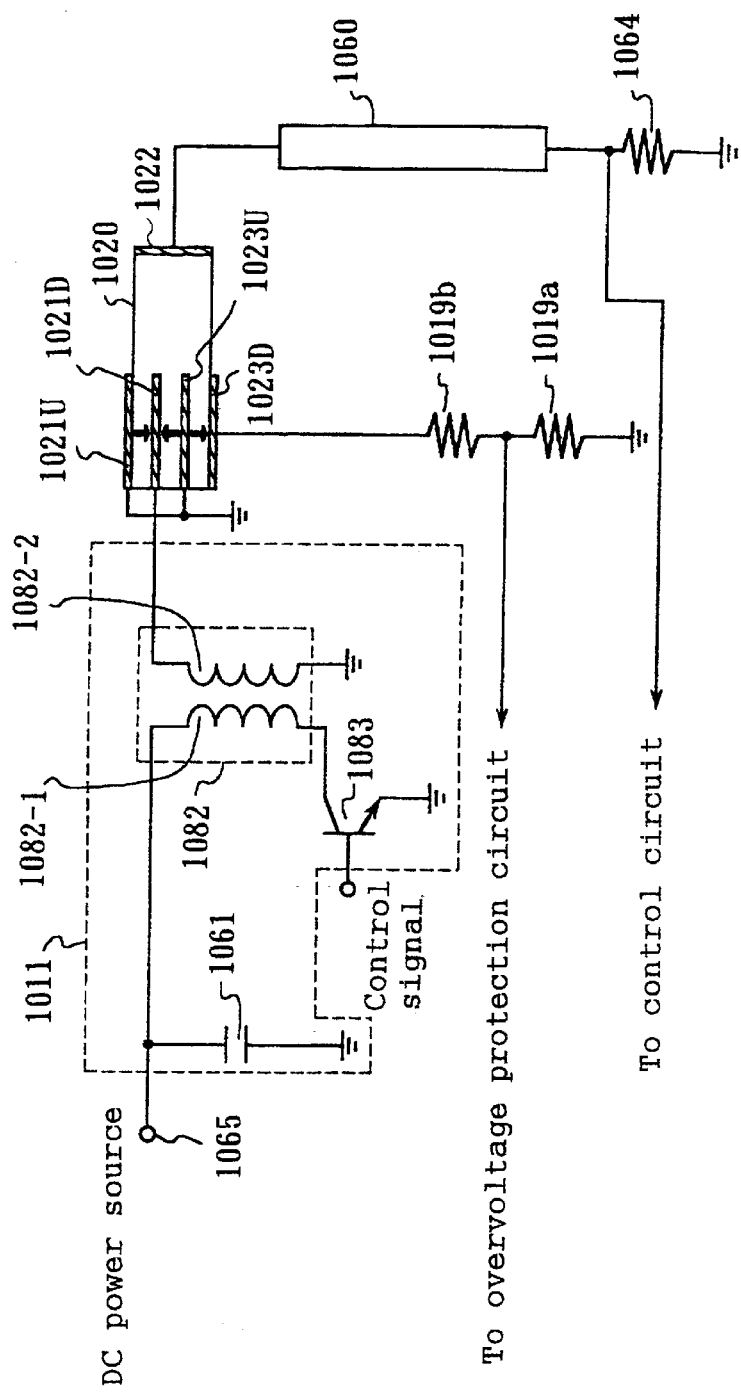
Fig. B8

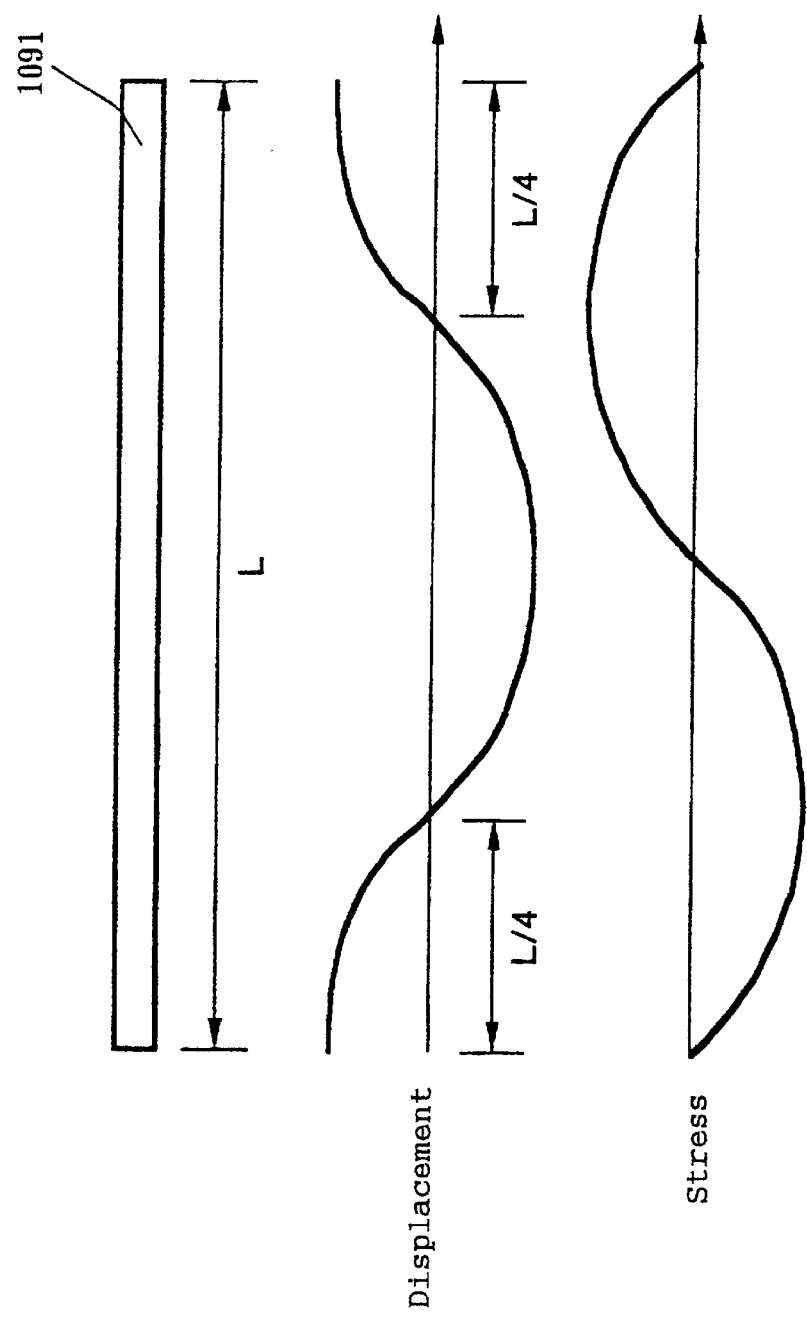
Fig. B9

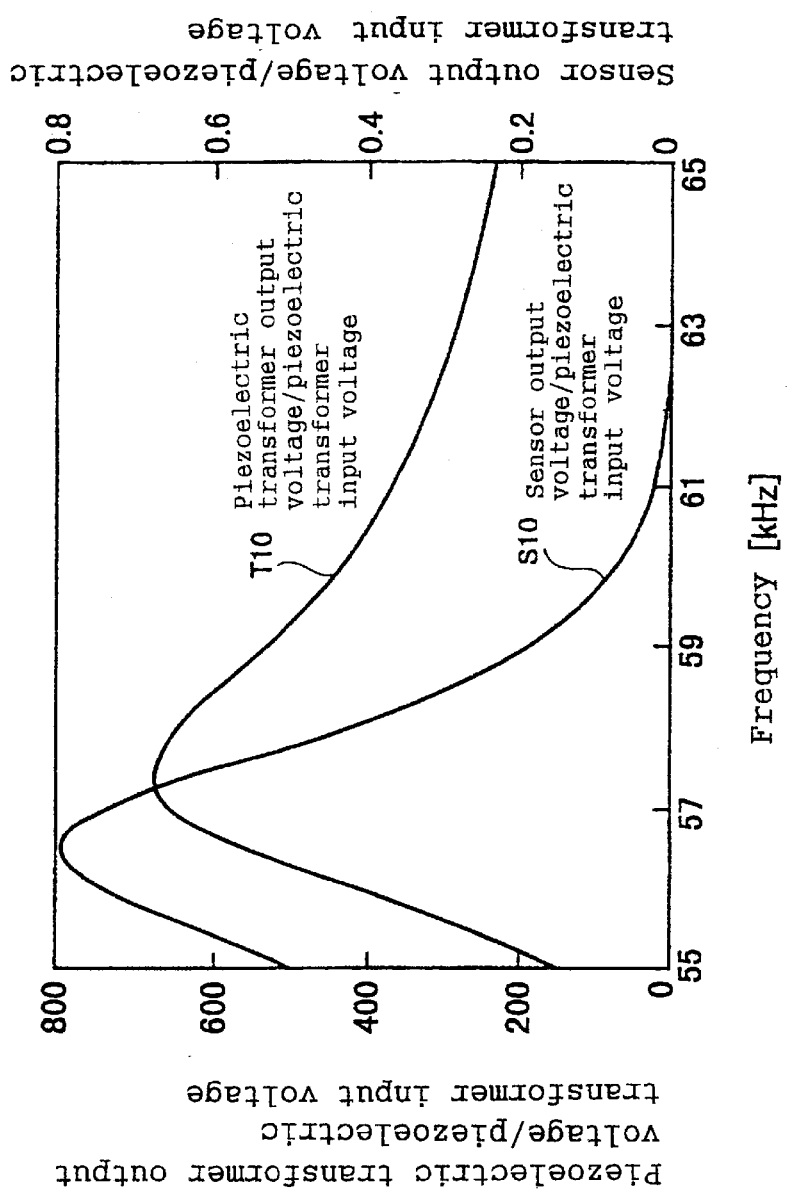
Fig. B10

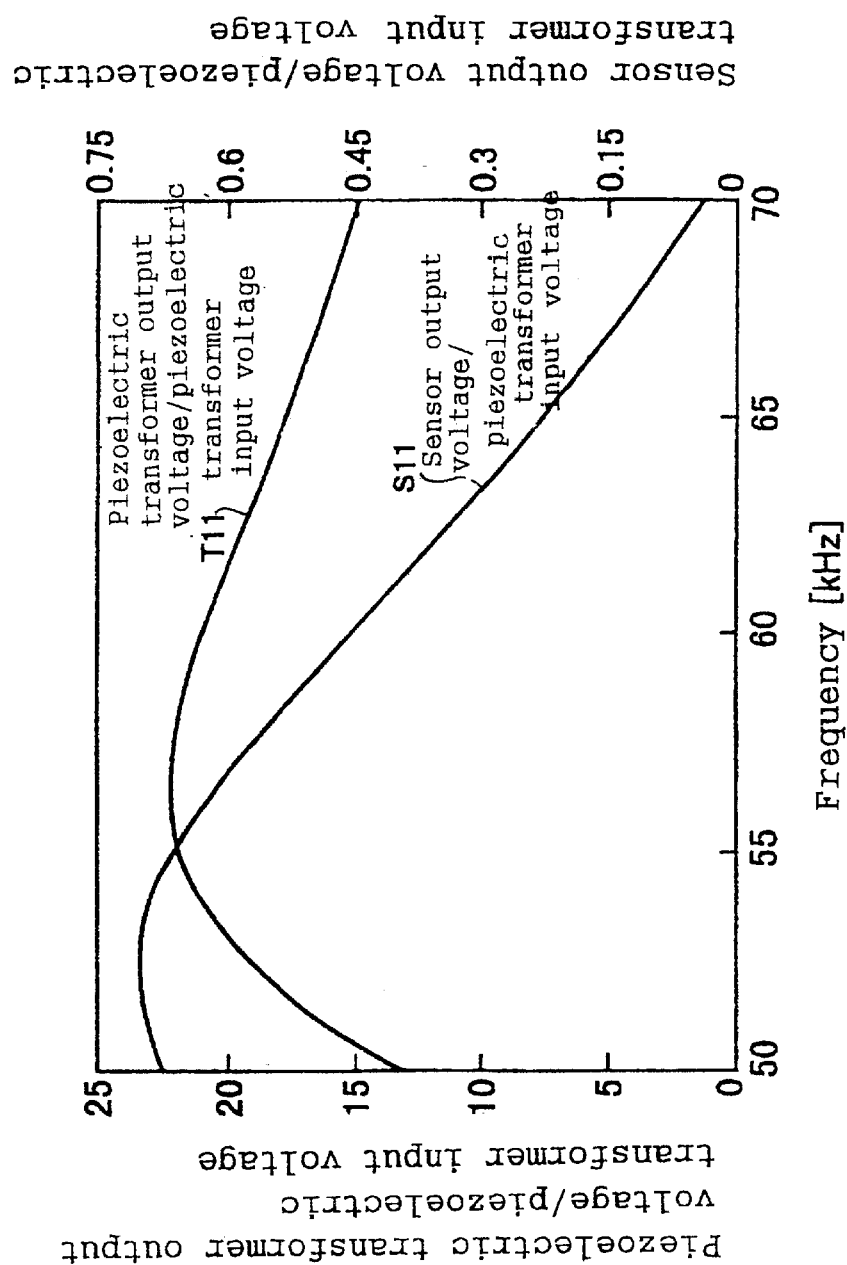
Fig. B11

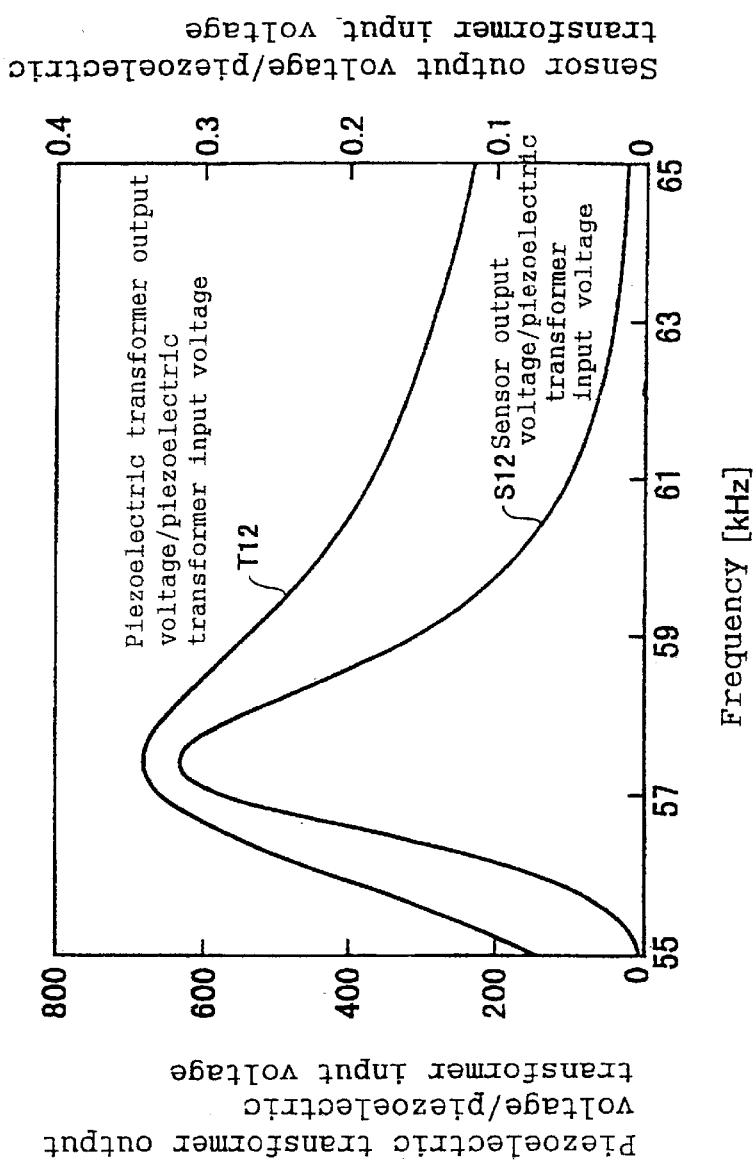
Fig. B12

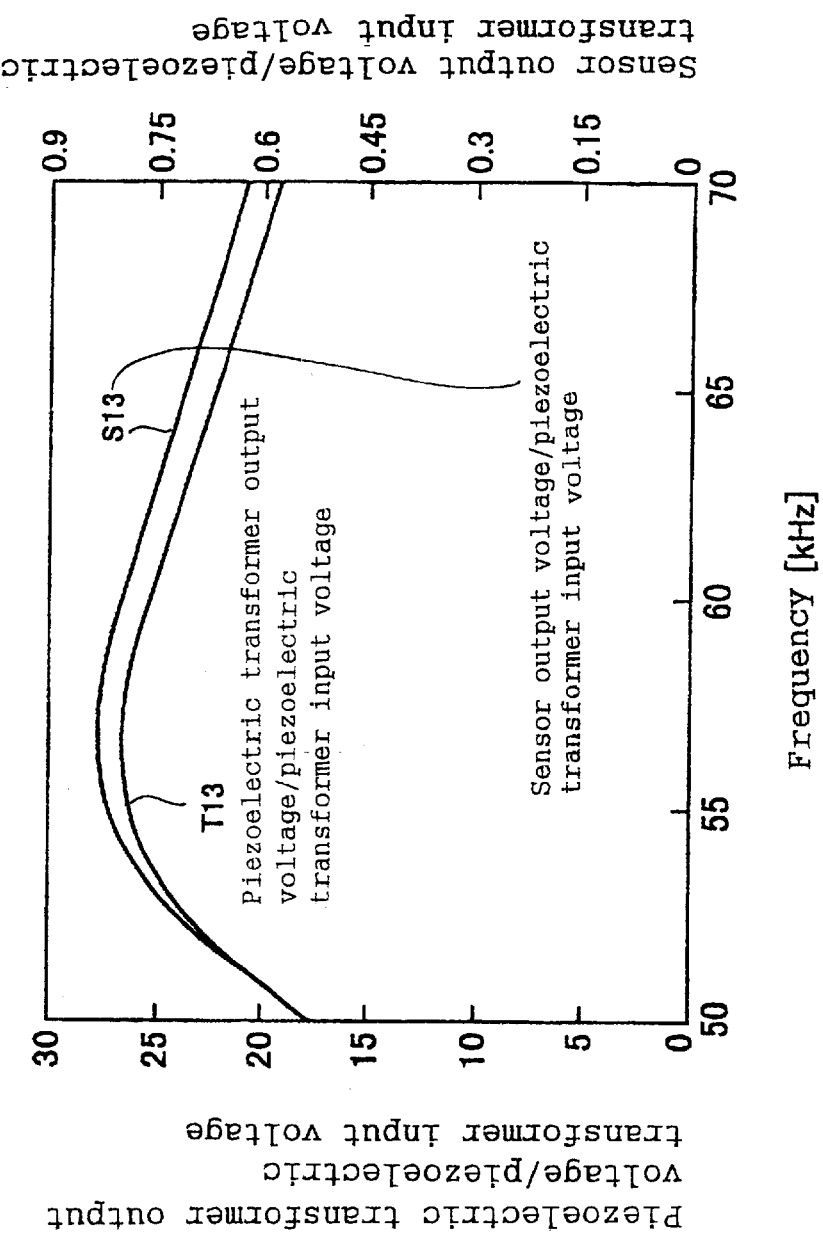
Fig. B13

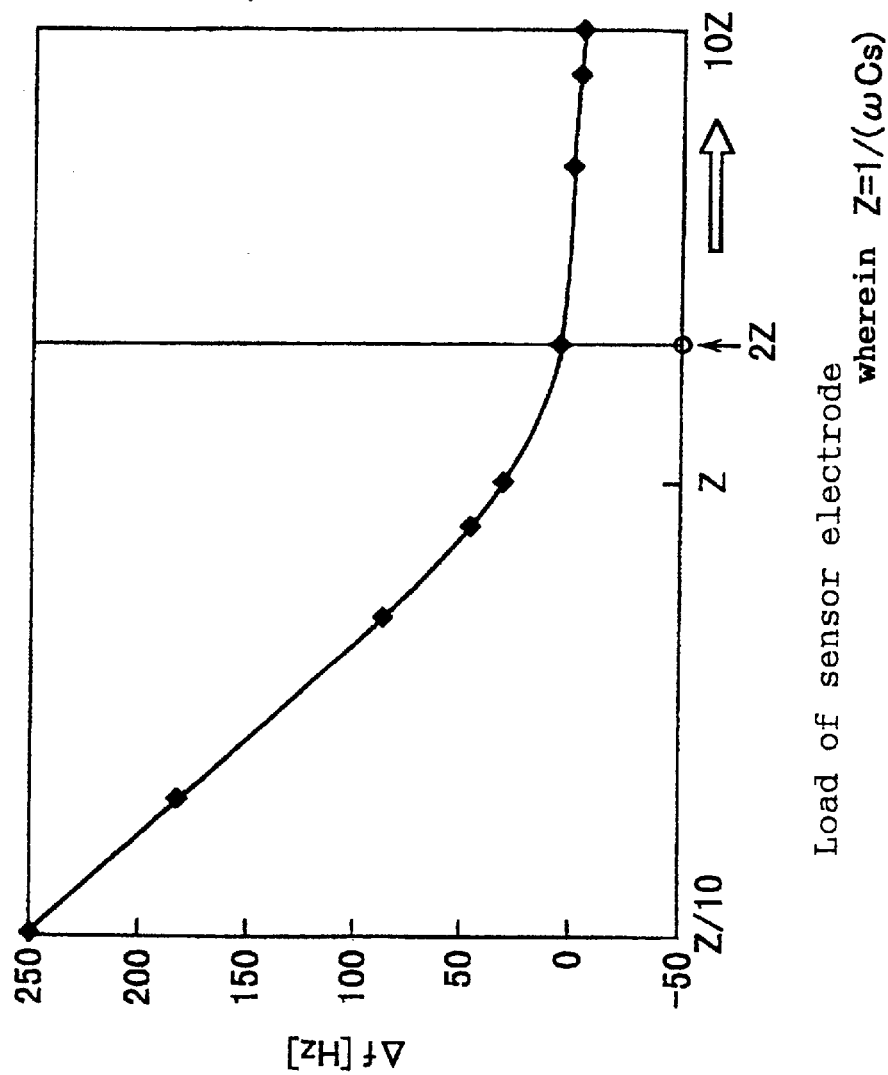
Fig. B14

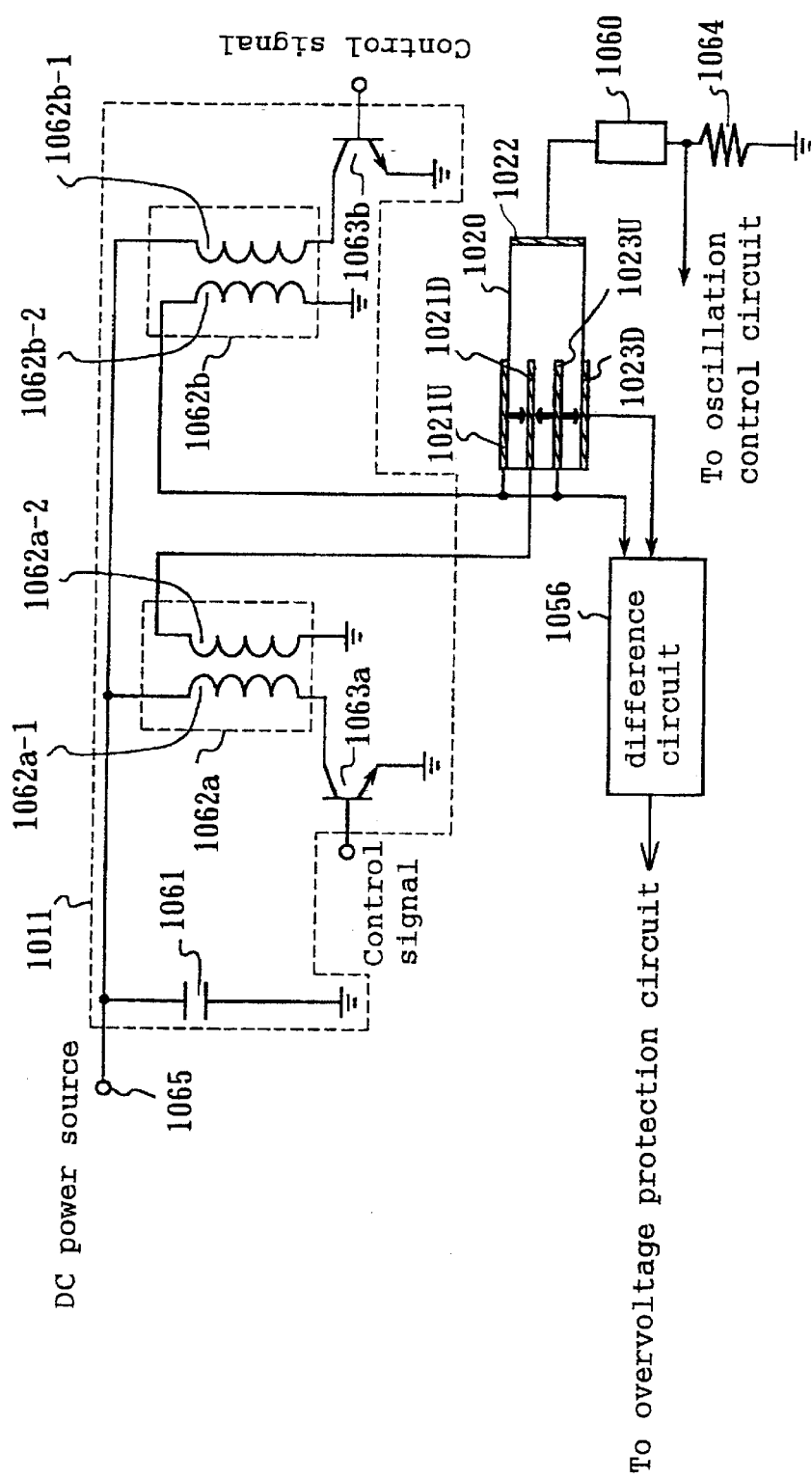
Fig. B15

Fig. B16
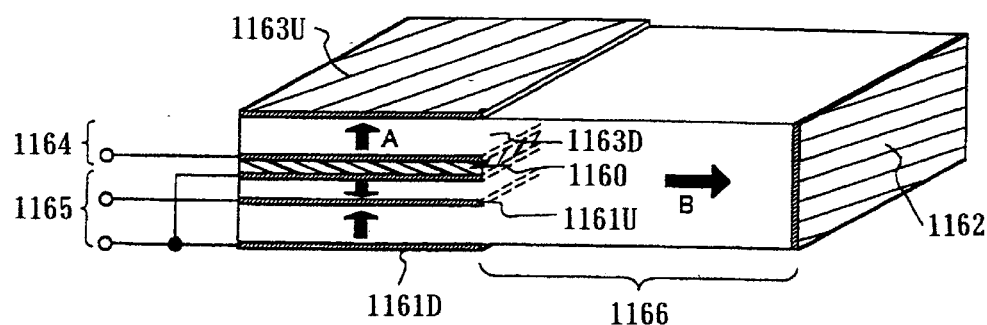

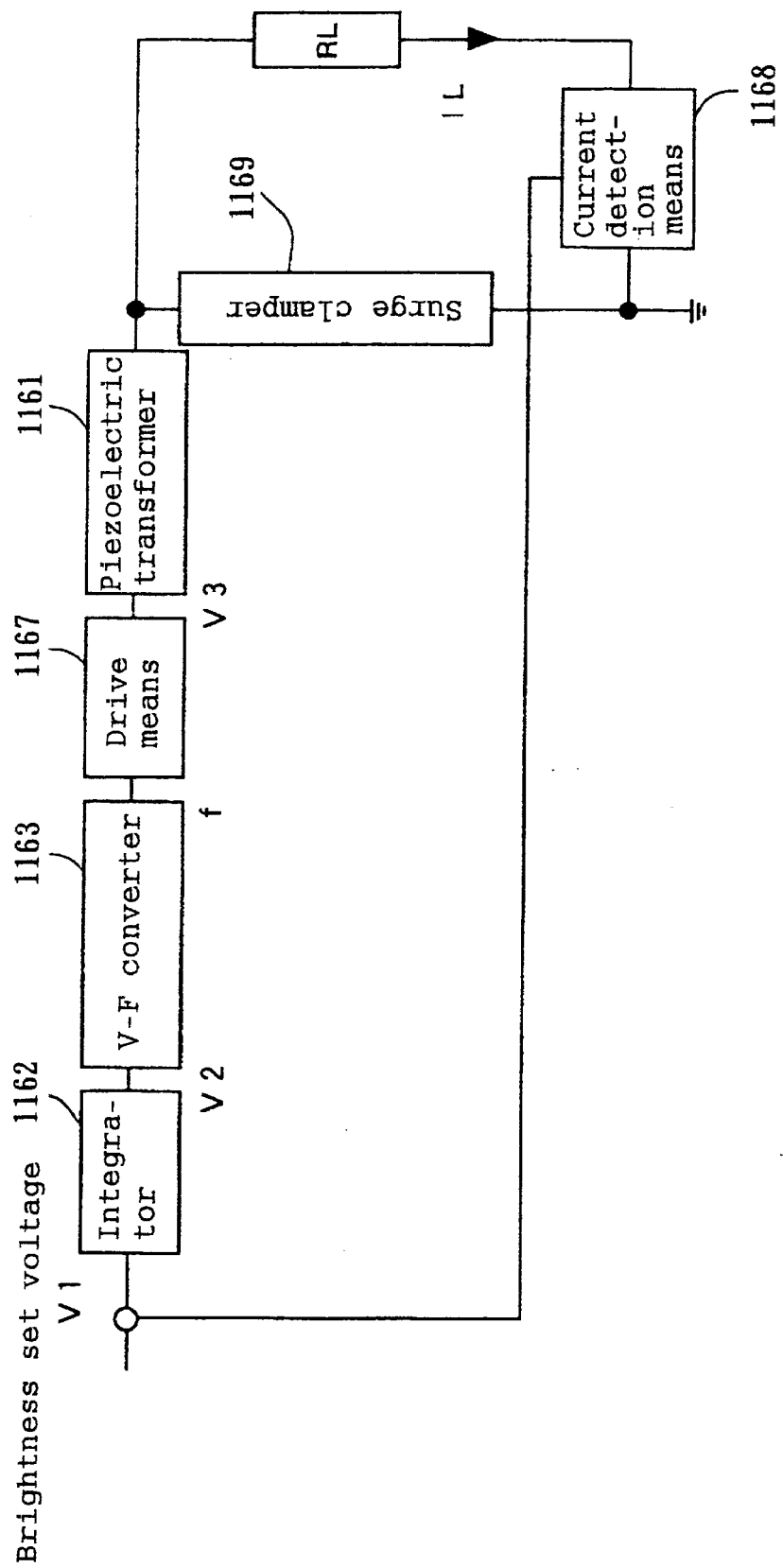
Fig. B17 PRIOR ART

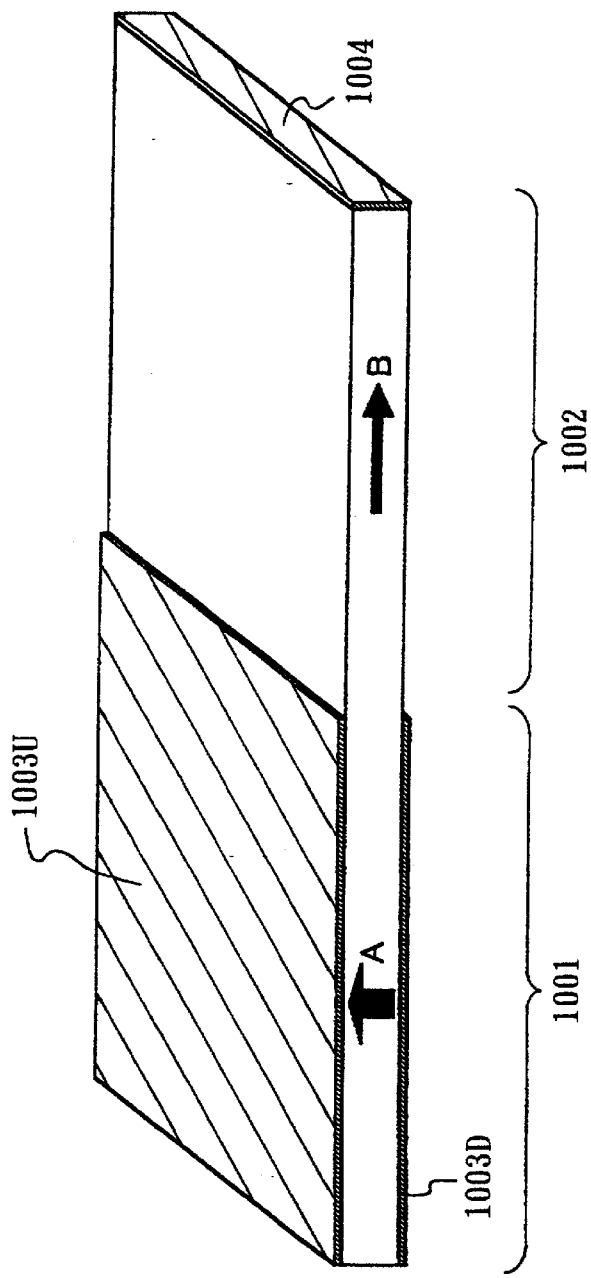
Fig. B18 PRIOR ART

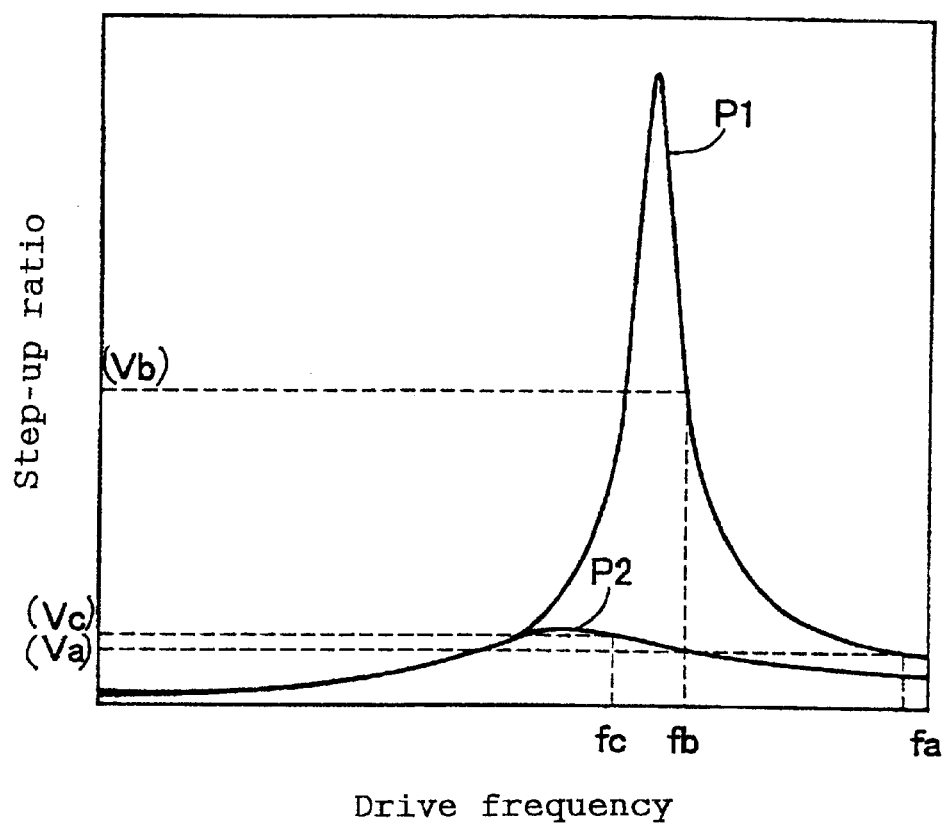
Fig. B19 PRIOR ART

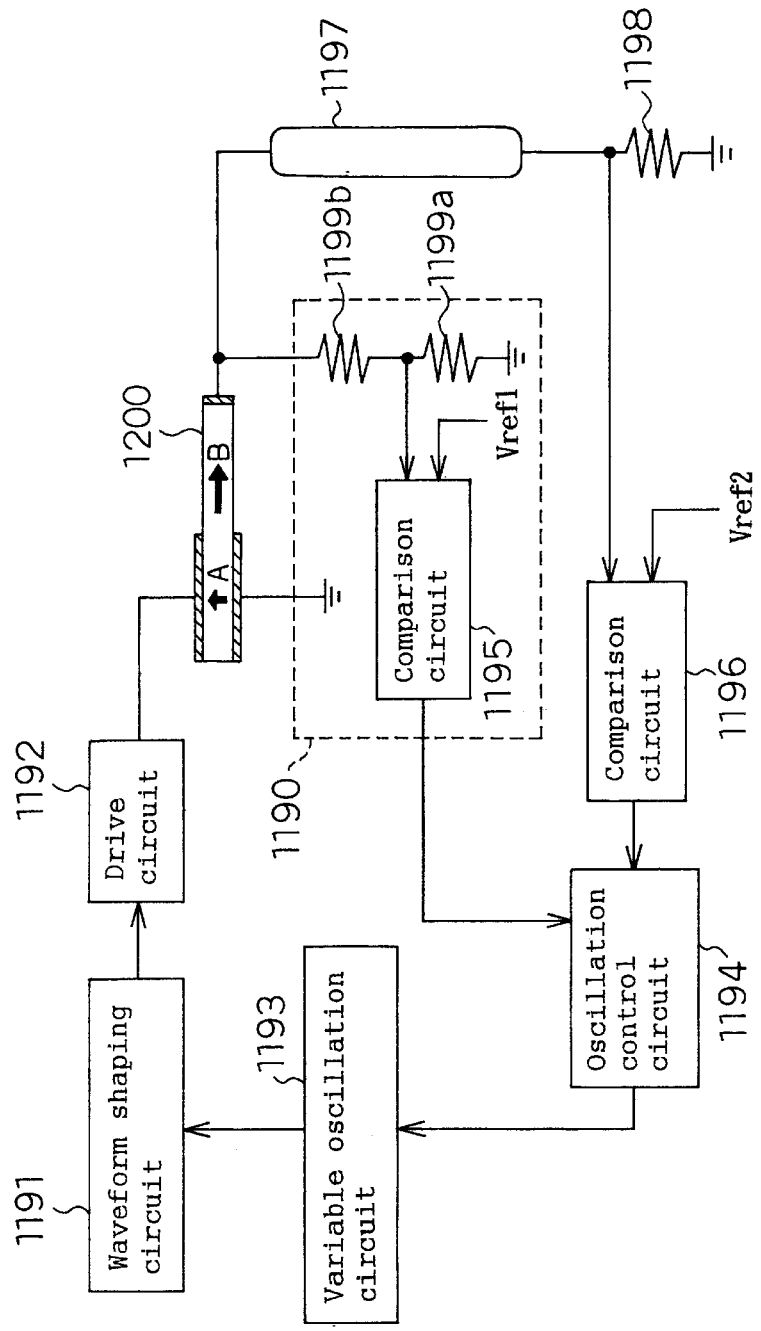
Fig. B20 PRIOR ART

US 6,583,534 B1

PIEZOELECTRIC TRANSFORMER, PIEZOELECTRIC TRANSFORMER DRIVE CIRCUIT, PIEZOELECTRIC TRANSFORMER DRIVE METHOD AND COLD CATHODE TUBE DRIVE APPARATUS USING PIEZOELECTRIC TRANSFORMER

BACKGROUND OF THE INVENTION

1. Field of the invention

The present invention relates to a piezoelectric transformer, a piezoelectric transformer drive circuit and a piezoelectric transformer drive method used for various high-voltage generation apparatuses.

Furthermore, the present invention relates to a cold cathode tube drive apparatus using a piezoelectric transformer used for various high-voltage generation apparatuses, more particularly to a cold cathode tube drive apparatus using a piezoelectric transformer having sensor electrodes provided independently of primary and secondary electrodes.

2. Related Art of the Invention

FIG. B18 shows the structure of a Rosen-type piezoelectric transformer, atypical structure of a conventional piezoelectric transformer. This piezoelectric transformer has the advantages that it can be made more compact than an electromagnetic transformer, is noncombustible and does not cause noise due to electromagnetic induction.

The portion designated by 1001 is the low impedance portion of the piezoelectric transformer and used as an input portion in the case when the transformer is used for voltage step-up. The low impedance portion 1001 is polarized in a thickness direction A. Primary electrodes 1003U and 1003D are disposed on the main faces of the low impedance portion in the direction the thickness thereof. On the other hand, the portion designated by 1002 is a high impedance portion and used as an output portion in the case when the transformer is used for voltage step-up. The high impedance portion 1002 is polarized in the longitudinal direction B. A secondary electrode 1004 is disposed at the end face in the longitudinal direction.

FIG. B19, detailed later, is a graph showing the characteristic of the above-mentioned piezoelectric transformer When the load of the piezoelectric transformer is infinite (indicated by a curve P1 in FIG. B19), it is possible to obtain a very high step-up ratio in the case when the drive frequency of the piezoelectric transformer is equal to the resonance frequency thereof. On the other hand, when the load becomes small (indicated by a curve P2 in FIG. B19), the step-up ratio lowers. Because of this characteristic, the piezoelectric transformer has been used as the power sources for cold cathode tubes in recent years. A cold cathode tube drive apparatus using a piezoelectric transformer can efficiently generate a high voltage. However, since it can easily generate a high voltage, if the piezoelectric transformer is controlled improperly, an overvoltage may generate from the piezoelectric transformer, resulting in the breakdown of the piezoelectric transformer and the like. To prevent this kind of breakdown and the like, it is proposed to provide an overvoltage protection circuit for the cold cathode tube drive apparatus.

FIG. B20 is a block diagram showing the configuration of a cold cathode tube drive apparatus using a conventional piezoelectric transformer. In FIG. B20, numeral 1193 designates a variable oscillation circuit generating an AC drive signal for driving a piezoelectric transformer 1200. The output of the variable oscillation circuit 1193 is usually a pulse waveform signal. The high-frequency components of the pulse waveform signal is eliminated by a waveform shaping circuit 1191, whereby the pulse waveform signal is converted into an AC signal close to a sine wave signal. The output of the waveform shaping circuit 1191 is voltage-amplified to a level enough to drive the piezoelectric transformer 1200 by a drive circuit 1192 and input to the primary electrode (indicated by 1003U in FIG. B18) of the piezoelectric transformer 1200. The output voltage stepped up by the piezoelectric effect of the piezoelectric transformer 1200 is taken out from its secondary electrode (indicated by 1004 in FIG. B18)

The high voltage output from the secondary electrode is applied to a series circuit comprising a cold cathode tube 1197 and a feedback resistor 1198 and to an overvoltage protection circuit portion 1190. In the over voltage protection portion 1190, a voltage divider circuit comprising voltage division resistors 1199$a$ and 1199$b$ divides the high voltage output from the secondary electrode of the piezoelectric transformer 1200. A comparison circuit 1195 compares the voltage divided by the voltage divider circuit with a set value Vref1 and generates an error voltage. The error voltage output from the comparison circuit 1195 is applied to an oscillation control circuit 1194. The oscillation control circuit 1194 controls the variable oscillation circuit 1193 so that the high voltage output from the secondary electrode of the piezoelectric transformer 1200 is equal to Vref1× (electric resistance value of the resistor 1199$a$+electric resistance value of the resistor 1199$b$)/electric resistance value of the resistor 1199$a$. The oscillation control circuit 1194 does not accept the output from the overvoltage protection circuit 1190 while the cold cathode tube 1197 is lit.

Furthermore, the voltage (current detection value) generated across the feedback resistor 1198 by the current flowing through the series circuit comprising the cold cathode tube 1197 and the feedback resistor 1198 is applied to a comparison circuit 1196. The comparison circuit 1196 compares the current detection value with a set value Vref2 and outputs an error voltage. The error voltage output from the comparison circuit 1196 is applied to the oscillation control circuit 1194. The variable oscillation circuit 1193 is controlled by the oscillation control circuit 1194 so that a nearly constant current flows through the cold cathode tube 1197.

As described above, the oscillation control circuit 1194 operates on the basis of the output from the comparison circuit 1195 before the lighting start of the-cold cathode tube 1197, and the oscillation control circuit 1194 operates on the basis of the output from the comparison circuit 1196 while the cold cathode tube 1197 is lit.

In this way, the cold cathode tube 1197 is lit stably. Even if the resonance frequency is changed depending on the change in the load of the piezoelectric transformer, ambient temperature and the like, the drive frequency can follow the resonance frequency automatically by driving the cold cathode tube 1197 using the above-mentioned drive apparatus.

Next, the operation of this drive apparatus will be described referring to FIG. B19. FIG. B19 is a graph showing the operation characteristic of the piezoelectric transformer. As clearly shown in FIG. B19, the step-up ratio has the maximum value at the resonance frequency according to the operation characteristic of the piezoelectric transformer. Usually, drive control is carry out by using a frequency higher than the resonance frequency of the piezoelectric transformer.

When driving the piezoelectric transformer, its drive frequency is set at a frequency (fa) higher than the resonance frequency at the time of start. When the voltage divided by the voltage division resistors 1199a and 1199b is smaller than the set voltage Vref1, the drive frequency is lowered close to the resonance frequency by the oscillation control circuit 1194 and the variable oscillation circuit 1193. When the drive frequency is close to the resonance frequency, the step-up ratio of the piezoelectric transformer increases, and its output voltage rises When the output voltage reaches the lighting start voltage (Vb) of the cold cathode tube 1197, the cold cathode tube 1197 is lit. As a result, the load of the piezoelectric transformer lowers from an infinite value to about several hundred kΩ. Therefore, the operation characteristic of the piezoelectric transformer shifts from the curve P1 to curve P2.

Accordingly, the operation of the oscillation control circuit 1194 is shifted from the operation depending on the output of the comparison circuit 1195 to the operation depending on the output of the comparison circuit 1196. Furthermore, the output of the piezoelectric transformer shifts from Vb to Va although the frequency fb remains the same. If the current detection value generated by the feedback resistor 1198 is smaller than the set value Vref2 at this time, the drive frequency is lowered until the current detection value reaches the set value, whereby the step-up ratio of the piezoelectric transformer is raised thereby to increase the current flowing through the cold cathode tube 1197. On the other hand, if the current detection value generated by the feedback resistor 1198 is larger than the set value Vref2, the drive frequency is raised, whereby-the step-up ratio of the piezoelectric transformer is lowered thereby to decrease the current flowing through the cold cathode tube 1197. In this way, the piezoelectric transformer is controlled so that the current detection value generated by the feedback resistor 1198 is equal to the set value Vref2.

If the cold cathode tube 1197 is not lit even when the output voltage reaches the lighting start voltage (Vb), in other words, if the current detection value generated by the feedback resistor 1198 remains zero even when the voltage value obtained by dividing the output voltage of the piezoelectric transformer 1200 by the voltage division resistors 1199a and 1199b reaches the set value Vref1, the overvoltage protection circuit 1190 stops frequency sweep at the variable oscillation circuit 1193 via the oscillation control circuit 1194. This prevents the piezoelectric transformer 1200 from breaking, and also prevents an overvoltage from generating from the piezoelectric transformer 1200.

The current flowing through the cold cathode tube is controlled and the piezoelectric transformer is protected against overvoltages by configuring the cold cathode tube drive apparatus using the piezoelectric transformer as described above.

In the above-mentioned conventional piezoelectric transformer, the step-up ratio differs greatly depending on whether the cold cathode tube 1197 is at the time of start (non-lighting) or at the time of stable operation (lighting). Since the step-up ratio at the time of start of the cold cathode tube 1197 is far larger than that at the time of stable operation, the transformer can easily output a high voltage. In order to use the high voltage, the overvoltage protection circuit 1190 is configured inparallel with the series circuit comprising the cold cathode tube 1197 and the feedback resistance 1198, wherein overvoltage protection is carried out by feeding back a voltage proportional to the output voltage from the voltage division resistors 1199a and 1199b connected to the secondary electrode of the piezoelectric transformer 1200.

However, in this kind of conventional overvoltage protection circuit, a high voltage is divided and the voltage obtained by the division is fedback. Therefore, if the resistance values of the voltage division resistors 1199a and 1199b constituting the voltage divider circuit are lowered, the load of the piezoelectric transformer 1200 decreases, whereby the step-up ratio required to light the cold cathode tube 1197 cannot be obtained. Furthermore, a current is consumed unnecessarily by the voltage division resistors 1199a and 1199b. Because of these problems, the resistance values of the voltage division resistors 1199a and 1199b are required to be sufficiently large. As a result, the detection voltage cannot be obtained accurately because of variations in resistance values, parasitic capacitances to a PC board and the like, whereby the overvoltage protection circuit may malfunction.

Furthermore, if the voltage required to light the cold cathode tube 1197 increases, the voltages for feedback applied to the voltage division resistors 1199a and 1199b also increase greatly. Accordingly, a sufficient creepage distance must be provided for a PC board to conform to safety standards, thereby causing a problem of making the circuit larger.

In addition, Japanese Laid-open Patent Application No. Hei 9-9640 discloses a drive apparatus wherein a current IL flowing through a load RL is detected by a current detection means 1168, the result of this detection is compared with a brightness set voltage V1, an error voltage obtained as the result of the comparison is filtered and phase-compensated by an integrator 1162, voltage/frequency conversion is performed by a V-F converter 1163, and a piezoelectric transformer 1161 is driven by a drive means 1167 to control the current flowing through the load RL as shown in FIG. B17. This drive apparatus is configured so that a surge clamper 1169 is connected to the output of the piezoelectric transformer 1161 in parallel with the load RL to prevent the overload protection circuit from malfunctioning. However, even in this case, the output-from the secondary high voltage portion is fed back. Therefore, it is necessary to route high-voltage lines on the PC board. As a result, this configuration causes problems of possible malfunctions owing to stray capacitances, insufficient creepage distances and the like.

Furthermore, Japanese Laid-open Patent Application No. Hei 11-68185 has proposed a configuration wherein a part of the primary multilayer portion of a piezoelectric transformer is used as a feedback electrode. However, this feedback electrode is used to simplify the drive circuit. Therefore, this is insufficient as a countermeasure for the overvoltage protection for the piezoelectric transformer.

In view of the problems encountered in the above-mentioned conventional piezoelectric transformers, an object of the present invention is to provide a piezoelectric transformer, a piezoelectric transformer drive circuit, a piezoelectric transformer drive method and a cold cathode tube drive apparatus using piezoelectric transformer capable of carrying out overvoltage protection at a voltage lower than a value used conventionally.

SUMMARY OF THE INVENTION

The $1^{st}$ invention of the present invention is a piezoelectric transformer comprising:

a piezoelectric substrate mainly formed of a piezoelectric material, primary electrodes which are formed on said piezoelectric substrate and to which a voltage is applied, a secondary electrode which is formed on said piezoelectric substrate and from which a voltage higher than the voltage applied to said primary electrode is output, and a third electrode which is formed on said piezoelectric substrate and from which a voltage lower than the voltage output from said secondary electrode is output.

The 14$^{th}$ invention of the present invention is a piezoelectric transformer drive circuit comprising:

a piezoelectric transformer for outputting a voltage input to a primary terminal from a secondary terminal by virtue of a piezoelectric effect, said piezoelectric transformer having a sensor electrode for detecting a voltage lower than the output voltage from said secondary terminal, a drive circuit for driving said piezoelectric transformer, a variable oscillation circuit for supplying a desired frequency and a desired voltage from said drive circuit to said piezoelectric transformer, a discharge tube, the input terminal of which receives the output voltage of said piezoelectric transformer and the output terminal of which is connected to a feedback resistor, an overvoltage protection circuit for detecting the output voltage from said sensor electrode, for comparing said output voltage with a first reference voltage and for outputting the result of the comparison, comparison means for comparing the voltage value of said feedback resistor with a second reference voltage so that the current flowing through said discharge tube becomes constant and for outputting the result of the comparison, a frequency control circuit for controlling the drive frequency of said piezoelectric transformer on the basis of the result of the comparison from said overvoltage protection circuit before the lighting start of said discharge tube or for controlling the drive frequency of said piezoelectric transformer on the basis of the result of the comparison from said comparison means while said discharge tube is lit.

The 15$^{th}$ invention of the present invention is a piezoelectric transformer drive method for outputting a voltage input to a primary terminal from a secondary terminal by virtue of a piezoelectric effect, wherein:

a voltage is detected from a third electrode which is provided on said piezoelectric transformer to output a voltage lower than the output voltage of said secondary terminal, and the result of said detection is used for overvoltage protection for the output voltage of said secondary terminal of said piezoelectric transformer.

As described above, the piezoelectric transformer of the present invention is, for example, a piezoelectric transformer, provided with a sensor electrode as an example of the third electrode in a part of the piezoelectric transformer, carries out protection against opening at a relatively low output voltage and also carries out feedback by using the output from the sensor electrode.

The 16$^{th}$ invention of the present invention is a cold cathode tube drive apparatus using a piezoelectric transformer comprising:

a piezoelectric transformer for stepping up the voltage input from a primary electrode by a piezoelectric effect, for outputting the stepped-up voltage from a secondary electrode and for outputting a detection voltage in proportion to the output voltage from a sensor electrode, a piezoelectric transformer drive portion for generating an AC voltage, the frequency of which is variable, for amplifying said AC voltage to a predetermined level and for supplying the amplified voltage to said piezoelectric transformer, a cold cathode tube driven by the output voltage from said secondary electrode of said piezoelectric transformer, a resistor for detecting the current flowing through said cold cathode tube as a voltage, an oscillation control circuit for controlling the frequency of said AC voltage output from said piezoelectric transformer drive portion on the basis of said voltage detected by said resistor so that the current flowing through said cold cathode tube becomes a predetermined value, an overvoltage protection circuit for controlling the frequency of said AC voltage output from said piezoelectric transformer drive portion on the basis of said detection voltage from said sensor electrode via said oscillation control circuit before the lighting start of said cold cathode tube and for stopping the frequency control of said AC voltage output from said piezoelectric transformer drive portion in the case when said detection voltage from said sensor electrode exceeds a predetermined value.

The 17$^{th}$ invention of the present invention is a cold cathode tube drive apparatus using a piezoelectric transformer in accordance with the 16$^{th}$ invention, wherein said piezoelectric transformer has said primary electrodes and said sensor electrodes disposed opposite to each other so as to form a polarized structure in the direction of the thickness of a piezoelectric element, has said secondary electrode disposed so as to form a polarized structure in the longitudinal direction of said piezoelectric element, and steps up the input voltage applied to said primary electrode to obtain an output voltage from said secondary electrode and to obtain a detection voltage in proportion to said output voltage from said sensor electrode.

The 18$^{th}$ invention of the present invention is a cold cathode tube drive apparatus using a piezoelectric transformer in accordance with the 16$^{th}$ invention, wherein said piezoelectric transformer is characterized in that in a first region in the longitudinal direction of a piezoelectric element, a first electrode is disposed on one of the surfaces in the direction of the thickness, a second electrode and a third electrode are disposed in sequence from said first electrode in said direction of the thickness inside said piezoelectric element, a fourth electrode is disposed on the other surface of said piezoelectric element opposite to said surface so that said electrodes are disposed opposite to each other at predetermined distances and close to one of the end faces of said piezoelectric element in the longitudinal direction thereof, and a fifth electrode is disposed on the other end face opposite to said end face, and also characterized in that in a second region in the longitudinal direction of said piezoelectric element, a polarization structure is formed in the longitudinal direction of said piezoelectric element, said first and second electrodes are used as said primarily electrodes, said third and fourth electrodes are used as said sensor electrodes, said fifth electrode is used as said secondary electrode, and the input voltage applied to said primary electrode is step up to obtain an output voltage from said secondary electrode and to obtain a detection voltage in proportion to said output voltage from said sensor electrode.

The 19$^{th}$ invention of the present invention is a cold cathode tube drive apparatus using a piezoelectric transformer in accordance with the 16$^{th}$ invention, wherein said piezoelectric transformer drive portion comprises:

an electromagnetic transformer having a primary winding to which said DC power source is supplied and a secondary winding connected to said primary electrode of said piezoelectric transformer, for stepping up said AC voltage and for supplying the stepped-up voltage to said piezoelectric transformer, and a switching circuit for controlling the frequency of said AC voltage supplied to said piezoelectric transformer by switching said DC voltage supplied to said primary winding of said electromagnetic transformer.

The $20^{th}$ invention of the present invention is a cold cathode tube drive apparatus using a piezoelectric transformer in accordance with the $17^{th}$ invention, wherein said piezoelectric transformer drive portion comprises:

an electromagnetic transformer having a primary winding to which said DC power source is supplied and a secondary winding connected to said primary electrode of said piezoelectric transformer, for stepping up said AC voltage and for supplying the stepped-up voltage to said piezoelectric transformer, and a switching circuit for controlling the frequency of said AC voltage supplied to said piezoelectric transformer by switching said DC voltage supplied to said primary winding of said electromagnetic transformer.

The $21^{th}$ invention of the present invention is a cold cathode tube drive apparatus using a piezoelectric transformer in accordance with the $18^{th}$ invention, wherein said piezoelectric transformer drive portion comprises:

an electromagnetic transformer having a primary winding to which said DC power source is supplied and a secondary winding connected to said primary electrode of said piezoelectric transformer, for stepping up said AC voltage and for supplying the stepped-up voltage to said piezoelectric transformer, and a switching circuit for controlling the frequency of said AC voltage supplied to said piezoelectric transformer by switching said DC voltage supplied to said primary winding of said electromagnetic transformer.

The $22^{nd}$ invention of the present invention is a cold cathode tube drive apparatus using a piezoelectric transformer in accordance with the $19^{th}$ invention, wherein said electromagnetic transformer is formed of first and second electromagnetic transformers, said switching circuit is provided with first and second switching transistors connected to the primary windings of said first and second electromagnetic transformers respectively, and said first and second electromagnetic transformers are used in series or parallel to drive said piezoelectric transformer.

The $23^{rd}$ invention of the present invention is a cold cathode tube drive apparatus using a piezoelectric transformer in accordance with the $20^{th}$ invention, wherein said electromagnetic transformer is formed of first and second electromagnetic transformers, said switching circuit is provided with first and second switching transistors connected to the primary windings of said first and second electromagnetic transformers respectively, and said first and second electromagnetic transformers are used in series or parallel to drive said piezoelectric transformer.

The $24^{th}$ invention of the present invention is a cold cathode tube drive apparatus using a piezoelectric transformer in accordance with the $21^{st}$ invention, wherein said electromagnetic transformer is formed of first and second electromagnetic transformers, said switching circuit is provided with first and second switching transistors connected to the primary windings of said first and second electromagnetic transformers respectively, and said first and second electromagnetic transformers are used in series or parallel to drive said piezoelectric transformer.

The $25^{th}$ invention of the present invention is a cold cathode tube drive apparatus using a piezoelectric transformer in accordance with the $22^{nd}$ invention, where in the AC voltage supplied from one of said first and second electromagnetic transformers to said piezoelectric transformer is used as a reference voltage, and said piezoelectric transformer is driven on the basis of the difference value between said detection voltage from said sensor electrode and said reference voltage.

The $26^{th}$ invention of the present invention is a cold cathode tube drive apparatus using a piezoelectric transformer in accordance with the $23^{rd}$ invention, where in the AC voltage supplied from one of said first and second electromagnetic transformers to said piezoelectric transformer is used as a reference voltage, and said piezoelectric transformer is driven on the basis of the difference value between said detection voltage from said sensor electrode and said reference voltage.

The $27^{th}$ invention of the present invention is a cold cathode tube drive apparatus using a piezoelectric transformer in accordance with the $24^{th}$ invention, where in the AC voltage supplied from one of said first and second electromagnetic transformers to said piezoelectric transformer is used as a reference voltage, and said piezoelectric transformer is driven on the basis of the difference value between said detection voltage from said sensor electrode and said reference voltage.

The $28^{th}$ invention of the present invention is a cold cathode tube drive apparatus using a piezoelectric transformer in accordance with any one of the $17^{th}$, $20^{th}$ and $23^{rd}$ inventions, wherein said piezoelectric transformer is driven in the primary mode of vertical vibration in the longitudinal direction by an AC voltage signal, the half-wave length of which is equal to the length of said piezoelectric transformer in the longitudinal direction thereof.

The $29^{th}$ invention of the present invention is a cold cathode tube drive apparatus using a piezoelectric transformer in accordance with any one of the $18^{th}$, $21^{st}$ and $24^{th}$ inventions, wherein said piezoelectric transformer is driven in the primary mode of vertical vibration in the longitudinal direction by an AC voltage signal, the half-wave length of which is equal to the length of said piezoelectric transformer in the longitudinal direction thereof.

The $30^{th}$ invention of the present invention is a cold cathode tube drive apparatus using a piezoelectric transformer in accordance with any one of the $17^{th}$ to $20^{th}$ inventions, wherein said piezoelectric transformer is driven in the secondary mode of vertical vibration in the longitudinal direction by an AC voltage signal, the one wavelength of which is equal to the length of said piezoelectric transformer in the longitudinal direction thereof.

The $31^{st}$ invention of the present invention is a cold cathode tube drive apparatus using a piezoelectric transformer in accordance with any one of the $16^{th}$ to $18^{th}$ inventions, wherein said oscillation control circuit is provided with a switching device for selectively controlling the frequency of said AC voltage output from said variable oscillation circuit on the basis of said detection voltage from said sensor electrode before the lighting start of said cold cathode tube or on the basis of the detection voltage by said resistor after the lighting start of said cold cathode tube.

The $32^{nd}$ invention of the present invention is a cold cathode tube drive apparatus using a piezoelectric transformer in accordance with anyone of the $16^{th}$ to $20^{th}$, $22^{nd}$ and $23^{rd}$ inventions, wherein a voltage divider circuit comprising resistors is connected to said sensor electrode of said piezoelectric transformer, and the output of said voltage divider circuit is used as said detection voltage from said sensor electrode.

The 33$^{rd}$ invention of the present invention is a cold cathode tube drive apparatus using a piezoelectric transformer in accordance with the 28$^{th}$ invention, wherein a voltage divider circuit comprising resistors is connected to said sensor electrode of said piezoelectric transformer, and the output of said voltage divider circuit is used as said detection voltage from said sensor electrode.

The 34$^{th}$ invention of the present invention is a cold cathode tube drive apparatus using a piezoelectric transformer in accordance with the 29$^{th}$ invention, wherein a voltage divider circuit comprising resistors is connected to said sensor electrode of said piezoelectric transformer, and the output of said voltage divider circuit is used as said detection voltage from said sensor electrode.

The 35$^{th}$ invention of the present invention is a cold cathode tube drive apparatus using a piezoelectric transformer in accordance with the 30$^{th}$ invention, wherein a voltage divider circuit comprising resistors is connected to said sensor electrode of said piezoelectric transformer, and the output of said voltage divider circuit is used as said detection voltage from said sensor electrode.

The 36$^{th}$ invention of the present invention is a cold cathode tube drive apparatus using a piezoelectric transformer in accordance with the 31$^{st}$ invention, wherein a voltage divider circuit comprising resistors is connected to said sensor electrode of said piezoelectric transformer, and the output of said voltage divider circuit is used as said detection voltage from said sensor electrode.

The 37$^{th}$ invention of the present invention is a cold cathode tube drive apparatus using a piezoelectric transformer in accordance with any one of the 16$^{th}$ to 18$^{th}$ inventions, wherein the load connected to said sensor electrode is determined so that the relationship between the output capacitance of said piezoelectric transformer and said load connected to said secondary electrode is equal to the relationship between the capacitance between said sensor electrodes disposed opposite to each other and said load connected to said sensor electrode.

The 38$^{th}$ invention of the present invention is a cold cathode tube drive apparatus using a piezoelectric transformer in accordance with the 37$^{th}$ invention, wherein said load connected to said sensor electrode has at least double the resistance value of the impedance calculated by 1/(2× π×fd×Cs), wherein the capacitance between the pair of said sensor electrodes is Cs and the resonance frequency of said piezoelectric transformer is fd.

With the above-mentioned configuration, it is possible to attain a compact, highly efficient, highly reliable drive apparatus by not routing high-voltage lines to the protection circuit and by preventing malfunctions due to unnecessary vibration of the piezoelectric transformer at the time of protecting the piezoelectric transformer against overvoltages.

BRIEF DESCRIPTION OF THE DRAWINGS

FIGS. 11A and 11B are views showing a structure of a piezoelectric transformer in accordance with a third embodiment of the present invention;

FIGS. 13A and 13B are views showing still another structure of the piezoelectric transformer in accordance with the third embodiment of the present invention;

FIGS. 14A and 14B are views showing a structure of a piezoelectric transformer in accordance with a fourth embodiment of the present invention;

FIG. 17 is a perspective view showing a modification example of the structure of the piezoelectric transformer in accordance with the first embodiment of the present invention; and FIG. 18 is a perspective view showing another modification example of the structure of the piezoelectric transformer in accordance with the first embodiment of the present invention.

Figure 1:
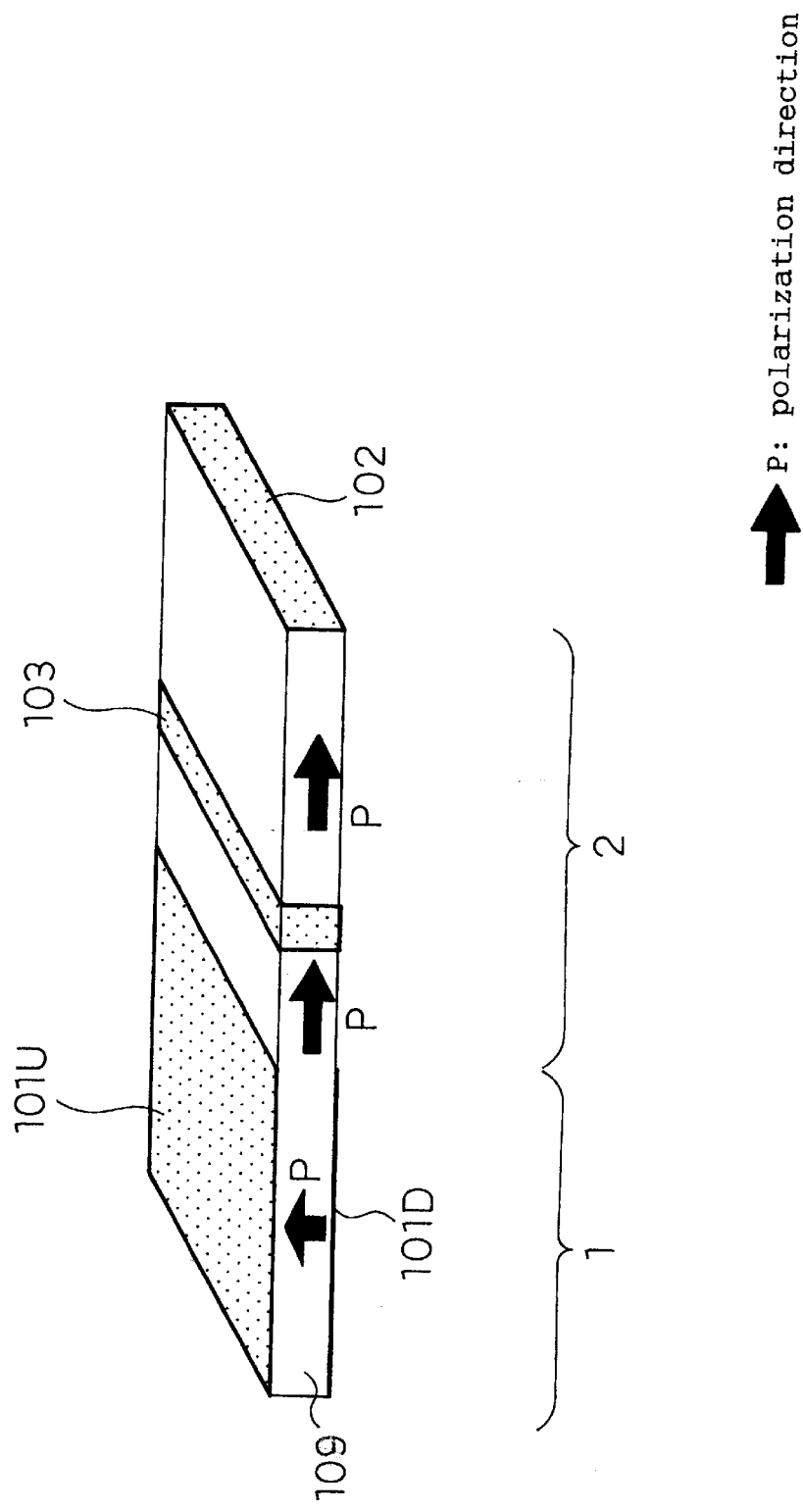
FIG. 1 is a perspective view showing the structure of a piezoelectric transformer in accordance with a first embodiment of the present invention.

FIG. B1 is a block diagram showing a cold cathode tube drive apparatus using a piezoelectric transformer in accordance with a B first embodiment of the present invention;

FIG. B2A is a perspective view showing the structure of the piezoelectric transformer in accordance with the present embodiment, and FIG. B2B is a front view of the piezoelectric transformer;

FIG. B3 is a diagram showing the lumped parameter appropriate equivalent circuit of the piezoelectric transformer shown in FIG. B2;

FIGS. B4($a$) and B4($b$) are graphs showing the operation characteristic of the piezoelectric transformer shown in FIG. B2;

FIG. B5 is a block diagram showing a cold cathode tube drive apparatus using a piezoelectric transformer in accordance with a B second embodiment of the present invention;

FIG. B6 is a block diagram showing the periphery of the piezoelectric transformer drive portion of a cold cathode tube drive apparatus using a piezoelectric transformer in accordance with a B third embodiment of the present invention;

FIG. B7 is a graph showing the displacement distribution and the stress distribution in the primary mode of vertical vibration in the longitudinal direction of a piezoelectric element;

FIG. B8 is a block diagram showing the periphery of the piezoelectric transformer drive portion of a cold cathode tube drive apparatus using a piezoelectric transformer in accordance with a B fourth embodiment of the present invention;

FIG. B9 is a graph showing the displacement distribution and the stress distribution in the secondary mode of vertical vibration in the longitudinal direction of a piezoelectric element;

FIG. B10 is a graph showing the step-up ratios at the secondary and sensor electrodes of the piezoelectric transformer before the lighting start of the cold cathode tube in the case when the load resistance of the sensor electrode is small;

FIG. B11 is a graph showing the step-up ratios at the secondary and sensor electrodes of the piezoelectric transformer after the lighting start of the cold cathode tube in the case when the load resistance of the sensor electrode is small;

FIG. B12 is a graph showing the step-up ratios at the secondary and sensor electrodes of the piezoelectric transformer before the lighting start of the cold cathode tube in the case when the load resistance of the sensor electrode is large in accordance with a B fifth embodiment of the present invention;

FIG. B13 is a graph showing the step-up ratios at the secondary and sensor electrodes of the piezoelectric transformer after the lighting start of the cold cathode tube in the case when the load resistance of the sensor electrode is large in accordance with the B fifth embodiment of the present invention;

FIG. B14 is a graph showing the relationship between the load of the sensor electrode and the difference between the frequency at the peak of the step-up ratio at the secondary electrode and that at the sensor electrode;

FIG. B15 is a block diagram showing the periphery of the piezoelectric transformer drive portion of a cold cathode tube drive apparatus using a piezoelectric transformer in accordance with a B sixth embodiment of the present invention;

FIG. B16 is a view showing another structure of the piezoelectric transformer of the present invention;

FIG. B17 is a block diagram showing an example of a conventional drive apparatus using a surge damper as a piezoelectric transformer protection circuit;

FIG. B18 is a perspective view showing the structure of a Rosen-type piezoelectric transformer as an example of a conventional piezoelectric transformer;

FIG. B19 is a graph showing the operation characteristic of the piezoelectric transformer shown in FIG. B18; and FIG. B20 is a block diagram showing an example of a cold cathode tube drive apparatus using a conventional piezoelectric transformer having no sensor electrode.

DESCRIPTION OF REFERENCE NUMERALS 1 low impedance portion
2 high impedance portion
3 sensor portion
50 overvoltage protection portion
101U, 101D primary electrodes
102 secondary electrode
103 sensor electrode
503U, 503D sensor electrodes
109 piezoelectric element
1010 overvoltage protection circuit
1011 piezoelectric transformer drive circuit
1014 oscillation control circuit
1017 cold cathode tube
1018 feedback resistor
1019a, 1019b voltage division resistors
1020 piezoelectric transformer
1021U, 1021D primary electrodes
1023U, 1023D sensor electrodes
1022 secondary electrode
1025 low impedance portion
1026 high impedance portion
1029 piezoelectric element
1056 difference circuit
1062a, 1062b electromagnetic transformer
1063a, 1063b switching transistors

PREFERRED EMBODIMENTS OF THE INVENTION

Embodiments of the present invention will be described below.

Embodiment 1

FIG. 1 is a perspective view showing the structure of a first embodiment of the piezoelectric transformer in accordance with the present invention.

The piezoelectric transformer used for the present embodiment is formed of a piezoelectric material exhibiting a piezoelectric property, such as PZT, and the voltage applied to its primary electrode is multiplied by a step-up ratio and taken out from its secondary electrode. Numeral 1 designates a low impedance portion, and numerals 101U and 101D designate primary electrodes. Numeral 2 designates a high impedance portion. One of the secondary electrodes, 102, is provided on the end face of the high impedance portion, and the other is shared with the primary electrode 101D. A sensor electrode 103 is formed between the secondary electrode 102 and the other secondary electrode (the primary electrode 101D). As shown in FIG. 1, this piezoelectric transformer is electrically connected form the primary electrodes 101U and 101D provided on the top and bottom main faces of the low impedance portion, from the secondary electrode 102 provided on the end face of the piezoelectric transformer and from the sensor electrode 103.

The sensor electrode 103 formed at the high impedance portion is provided in a belt form around the piezoelectric transformer. However, a similar effect can also be obtained even when the sensor electrode 103 is formed on the opposite main faces in the direction of the thickness (the same faces on which the primary electrodes 101U and 101D are formed) or even when the sensor electrode 103 is formed on the main opposite faces in the direction of the width. Furthermore, in FIG. 1, the other secondary electrode is shared with the primary electrode 101D. However, the structure of the piezoelectric transformer is not limited to this. For example, the other secondary electrode may be formed on one of the opposite main faces in the direction of the thickness or maybe formed independently at a position between the primary electrodes and the sensor electrode 103.

A third electrode in accordance with the present invention corresponds to the sensor electrode.

The operation of the piezoelectric transformer configured as described above will be described below.

Figure 2:
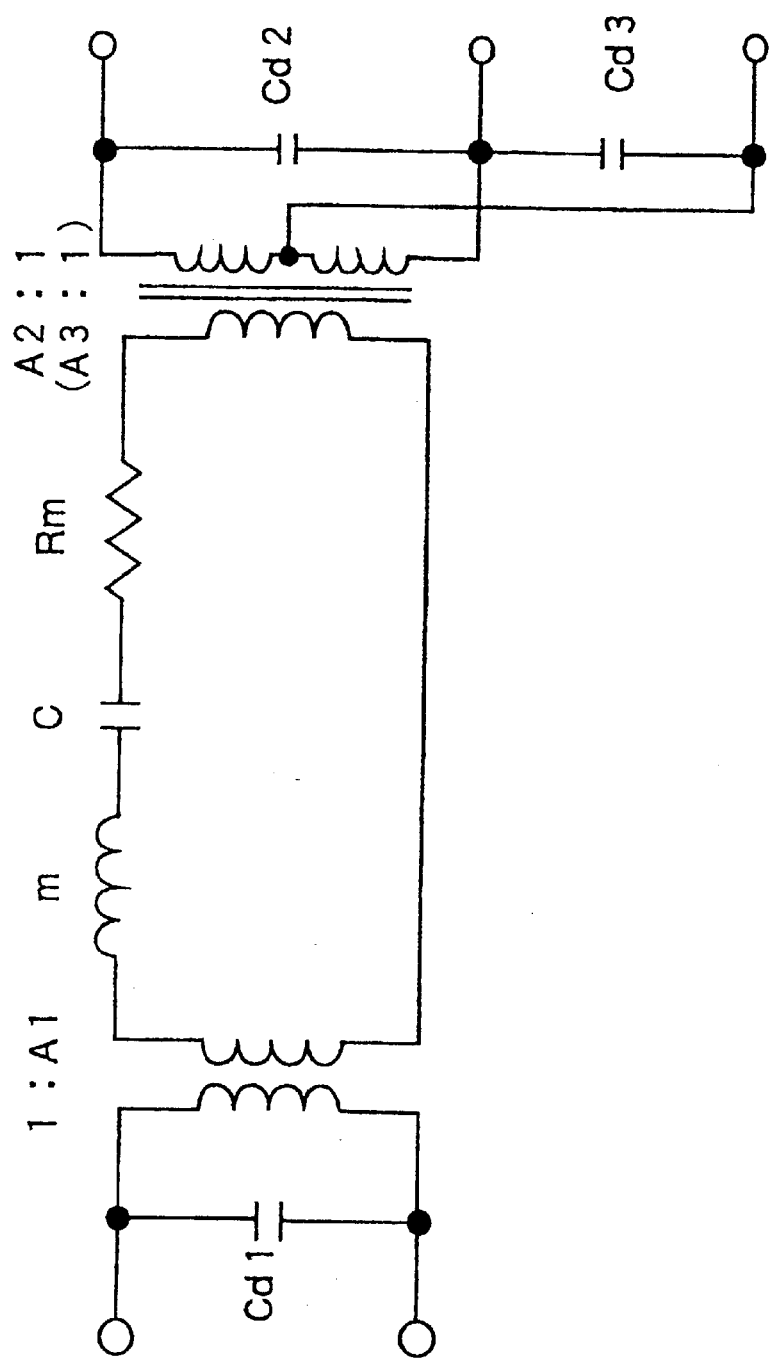
FIG. 2 is a diagram showing the lumped parameter equivalent circuit of the piezoelectric transformer shown in FIG. 1.

The lumped parameter approximate equivalent circuit at a frequency near the resonance frequency of the piezoelectric transformer is shown in FIG. 2. In FIG. 2, Cd1 and Cd2 are bound capacitances on the input and output sides respectively. Cd3 is the bound capacitance of the sensor portion. A1 (on the input side) and A2 (on the output side) are force factors, A3 is the force factor of the sensor portion, m is an equivalent mass, C is an equivalent compliance, and Rm is an equivalent mechanical resistance. In the piezoelectric transformer of the present embodiment, the force factor A1 is larger than A2 (A3). The voltage is stepped up by the two equivalent ideal transformers shown in FIG. 2. Furthermore, since the piezoelectric transformer includes a series resonance circuit comprising an equivalent mass and an equivalent compliance, the output voltage becomes larger than that obtained by the transformation ratios of the transformers particularly when the value of a load resistance is large. The output from the sensor electrode is represented by the output from the intermediate tap of the ideal transformer having the force factor A2 in the equivalent circuit.

Figure 3:
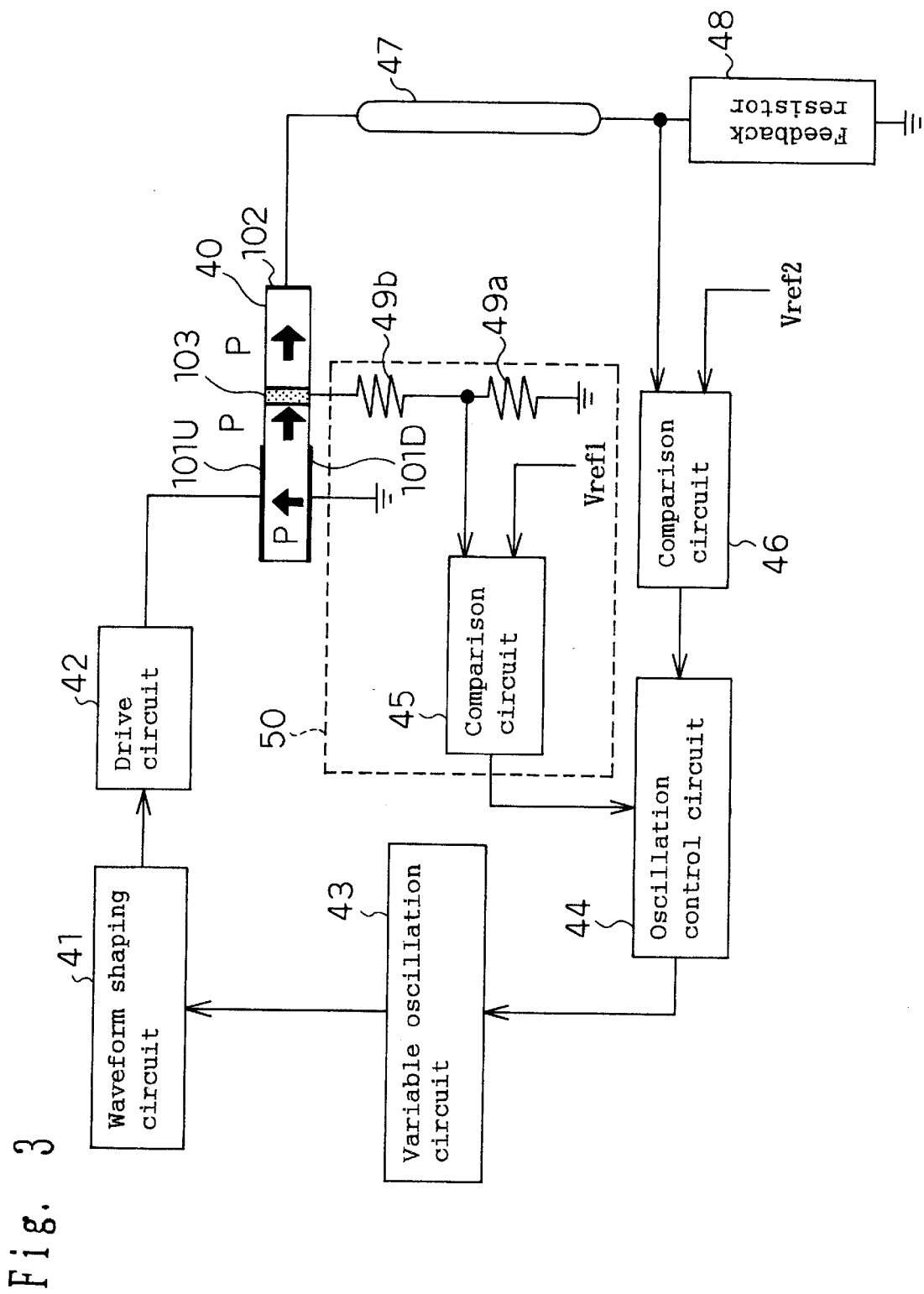
FIG. 3 is a block diagram showing a piezoelectric transformer drive circuit in accordance with the present invention.

Next, a drive circuit using the piezoelectric transformer shown in FIG. 1 will be described referring to FIG. 3. FIG. 3 is a block diagram showing the basic configuration of a piezoelectric inverter in accordance with the present invention. In FIG. 3, numeral 43 designates a variable oscillation circuit generating an AC drive signal for driving a piezoelectric transformer 40. The output of the variable oscillation circuit 43 is usually a pulse waveform signal. The high-frequency components of the signal are removed by a waveform shaping circuit 41, and its output is converted into an AC signal close to a sine waveform. The output of the waveform shaping circuit 41 is voltage-amplified by a drive circuit 42 to have a level sufficient to drive the piezoelectric transformer 40 and input to the primary electrode 101U of the piezoelectric transformer 40. The output voltage stepped by the piezoelectric effect of the piezoelectric transformer 40 is taken out from the secondary electrode 102.

The high voltage output from the secondary electrode 102 is applied to a series circuit comprising a cold cathode fluorescent tube 47 and a feedback resistor 48. In addition, the output from the sensor electrode 103 is applied to an overvoltage protection circuit portion 50. The overvoltage protection circuit portion 50 has a comparison circuit 45 to compare the voltage generating across a voltage division resistor 49b with a first reference voltage Vref1 (set voltage). In other words, the overvoltage protection circuit portion 50 outputs the result of the comparison to an oscillation control circuit 44 to prevent the high voltage output from the secondary electrode of the piezoelectric transformer from becoming higher than the set voltage before the lighting start of the cold cathode fluorescent tube 47. The oscillation control circuit 44 carries out overcurrent protection operation on the basis of the output from the comparison circuit 45 before the lighting start of the cold cathode fluorescent tube.

Furthermore, while the cold cathode fluorescent tube 47 is lit, the voltage generating across the feedback resistor 48 owing to the current flowing through the series circuit comprising the cold cathode tube 47 and the feedback resistance 48 is applied to a comparison circuit 46, and the output of the comparison circuit 46 is applied to the oscillation control circuit 44. As a result, the oscillation control circuit 44 controls the variable oscillation circuit 43 so that a nearly constant current flows through the cold cathode fluorescent tube 47.

In other words, before the lighting start of the cold cathode tube 47, the oscillation control circuit 44 operates on the basis of the output from the comparison circuit 45, and while the cold cathode tube 47 is lit, the oscillation control circuit 44 operates on the basis of the output from the comparison circuit 46.

Figure 4:
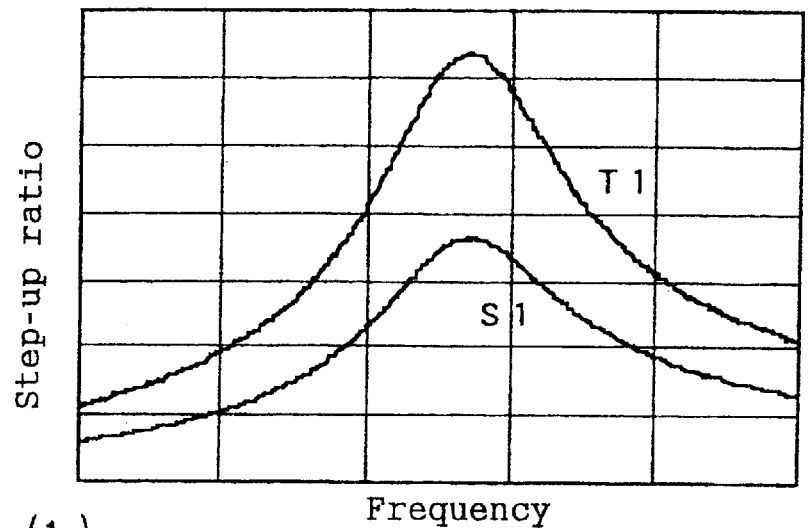
FIGS. 4A and 4B are graphs showing the operation characteristics of the piezoelectric transformer shown in FIG. 1, respectively.
Figure 4:
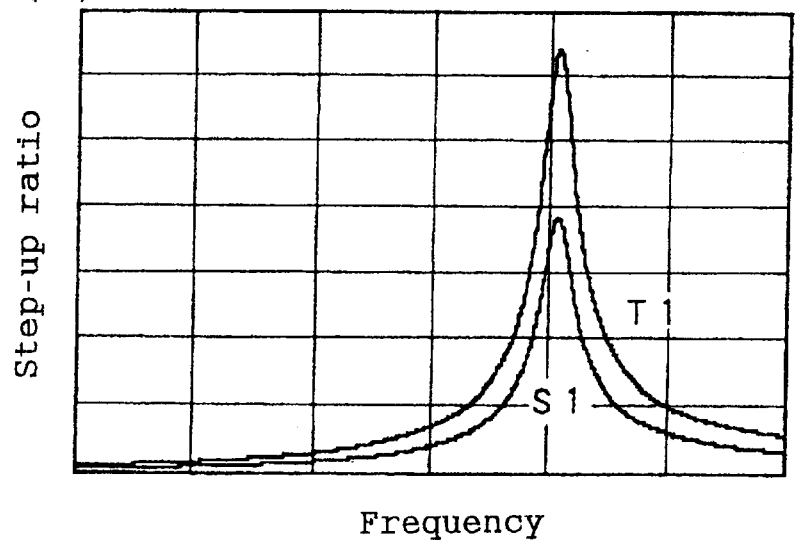

The operation of the piezoelectric inverter configured as described above will be described below referring to FIG. 4. FIGS. 4A and 4B show the operation characteristics of the piezoelectric transformer. The abscissa thereof represents frequency, and the ordinate represents step-up ratio. FIG. 4A shows the operation characteristics of the piezoelectric transformer of the present embodiment in the lighting state of the cold cathode tube. In addition, FIG. 4B shows the operation characteristics of the piezoelectric transformer of the present embodiment before the lighting of the cold cathode tube. T1 designates the output characteristic of the piezoelectric transformer, and S1 designates the output characteristic of the sensor electrode. The output of the sensor electrode is about 0.6 times as high as the secondary output. The resonance frequency and the inclinations of the curves of the output of the sensor electrode are nearly identical to those of the output characteristics of the piezoelectric transformer.

In the block diagram of the drive circuit shown in FIG. 3, the voltage applied to the cold cathode tube in the initial state before the lighting start is a high voltage corresponding to the voltage of the curve T1 in FIG. 4B. In addition, the drive frequency is lowered progressively to increase the output voltage. When the lighting voltage of the cold cathode tube is reached, the cold cathode tube is lit. At this time, the output from the sensor electrode becomes the voltage corresponding to the voltage of the curve S1. When the cold cathode tube is lit, the operation characteristic curve of the piezoelectric transformer shifts to the curve of FIG. 4A, and control is carried out so that a predetermined tube current can be obtained.

At this time, if the cold cathode tube is not lit even when the lighting start voltage is reached, the load of the piezoelectric transformer becomes virtually infinite. As the drive frequency lowers, the voltage corresponding to the frequency of the curve T1 of FIG. 4B is output. At the time of the lighting start, the output voltage from the sensor electrode corresponding to the curve S1 is detected and compared with the set voltage by the comparison circuit 45. The drive frequency is lowered until the output voltage from the sensor electrode becomes the set value thereby to increase the output voltage. However, when the output voltage reaches the set value, the frequency control circuit 44 stops frequency sweep depending on the output of the voltage comparison circuit 45 and fixes the drive frequency at the value corresponding to the voltage value.

In addition, the overvoltage protection circuit portion 50 stops operation while the cold cathode tube is lit, and a tube current control circuit (corresponding to the comparison circuit 46 and the feedback resistor 48 in FIG. 3) is used for operation.

In the present embodiment, the secondary electrode is formed on the end face of a rectangular plate. However, it may be formed near the end face.

Furthermore, in the present embodiment, the piezoelectric transformer is formed of piezoelectric ceramic, such as PZT. However, similar characteristics can be obtained even when a single crystal material, such as $LiNbo_3$, is used, provided that the material exhibits a piezoelectric property.

Furthermore, the sensor electrode is formed near the central portion of the piezoelectric transformer. However, in the case of using the $\lambda/2$ vibration mode, the sensor electrode can be formed in the range of L/8 or less from the central portion of the piezoelectric transformer (as shown in FIG. 17) when the length of the piezoelectric transformer is L. With this formation, it is possible to obtain an effect of not inhibiting the vibration of the piezoelectric transformer at the time of taking out the electrode and an effect of decreasing the output voltage value of the sensor electrode. Furthermore, in the case of using the λ vibration mode, when the length of the piezoelectric transformer is L, the sensor electrode is formed in the range of L/8 or less from the center of the power generation portion thereof (as shown in FIG. 18). With this formation, the vibration of the piezoelectric transformer is not inhibited at the time of taking out the electrode. Moreover, it is possible to decrease the output voltage value of the sensor electrode by forming the sensor electrode between the boundary of the drive portion and the power generation portion and the center of the power generation portion.

In addition, in another structure of the piezoelectric transformer of the present invention, the output of the sensor can be obtained by forming the sensor electrode between the secondary electrodes. Even in this case, similar effects can be obtained.

Furthermore, in the case of the piezoelectric transformer of the present embodiment, if the sensor output is not required, the output from the sensor electrode can be used to control the output voltage of the piezoelectric transformer or can be taken out as an output in the case when a different voltage is required to be output.

As clearly described above, the present embodiment has the advantage that overvoltage protection can be carried out at a voltage lower than a voltage used conventionally.

Embodiment 2

Figure 5:
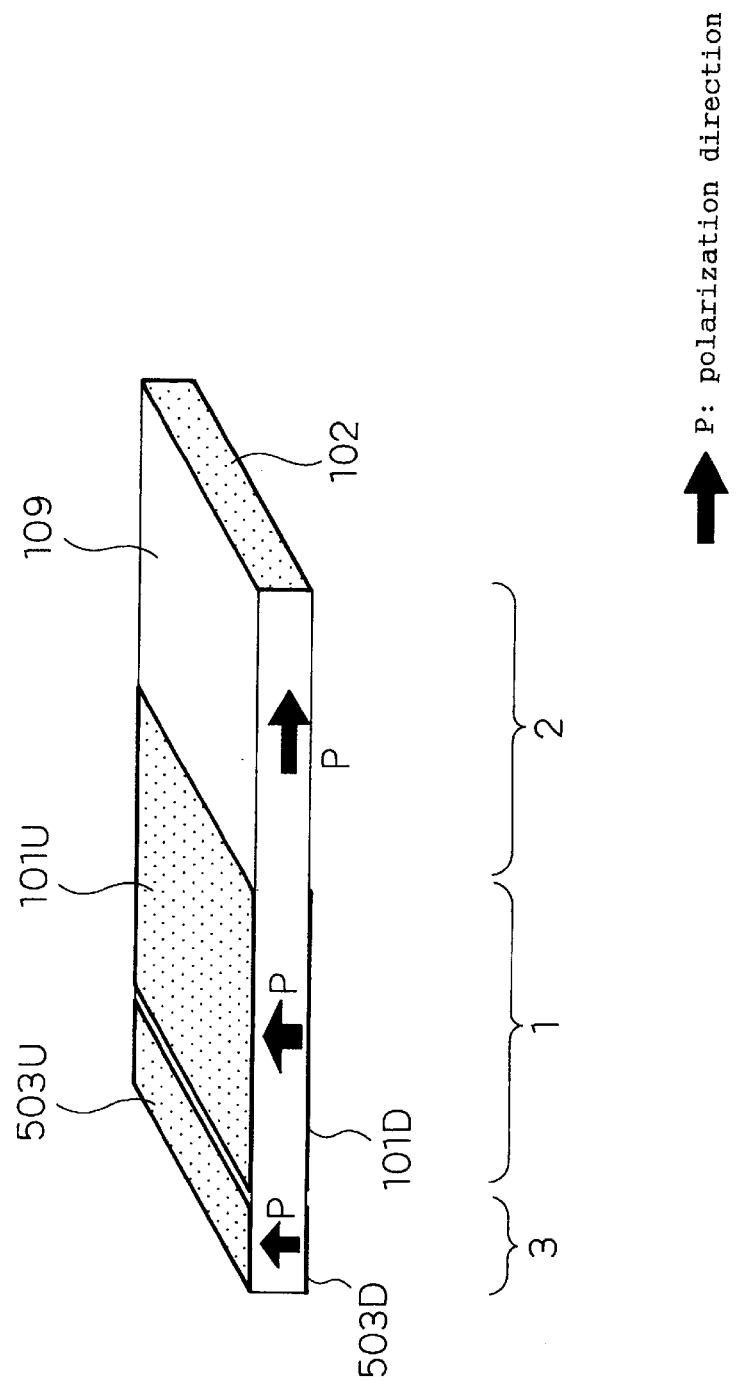
FIG. 5 is a perspective view showing a structure of a piezoelectric transformer in accordance with a second embodiment of the present invention.

FIG. 5 is a perspective view showing the structure of a second embodiment of the piezoelectric transformer in accordance with the present invention.

The piezoelectric transformer used for the present embodiment is formed of a piezoelectric material exhibiting a piezoelectric property, such as PZT, and the voltage applied to its primary electrode is multiplied by a step-up ratio and taken out from its secondary electrode. Numeral 1 designates a low impedance portion, and numerals 101U and 101D designate primary electrodes. Numeral 2 designates a high impedance portion. Numeral 102 designates a secondary electrode. In addition, numeral 3 designates a sensor portion, and numerals 503U and 503D designate sensor electrodes. As shown in FIG. 5, this piezoelectric transformer is electrically connected from the primary electrodes 101U and 101D provided on the top and bottom main faces of the low impedance portion, from the secondary electrode 102 provided on an end face of the piezoelectric transformer and from the sensor electrodes 503U and 503D.

The present embodiment differs from the embodiment 1 in that the sensor electrodes are formed in a region wherein the drive portion of the piezoelectric transformer is retracted from the end face of the piezoelectric transformer in the longitudinal direction, and that vibration energy is taken out by using the vibration of k31. By using the vibration of k31 in this way, the ratio of conversion from vibration energy into mechanical energy can be decreased, and the efficiency drop of the piezoelectric transformer due to the output from the sensor electrode can be prevented. In addition, the polarization direction of the sensor electrodes is identical with or opposite to that of the low impedance portion. Therefore, it is advantageous in that polarization can be carried out easily.

Figure 6:
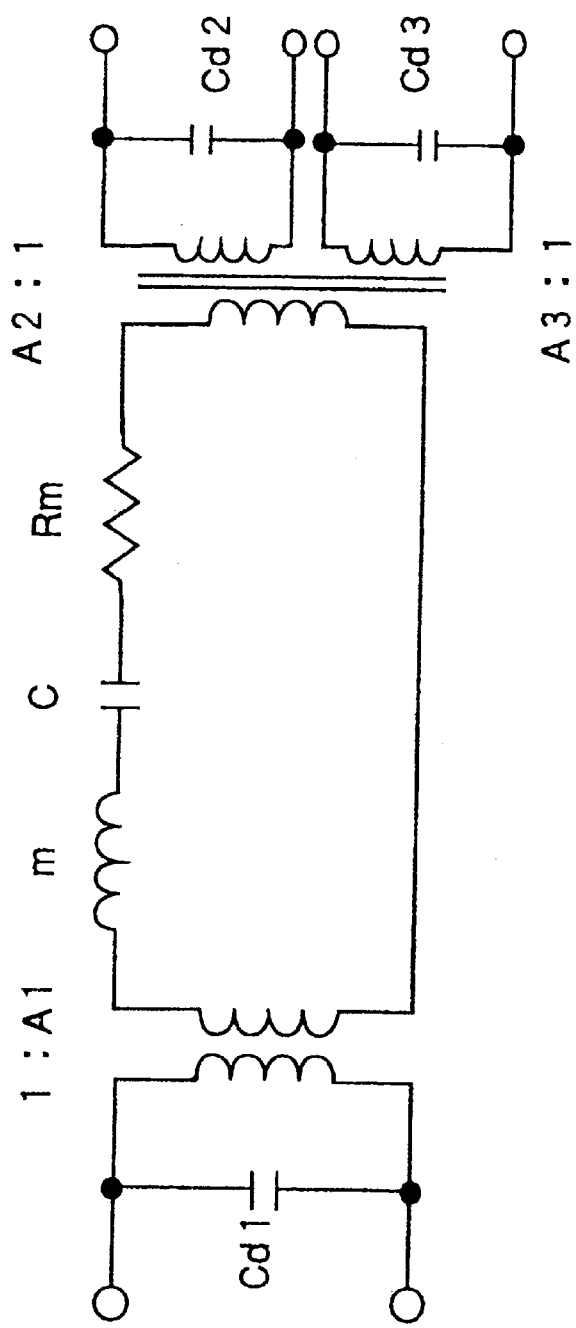
FIG. 6 is a diagram showing the equivalent circuit of the piezoelectric transformer shown in FIG. 5.

The lumped parameter approximate equivalent circuit at a frequency near the resonance frequency of the piezoelectric transformer is shown in FIG. 6. In FIG. 6, Cd1 and Cd2 are bound capacitances on the input and output sides respectively. Cd3 is the bound capacitance of the sensor portion. A1 (on the input side), A2 (on the output side) and A3 (at the sensor portion) are force factors, m is an equivalent mass, C is an equivalent compliance, and Rm is an equivalent mechanical resistance. In the piezoelectric transformer of the present embodiment, the force factor A1 is larger than A2 and A3. The voltage is stepped up by the three equivalent ideal transformers shown in FIG. 6. Furthermore, since the piezoelectric transformer includes a series resonance circuit comprising an equivalent mass and an equivalent compliance, the output voltage and the sensor voltage become larger than those obtained by the transformation ratios of the transformers particularly when the value of a load resistance is large (this also occurs similarly in the case of the following embodiments).

The equivalent circuit of the embodiment 2 differs from that of the embodiment 1 in that the output of the sensor portion is represented by a single ideal transformer. As a result, the correlation between the output and the output of the sensor portion is not close, whereby any desired output can be obtained easily.

In addition, the sensor electrodes are formed on the main faces and near the end face of the piezoelectric transformer in the longitudinal direction thereof. However, in the case of using the λ vibration mode, it is desirable that the sensor electrodes are formed between the primary and secondary electrodes. In this case, it is possible to obtain an effect wherein the excitation in the λ vibration mode can be carry out more easily than that in the case when the sensor electrodes are formed near the end face.

Furthermore, in the present embodiment, the piezoelectric transformer is formed of piezoelectric ceramic, such as PZT. However, similar characteristics can be obtained even when a single crystal material, such as $LiNbo_3$, is used, provided that the material exhibits a piezoelectric property.

Figure 7A:
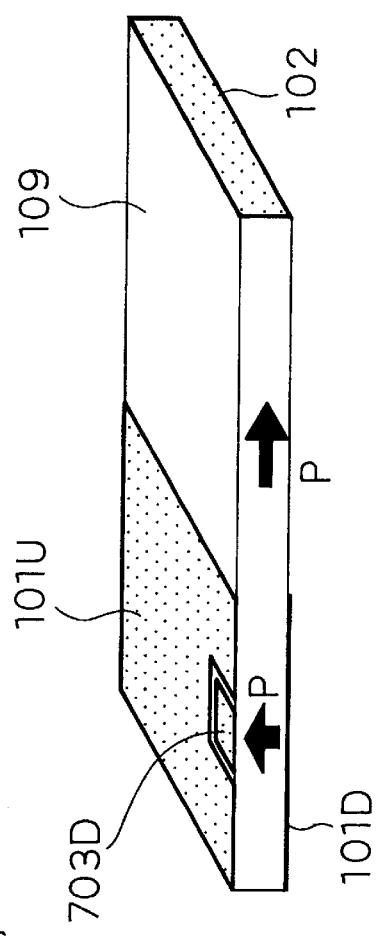
FIGS. 7A and 7B are perspective views showing another structure of the piezoelectric transformer in accordance with the second embodiment of the present invention.
Figure 7B:
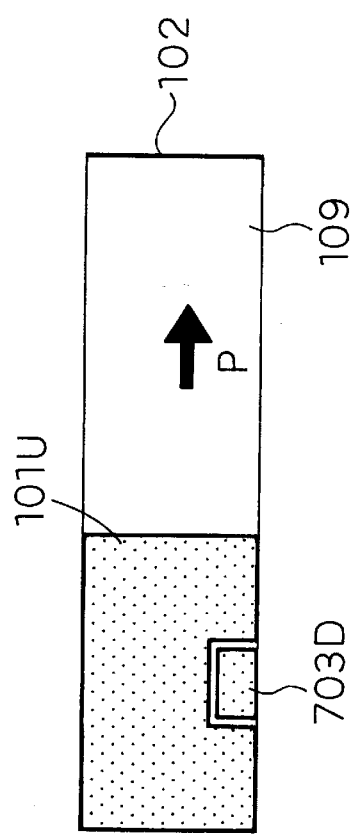
Figure 8:
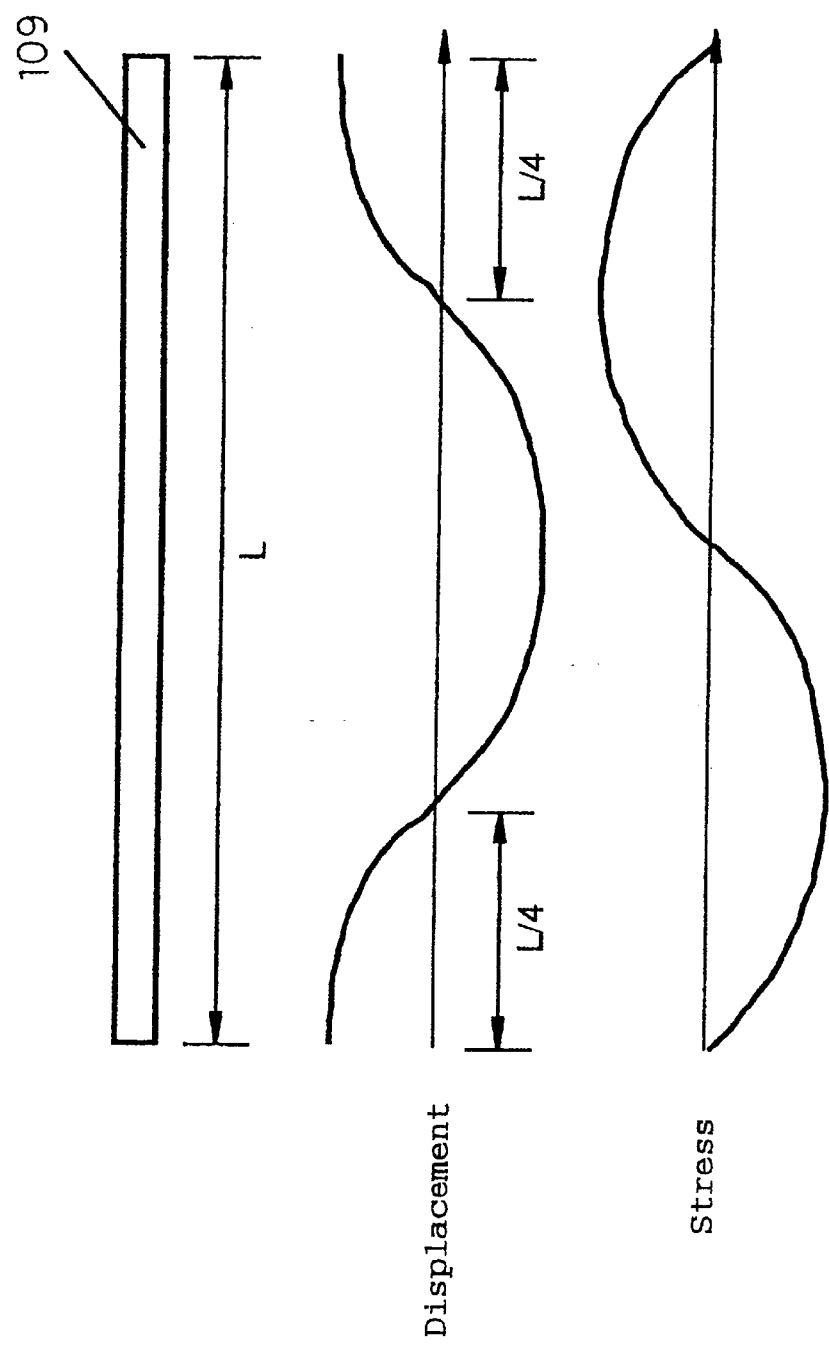
FIG. 8 is a diagram showing the displacement distribution and stress distribution of the rod-like resonator in the secondary mode of vertical vibration in the longitudinal direction.
Figure 9:
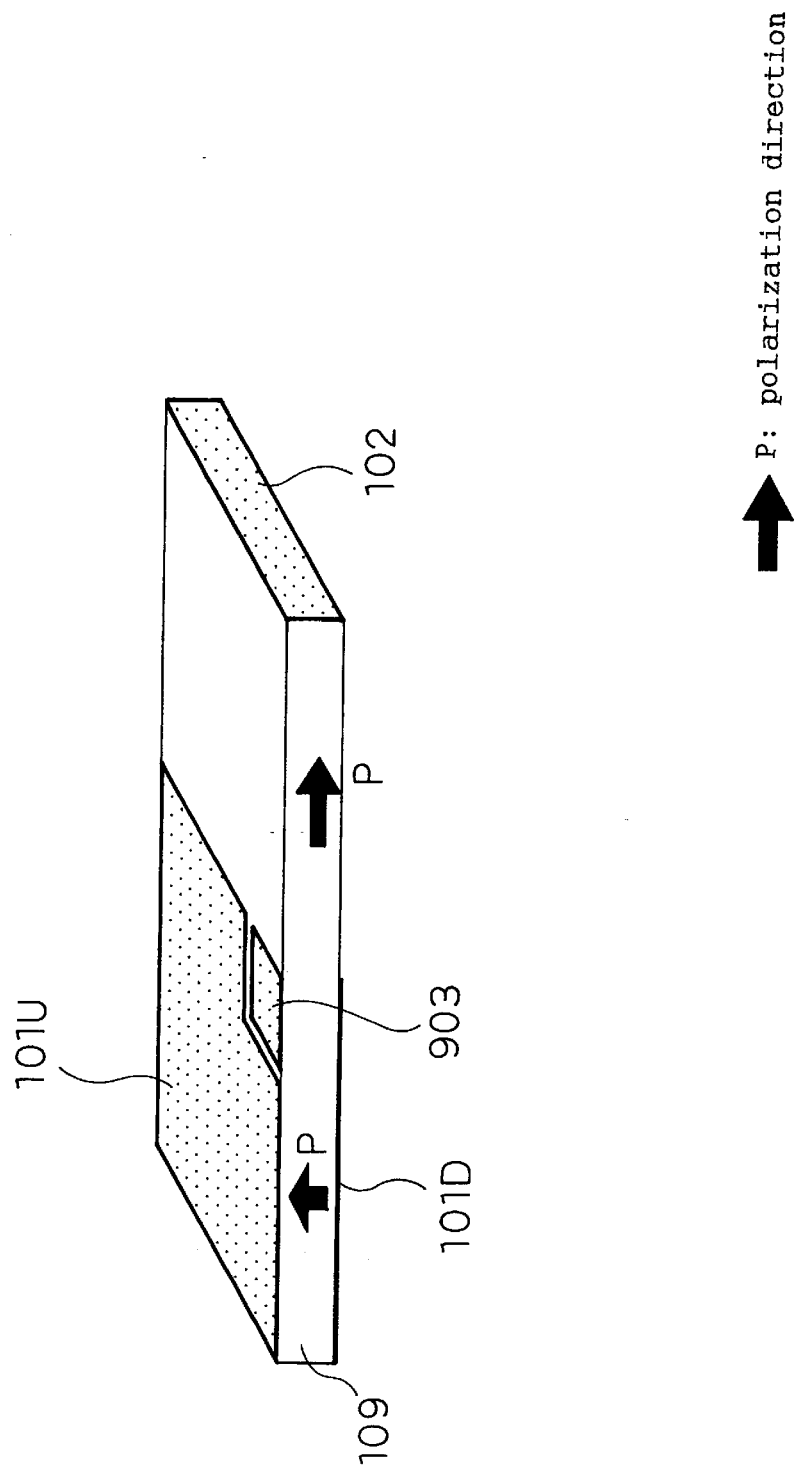
FIG. 9 is a perspective view showing a still another structure of the piezoelectric transformer in accordance with the second embodiment of the present invention.
Figure 10:
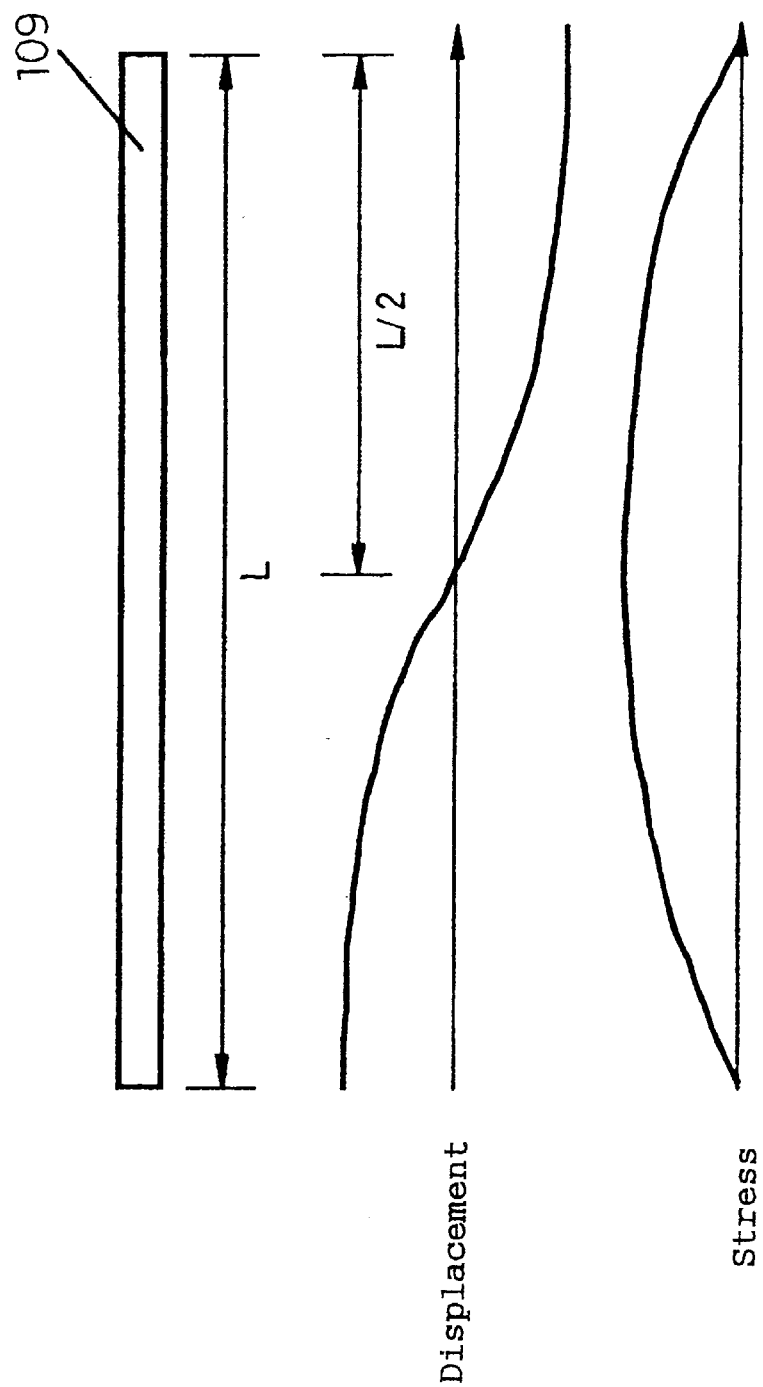
FIG. 10 is a diagram showing the displacement distribution and stress distribution of the rod-like resonator in the primary mode of vertical vibration in the longitudinal direction.

Furthermore, as shown in FIGS. 7A and 7B, in the case of using the λ vibration mode, the sensor electrodes are formed in a region near the center of the drive portion of the piezoelectric transformer. By forming the sensor electrodes in this way, the electrodes can be taken out from a node of the vibration as show in FIG. 8, thereby not inhibiting the vibration of the piezoelectric transformer at the time of taking out the electrodes. Furthermore, in the case of using the λ/2 vibration mode, the electrodes are formed in a region near the center of the piezoelectric transformer in the longitudinal direction thereof as shown in FIG. 9. By forming the sensor electrodes in this way, the electrodes can be taken out from a node of the vibration as shown in FIG. 10, thereby not inhibiting the vibration of the piezoelectric transformer at the time of taking out the electrodes.

Furthermore, a similar effect can be obtained even if the sensor portion has a multilayer structure. In addition, one of the sensor electrodes can be shared with one of the primary electrodes.

Furthermore, in the present invention, the sensor portion can be formed so that the output of the sensor can be obtained by the vibration of k31 even in the case of another structure of the piezoelectric transformer. Even in this case, a similar effect can be obtained.

Furthermore, in the case of the piezoelectric transformer of the present embodiment, if the sensor output is not required, the output from the sensor electrode can be used to control the output voltage of the piezoelectric transformer or can be taken out as an output in the case when a different voltage is required to be output.

Embodiment 3

FIG. 11A is a perspective view showing the structure of a third embodiment of the piezoelectric transformer in accordance with the present invention. FIG. 11B is a plan view showing the piezoelectric transformer viewed from the top face thereof.

The piezoelectric transformer used for the present embodiment is formed of a piezoelectric material exhibiting a piezoelectric property, such as PZT, and the voltage applied to its primary electrodes is multiplied by a step-up ratio and taken out from its secondary electrode. The low impedance portion there of is formed of primary electrodes 101U and 101D. In addition, the high impedance portion is formed of a secondary electrode 102 and one of the primary electrodes, and the secondary electrode 102 is provided on the end face of the high impedance portion. Furthermore, numerals 113U and 1113D designate sensor electrodes. As shown in FIG. 11, this piezoelectric transformer is electrically connected from the primary electrodes 101U and 101D provided on the top and bottom main faces of the low impedance portion, from the secondary electrode 102 provided on the end face of the piezoelectric transformer and via the sensor electrodes 103U and 103D.

The present embodiment differs from the embodiment 2 in that the sensor electrodes are formed on the main faces of the piezoelectric transformer in the direction of the width thereof, and vibration is taken out by using the vibration of k31". By independently changing the vibration at the drive portion, the vibration at the sensor portion and the vibration at the power generation portion just as in the case of the present embodiment, the step-up ratio at the sensor portion and the step-up ratio at the output portion with respect to the input can be changed independently as desired, thereby offering an advantage.

Furthermore, in the present embodiment, the piezoelectric transformer is formed of piezoelectric ceramic, such as PZT. However, similar characteristics can be obtained even when a single crystal material, such as $LiNbo_3$, is used, provided that the material exhibits a piezoelectric property.

Figure 12A:
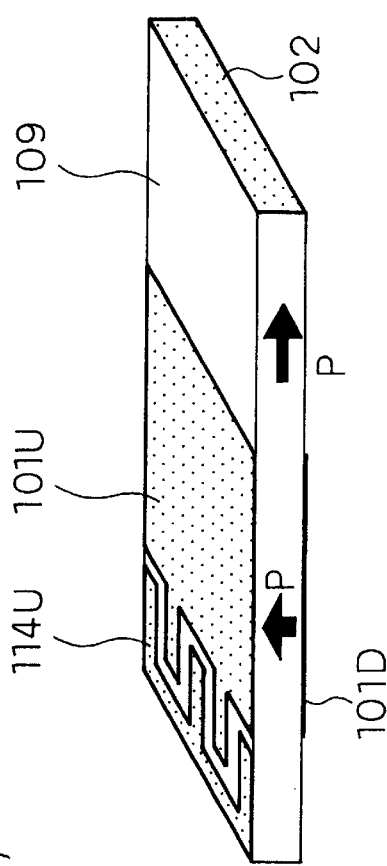
FIGS. 12A and 12B are views showing another structure of the piezoelectric transformer in accordance with the third embodiment of the present invention.
Figure 12B:
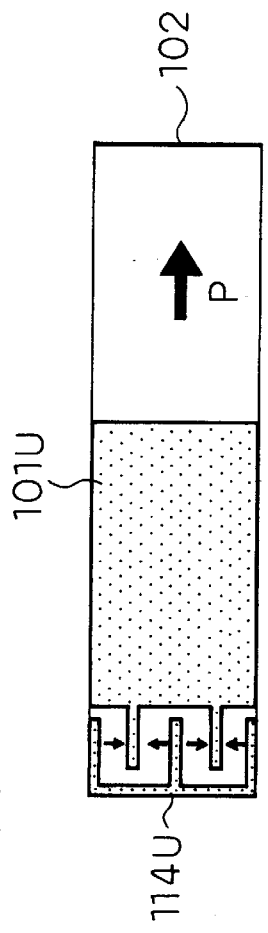

Furthermore, the sensor electrodes are formed only on the main faces of the piezoelectric transformer in the direction of the width thereof. However, it is possible to obtain a similar effect from a configuration wherein a sensor electrode 114U is formed in a comb shape and the other sensor electrode is shared with the primary electrode 101U as shown in FIG. 12. Although one of the sensor electrodes is shared with the primary electrode 101U in the above-mentioned configuration, the configuration of this embodiment is not limited to this configuration. It is possible to obtain a similar effect even when another comb-shaped electrode 114D is formed as shown in FIG. 13.

Furthermore, the sensor electrodes are formed near the end face of the piezoelectric transformer in the longitudinal direction thereof. However, in the case of using the λ vibration mode, it is desirable thatthe sensor electrodes are formedbetween the primary and secondary electrodes. In this case, it is possible to obtain an effect wherein the vibration in the λ vibration mode can be performed more easily than the vibration in the case when the sensor electrodes are formed near the end face.

Furthermore, in another structure of the piezoelectric transformer of the present invention, the sensor portion can be formed so that the sensor output can be obtained by the vibration of k31". A similar effect can also be obtained even in this case.

Furthermore, in the case of the piezoelectric transformer of the present embodiment, if the sensor output is not required, the output from the sensor electrode can be used to control the output voltage of the piezoelectric transformer or can be taken out as an output in the case when a different voltage is required to be output.

Embodiment 4

FIG. 14A is a perspective view showing the structure of a fourth embodiment of the piezoelectric transformer in accordance with the present invention. FIG. 14B is a sectional view showing the piezoelectric transformer in the direction of the thickness thereof.

The piezoelectric transformer used for the present embodiment is formed of a piezoelectric material exhibiting a piezoelectric property, such as PZT, and the voltage applied to its primary electrode is multiplied by a step-up ratio and taken out from its secondary electrode. The low impedance portion is formed of primary electrodes 121U and 121D, and has a structure wherein piezoelectric elements and internal electrodes are stacked alternatively. In addition, the high impedance portion is formed of a secondary electrode 122 and one of the primary electrodes, 121D, and the secondary electrode 122 is provided on the end face of the high impedance portion. Furthermore, the electrode 123D provided on a part of the low impedance portion in the direction of the thickness thereof is one of the sensor electrodes. The other sensor electrode is shared with the primary electrode 121U.

This piezoelectric transformer is electrically connected from the primary electrodes 121U and 121D stacked in the low impedance portion, from the secondary electrode 122 provided on the end face of the piezoelectric transformer and from the sensor electrode 123D.

The present embodiment differs from the embodiment 2 in that the primary electrodes are stacked, that the sensor electrode is formed on a part of the main face of a piezoelectric element 109 in the direction of the thickness thereof in parallel with the primary electrodes so as not to affect the vibration in the longitudinal direction.

The electric energy from the primary electrodes is converted into mechanical vibration to generate vibration. The portion wherein the sensor electrode is formed exhibits a piezoelectric property, but it is a load as viewed from the primary electrodes as shown in the equivalent circuit. Therefore, the efficiency can be prevented from dropping by making the drive portion of the piezoelectric transformer as large as possible. As a result, overvoltage protection for the output voltage can be attained, and the sensor electrode can prevent the efficiency of the conversion from lowering.

Furthermore, in the present embodiment, the piezoelectric transformer is formed of piezoelectric ceramic, such as PZT. However, similar characteristics can be obtained even when a single crystal material, such as $LiNbo_3$, is used, provided that the material exhibits a piezoelectric property.

Figure 15:
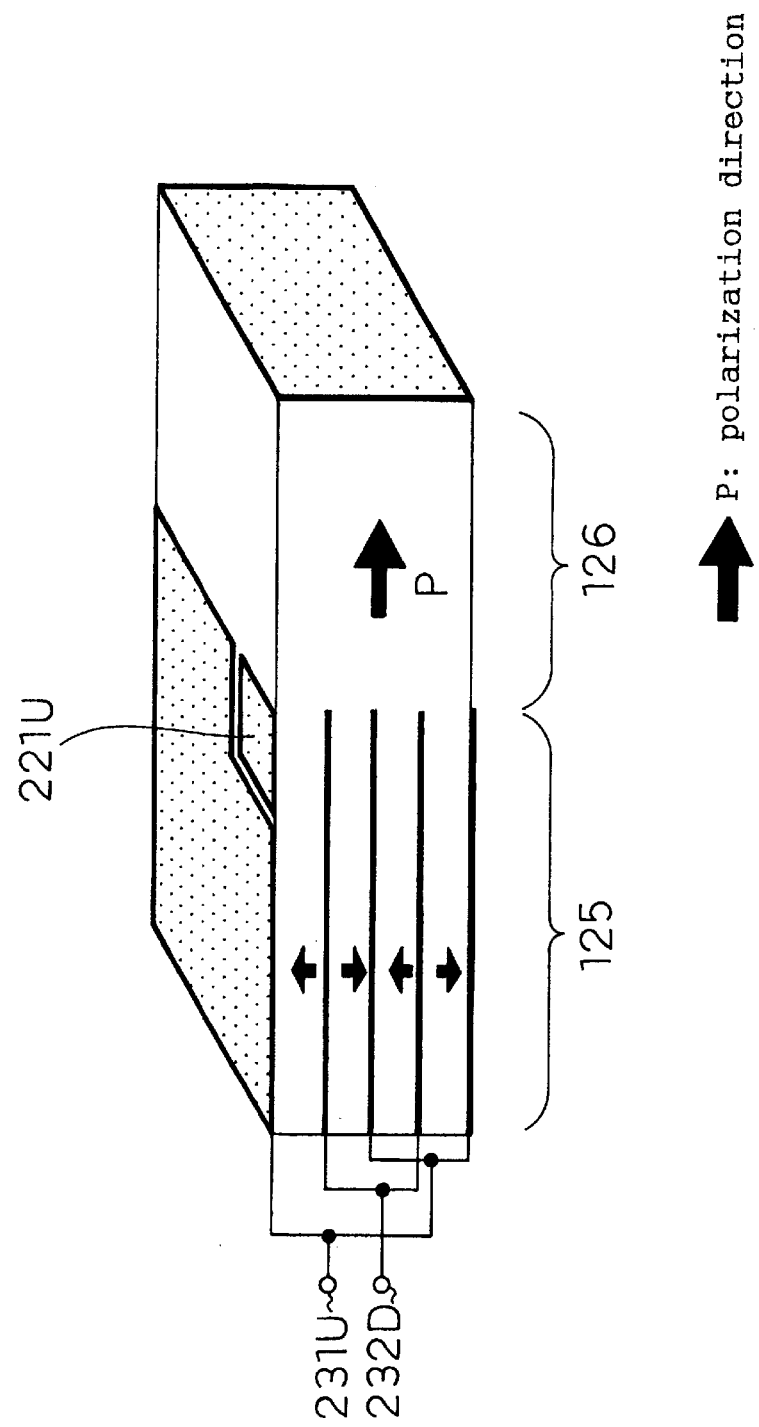
FIG. 15 is a sectional view showing another structure of the piezoelectric transformer in accordance with the fourth embodiment of the present invention.

Furthermore, in FIG. 14, the sensor electrode 123D, being equal to the primary electrodes in size, is formed on the main face in the longitudinal direction. However, a similar effect can be obtained even when a sensor electrode 221U is formed on a part of the main face in the direction of the thickness and the other part is used as a primary electrode 231U as shown in FIG. 15. In this configuration, the low impedance portion comprises the primary electrodes 231U and 232D, and piezoelectric elements and internal electrodes are stacked alternatively. This configuration has a further advantage wherein the excitation in a desired mode at the primary electrodes is hardly inhibited, whereby the effect is significant.

Furthermore, in the present embodiment, the thickness of the single layer in the low impedance portion formed of the stacked layers is identical with the thickness of the single layer of the sensor electrode. However, the thickness of the single layer in the low impedance portion may be different from the thickness of the single piezoelectric layer of the sensor portion. In addition, the sensor portion can have a multilayer structure.

Figure 16:
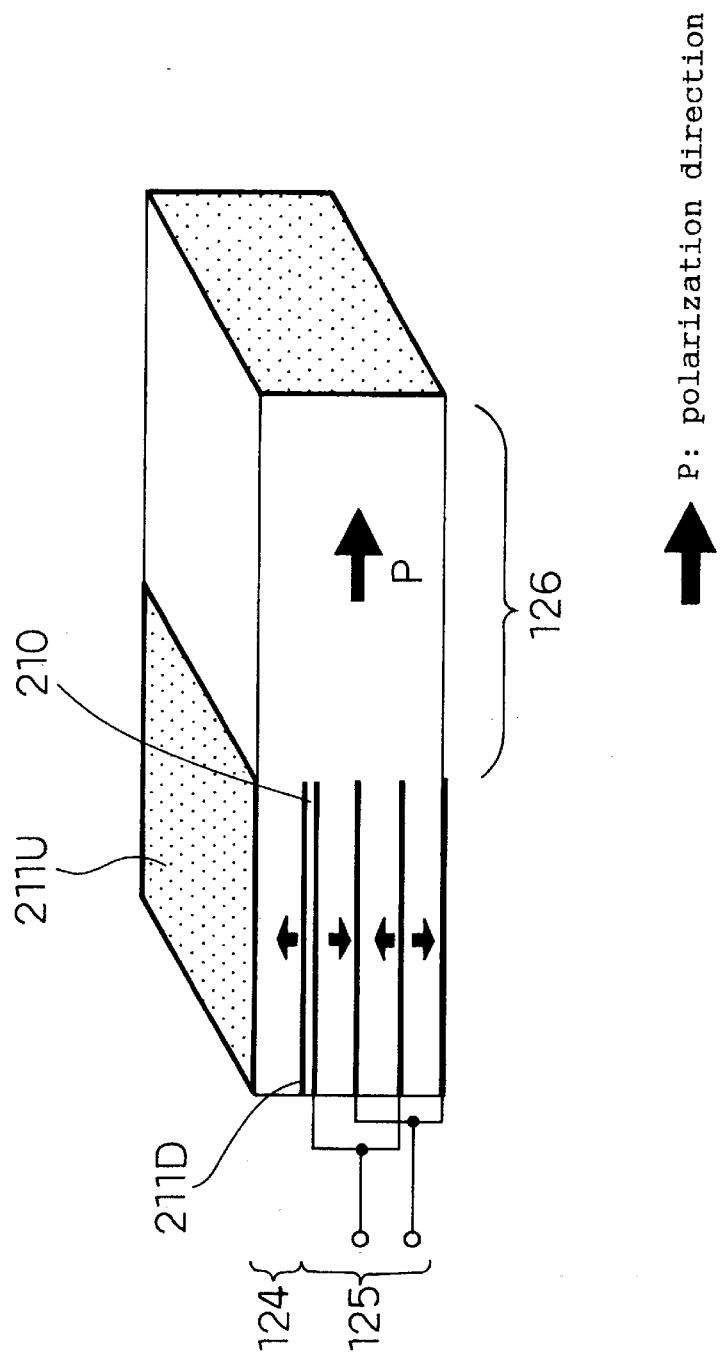
FIG. 16 is a sectional view showing still another structure of the piezoelectric transformer in accordance with the fourth embodiment of the present invention.

Furthermore, in the present embodiment, one of the sensor electrodes is shared with one of the primary electrodes. However, a similar effect can also be obtained even when the sensor portion is formed so that the sensor electrodes are formed independently via an insulation layer as shown in FIG. 16.

Furthermore, in the case of the piezoelectric transformer of the present embodiment, if the sensor output is not required, the output from the sensor electrode can be used to control the output voltage of the piezoelectric transformer or can be taken out as an output in the case when a different voltage is required to be output.

Furthermore, in another structure of the piezoelectric transformer of the present invention, the sensor portion can be formed in a part of the stacked primary electrodes in the direction of the thickness. Even in this case, a similar effect can be obtained.

As detailed above, in the piezoelectric transformer of the present invention, overvoltage protection at the time of the opening of the output terminal can be carried out at a relatively low voltage by providing the sensor electrodes. Furthermore, a highly reliable, compact piezoelectric inverter can be obtained by using the drive method of the present invention. Therefore, the effect is very significant in practical use.

As clearly described above, the present invention has the advantage that overvoltage protection can be carried out at a voltage lower than a voltage used conventionally.

In the above described embodiments, it was explained that examples of using a low voltage in order to control the output voltage of the piezoelectric transformer can be used by carrying out the overvoltage control for the piezoelectric transformer by using a sensor electrode provided independently of the primary and secondary electrodes of the piezoelectric transformer. However, in the case when the sensor electrode is used in this way, the vibration of the piezoelectric transformer is detected by sensor electrode while overvoltage control is performed. Therefore, it is necessary to perform drive operation by preventing unnecessary vibration as much as possible. If the drive operation is improper, malfunctions may occur.

Accordingly, an object of the present invention is to provide a compact, highly efficient, highly reliable cold cathode tube drive apparatus using a piezoelectric transformer by not routing high-voltage lines to a protection circuit and by preventing malfunctions due to unnecessary vibration of the piezoelectric transformer at the time of protecting the piezoelectric transformer against overvoltages.

Embodiments of the present invention will be described below referring to the accompanying drawings.

B First Embodiment

FIG. B1 is a block diagram showing the configuration of a cold cathode tube drive apparatus using a piezoelectric transformer in accordance with a B first embodiment of the present invention. Before describing the cold cathode tube drive apparatus shown in FIG. B1, the structure and equivalent circuit of the piezoelectric transformer used for the apparatus will be described below referring to FIGS. B2 and B3.

FIGS. 2A and 2B are perspective and front views showing the structure of the piezoelectric transformer used for the present embodiment respectively.

The piezoelectric transformer used for the present embodiment is made of a piezoelectric material exhibiting a piezoelectric property, such as PZT or the like. The voltage applied to its primary electrode is multiplied by a step-up ratio and taken out from its secondary electrode. In FIG. B2, numeral 1024 designates a sensor portion. Numeral 1025 designates a low impedance portion having a polarization structure in the thickness direction A of the piezoelectric transformer, and numerals 1021U and 1021D designate a pair of primary electrodes disposed opposite to each other. Numeral 1026 designates a high impedance portion having a polarization structure in the longitudinal direction B of the piezoelectric transformer. Numeral 1022 designates a secondary electrode, and it is provided at the end face of the high impedance portion 1026. In addition, numerals 1023U and 1023D are a pair of sensor electrodes provided on a part of the low impedance portion 1025 in the direction of the thickness thereof, disposed opposite to the primary electrodes 1021U and 1021D and also disposed opposite to each other. The sensor electrode 1023U and the primary electrode 1021U are connected to each other so that they are used as a common voltage reference electrode for the sensor electrode 1023D and the primary electrode 1021D respectively.

In the case of the piezoelectric transformer shown in FIG. B2, the other secondary electrode is shared with the primary electrode 1021U or the sensor electrode 1023U.

In this piezoelectric transformer, as shown in FIG. B2, an input voltage is applied across the primary electrodes 1021U and 1021D provided in the direction of the thickness of the low impedance portion 1025, and a stepped-up output voltage is taken out from the secondary electrode 1022 provided on the end face of the high impedance portion 1026 in the longitudinal direction thereof. In addition, a voltage proportional to the output voltage is taken out across the sensor electrodes 1023U and 1023D provided in the low impedance portion 1025 in the direction of the thickness thereof.

Next, the equivalent circuit of the piezoelectric transformer configured as described above will be described.

FIG. B3 is a lumped parameter approximate equivalent circuit at a frequency close to the resonance frequency of the piezoelectric transformer used for the present embodiment. In FIG. B3, Cd1 and Cd2 designate bound capacitances on the input and output sides respectively, Cs designates the bound capacitance of the sensor portion, A1 (on the input side) and A2 (on the output side) designate force factors, As designates the force factor of the sensor portion, m designates an equivalent mass, C designates an equivalent compliance, and Rm designates an equivalent mechanical resistance.

In the piezoelectric transformer of the present embodiment, the force factor A1 is larger than A2 (and As). An equivalent ideal transformer having these two force factors, A1 and A2, is used to perform voltage step-up. In addition, since the piezoelectric transformer includes a series resonance circuit comprising the equivalent mass m and the equivalent compliance C, the output voltage becomes a value larger than the value obtained by the transformation ratios of the transformers particularly when the value of the load resistance is large.

Next, a cold cathode tube drive apparatus using the piezoelectric transformer shown in FIG. B2 will be described referring to FIG. B1. In FIG. B1, numeral 1011 designates a piezoelectric transformer drive portion for driving a piezoelectric transformer 1020. The piezoelectric transformer drive portion 1011 comprises a variable oscillation circuit 1113 for generating an AC signal, the frequency of which is variable, a waveform shaping circuit 1111 for eliminating high-frequency components from a pulse-like AC signal output from the variable oscillation circuit 1113 and for converting the signal into an AC signal close to a sine waveform signal, and a drive circuit 1112 for voltage-amplifying the output of the waveform shaping circuit 1111 to a level enough to drive the piezoelectric transformer 1020 and for applying the output to the primary electrode 1021D of the piezoelectric transformer 1020. The output voltage stepped up by the piezoelectric effect of the piezoelectric transformer 1020 is taken out from the secondary electrode 1022. The primary electrode 1021U and the sensor electrode 1023U of the piezoelectric transformer 1020 are connected to the ground potential.

The high voltage output from the secondary electrode 1022 is applied to a series circuit comprising a cold cathode tube 1017 and a feedback resistor 1018. In addition, the output from the sensor electrode 1023D is applied to an overvoltage protection circuit 1010. In the overvoltage protection circuit 1010, a voltage divider circuit comprising voltage division resistors 1019a and 1019b divides the high voltage output from the secondary electrode 1022 of the piezoelectric transformer 1020, and a comparison circuit 1015 compares the voltage obtained by the division at the voltage divider circuit with a set value Vref1, and outputs an error voltage. The error voltage from the comparison circuit 1015 is applied to an oscillation control circuit 1014. The oscillation control circuit 1014 controls the variable oscillation circuit 1113 so that the high voltage output from the secondary electrode 1022 of the piezoelectric transformer 1020 is equal to Vref1×(electric resistance value of the resistor 1019a+electric resistance value of the resistor 1019b)/electric resistance value of the resistor 1019a. The oscillation control circuit 1014 does not accept the output from the overvoltage protection circuit 1010 while the cold cathode tube 1197 is lit.

Furthermore, the Voltage (current detection value) generated across the feedback resistor 1018 by the current flowing through the series circuit comprising the cold cathode tube 1017 and the feedback resistor 1018 is applied to a comparison circuit 1016. The comparison circuit 1196 compares the current detection value with a set value Vref2 and outputs an error voltage. The error voltage output from the comparison circuit 1016 is applied to the oscillation control circuit 1014. The variable oscillation circuit 1113 is controlled by the oscillation control circuit 1014 so that a nearly constant current flows through the cold cathode tube 1197.

As described above, the oscillation control circuit 1014 has a switching means formed of a switching device or the like (not shown), and carries out control operation on the basis of the output from comparison circuit 1015 before the lighting start of the cold cathode tube 1017. After the lighting start, control operation is switched from the control operation on the basis of the output from the comparison circuit 1015 to the control operation on the basis of the output from the comparison circuit 1016.

Next, the operation of the fluorescent tube drive apparatus configured as described above will be described referring to FIG. B4. FIG. B4 shows the operation characteristics of the piezoelectric transformer 1020. The abscissa represents frequency, and the ordinate represents step-up ratio. FIG. B4A shows the operation characteristic of the piezoelectric transformer 1020 while the cold cathode tube is lit. FIG. B4B shows the operation characteristic of the piezoelectric transformer 1020 before the cold cathode tube is lit. In FIG. B4, T1 is a curve indicating the step-up ratio between the primary electrode 1021D and the secondary electrode 1022, and S1 is a curve indicating the step-up ratio between the primary electrode 1021D and the sensor electrode 1023D of the piezoelectric transformer. The output of the sensor electrode 1023D is about 0.4 times the input voltage of the primary electrode 1021D. The resonance frequency, the inclinations and the like of the curve S1 are nearly identical to those of the curve T1.

The voltage applied to the cold cathode tube 17 at the time of start, that is, before the lighting start of the cold cathode tube 1017, is a high voltage corresponding to the step-up ratio indicated by the curve T1 of FIG. B4B. First, the drive frequency at the time of start is set at a frequency fs higher than the frequency wherein the step-up ratio becomes its peak. The output voltage Vst corresponding to the input voltage and the step-up ratio is output from the secondary electrode 1022 of the piezoelectric transformer 1020. The drive frequency is lowered progressively and the output voltage is increased until the output voltage reaches a desired voltage Vot (the lighting voltage of the cold cathode tube 1017). When the output voltage of the piezoelectric transformer 1020 reaches the lighting voltage Vot (at a drive frequency fo) of the cold cathode fluorescent tube 1017, the cold cathode tube 1017 starts lighting. At this time, the output from the sensor electrode 1023D becomes a voltage Vos corresponding to the step-up ratio indicated by the curve S1.

When the cold cathode tube 1017 is lit, the operation characteristic of the piezoelectric transformer 1020 shifts from the step-up ratio curve shown in FIG. B4B to that shown in FIG. B4A. After this, drive control is carried out so that a predetermined current flows through the cold cathode tube 1017. When the cold cathode tube 1017 is lit, the step-up ratio T1 between the primary electrode 1021D and the secondary electrode 1022 of the piezoelectric transformer 1020 lowers, and the step-up ratio S1 between the primary electrode 1021D and the sensor electrode 1023D also lowers in a similar way. As a result, the ratio between the step-up ratios T1 and S1 remains almost constant before and after the lighting of the cold cathode tube 1017.

Before the cold cathode tube 1017 is lit, the output load of the piezoelectric transformer 1020 is nearly infinite. Therefore, the piezoelectric transformer 1020 is apt to generate a high output voltage, whereby a high step-up ratio can be obtained. However, when the cold cathode tube 1017 is lit, the output load of the piezoelectric transformer 1020 lowers from an infinite value to about several hundred kΩ. Therefore, the vibration width of the piezoelectric transformer 1020 becomes smaller than that before the lighting start. Accordingly, T1 and S1 decrease. In other words, a low voltage from the sensor electrode 1023D corresponding to the high voltage output from the secondary electrode 1022 is detected, whereby overvoltage protection can be carried out for the output of the piezoelectric transformer 1020.

At this time, if the cold cathode tube 1017 is not lit even when the lighting start voltage Vot is reached, the load of the piezoelectric transformer 1020 becomes virtually infinite. As a result, the drive frequency decreases, and a high voltage corresponding to the frequency of the curve T1 shown in FIG. B4B is output. Accordingly, the output voltage from the sensor electrode 1023D corresponding to the curve S1 is detected by the voltage division resistors 1019*a* and 1019*b*, and the comparison circuit 15 compares the voltage value with the set value Vref1 corresponding to the lighting start voltage Vot at the secondary electrode 1022. The drive frequency is decreased and the output voltage is increased until the voltage value obtained by dividing the output voltage from the sensor electrode 1023D reaches the set value Vref1. However, when the voltage value obtained by dividing the output voltage from the sensor electrode 1023D reaches the set value Vref1, the comparison circuit 1015 stops frequency sweep at the variable oscillation circuit 1013 via the frequency control circuit 1014, whereby the drive frequency is fixed.

In addition, while the cold cathode tube 1017 is lit, the overvoltage protection circuit 1010 stops its operation, and only the current control circuit comprising the feedback resistor 1018 and the comparison circuit 1016 operates.

As described above, in the present embodiment, the output voltage of the sensor electrode 1023D is small, that is, about 0.4 times the input voltage applied to the primary electrode of the piezoelectric transformer 1020. The sensor electrode 1023D detects the voltage in proportion to the output voltage obtained from the secondary electrode and supplies the voltage to the overvoltage protection circuit. Therefore, unlike the case of the conventional example, high voltage feedback is not necessary. It is thus not necessary to consider the routing of high voltage lines and creepage distances on a PC board. As a result, the overvoltage protection circuit can be prevented from malfunctioning due to stray capacitances, and the drive apparatus can be made compact.

In addition, the step-up ratio of the piezoelectric transformer is increased before the lighting start of the cold cathode tube. Therefore, it is not necessary to connect voltage division resistor shaving large resistance values to the secondary electrode of the piezoelectric transformer, thereby preventing malfunctions due to variations in resistance values, parasitic capacitances with a PC board and the like.

In the present embodiment, the piezoelectric transformer is formed of piezoelectric ceramic such as PZT. However, a similar characteristic can be obtained even if a single crystal material, such as $LiNbo_3$ is used, provided that the material exhibits a piezoelectric property.

Furthermore, a similar effect can be obtained from a piezoelectric transformer (as shown in FIGS. 1, 5, 7(*a*), 7(*b*) 9, and 11(*a*) to 14(*b*)) having other structure, provided that an electrode outputting a low voltage in proportion to the output voltage is used as a sensor electrode provided independently of the primary and secondary electrodes.

B Second Embodiment

FIG. B5 is a block diagram showing the configuration of a cold cathode tube drive apparatus using a piezoelectric transformer in accordance with a B second embodiment of the present invention. The piezoelectric transformer used for the present embodiment has sensor electrodes provided independently of the primary and secondary electrodes thereof, just as in the case of the B first embodiment. The structure (FIG. B2), the lumped parameter approximate equivalent circuit (FIG. B3) at a frequency near the resonance frequency and the operation characteristic (FIG. B4) of the piezoelectric transformer are also similar to those of the B first embodiment; therefore, the explanations of these are omitted. However, the present embodiment differs from the B first embodiment in the drive method for the piezoelectric transformer 1020 and the configuration of the overvoltage protection circuit.

In FIG. B5, a first AC voltage V1 is applied from a drive circuit 1112 to the primary electrode 1021U and the sensor electrode 1023U of the piezoelectric transformer 1020. A second AC voltage V2 is applied from the drive circuit 1112 to a primary electrode 1021D. When the AC signals V1 and V2 are applied to the primary electrodes 21U and 21D respectively, a high voltage is output from the secondary electrode 1022 of the piezoelectric transformer 1020 just as in the case of the B first embodiment.

The high voltage output from the secondary electrode 1022 is applied to a series circuit comprising a cold cathode tube 1017 and a feedback resistor 1018. In addition, an output Vs from a sensor electrode 1023D and the voltage applied to the sensor electrode 1023U disposed opposite to the sensor electrode 1023D to form a pair, that is, the input voltage V1 to the piezoelectric transformer 1020, are applied to the difference circuit 1056 of an overvoltage protection circuit 1050. The input voltage V1 is herein used as the reference voltage for the output Vs from the sensor electrode 1023D. In the overvoltage protection circuit 1050, the difference circuit 1056 outputs the difference value between the voltage V1 applied to the sensor electrode 1023U and the output voltage Vs from the sensor electrode 1023D. A comparison circuit 55 compares the difference value with a set value Vref1 and outputs an error voltage. The output from the comparison circuit 1055 is applied to an oscillation control circuit 1014. The oscillation control circuit 1014 controls a variable oscillation circuit 1113 so that the high voltage output from the secondary electrode 1022 of the piezoelectric transformer 1020 is prevented from becoming higher than the set voltage.

Furthermore, the voltage (current detection value) generated across the feedback resistor 1018 by the current flowing through the series circuit comprising the cold cathode tube 1017 and the feedback resistor 1018 is applied to a comparison circuit 1016. The comparison circuit 1016 compares the current detection value with a set value Vref2 and outputs an error voltage. The output from the comparison circuit 1016 is applied to the oscillation control circuit 1014. The oscillation control circuit 1014 controls the variable oscillation circuit 1113 so that a nearly constant current flows through the cold cathode tube 1017.

As described above, the oscillation control circuit 1014 has a switching means formed of a switching device or the like (not shown), and carries out control operation on the basis of the output from the comparison circuit 1055 before the lighting start of the cold cathode tube 1017. After the lighting start, control operation is switched from the control operation on the basis of the output from the comparison circuit 1055 to the control operation on the basis of the output from the comparison circuit 1016.

As described above, the present embodiment differs from the B first embodiment in the configuration of the overvoltage protection circuit. In the case of the present embodiment, the difference circuit 1056 detects the difference value between the output from the sensor electrode 1023D and the voltage applied to the sensor electrode 1023U, that is, the input voltage applied to the piezoelectric transformer 1020. The difference value is used for overvoltage protection. In the case when the level of the voltage generating between the sensor electrodes 1023D and 1023U is low, the detection voltage can be amplified by an amplifier circuit as necessary.

In the present embodiment, the piezoelectric transformer is formed of piezoelectric ceramic such as PZT. However, a similar characteristic can be obtained even if a single crystal material, such as $LiNbo_3$ is used, provided that the material exhibits a piezoelectric property.

Furthermore, a similar effect can be obtained from a piezoelectric transformer having other structure, provided that an electrode outputting a low voltage in proportion to the output voltage is used as a sensor electrode provided independently of the primary and secondary electrodes.

B Third Embodiment

FIG. B6 is a block diagram showing the configuration of a part of a cold cathode tube drive apparatus using a piezoelectric transformer in accordance with a B third embodiment of the present invention, that is, the configuration around a piezoelectric transformer drive portion 1011. The piezoelectric transformer used for the present embodiment has a sensor electrode provided independently of the primary and secondary electrodes thereof, just as in the case of the B first embodiment. The structure (FIG. B2), the lumped parameter approximate equivalent circuit (FIG. B3) at a frequency near the resonance frequency and the operation characteristic (FIG. B4) of the piezoelectric transformer are also similar to those of the B first embodiment; therefore, the explanations of these are omitted.

In FIG. B6, a DC power source (not shown) and a capacitor 1061 are connected to an input terminal 1065. The primary windings 1062*a*-1 and 1062*b*-1 of electromagnetic transformers 1062*a* and 1062*b* for voltage amplification are connected to switching transistors 1063*a* and 1063*b* for constituting switching circuits, respectively. These two series circuits are connected in parallel with the capacitor 1061.

One of the primary electrodes, 1021U, and one of the sensor electrodes, 1023U, of a piezoelectric transformer 1020 are grounded, and the other primary electrode 1021D is connected to one of the terminals of the secondary winding 1062*b*-2 of the electromagnetic transformer 1062*b*. The other terminal of the secondary winding 1062*b*-2 of the electromagnetic transformer 1062*b* is connected to one of the terminals of the secondary winding 1062*a*-2 of the electromagnetic transformer 1062*a*. The other terminal of the secondary winding 1062*a*-2 is grounded.

By virtue of the configuration of the piezoelectric transformer drive portion 1011 described above, the DC power source supplied to the primary windings 1062*a*-1 and 1062*b*-1 of the electromagnetic transformers 1062*a* and 1062*b* is switched by the switching transistors 1063*a* and 1063*b* respectively at a predetermined frequency on the basis of the control signal from an oscillation control circuit 1014. Therefore, stepped-up AC voltages are generated at the series-connected secondary windings 1062*a*-2 and 1062*b*-2 of the electromagnetic transformers 1062*a* and 1062*b* respectively, and the voltages are used in series to drive the piezoelectric transformer 1020.

The secondary electrode 1022 of the piezoelectric transformer is connected to a series circuit comprising a load 1060 (a cold cathode tube for example) and a feedback resistor 1064. The voltage generated across the feedback resistor 1064 by the current flowing thorough this series circuit is sent as a current detection value to such an oscillation control circuit 1014 as that shown in FIG. B1 or B5.

In addition, a sensor electrode 1023D is connected to a voltage divider circuit comprising voltage division resistors 1019*a* and 1019*b*. The voltage applied to the voltage division resistor 1019*a* is sent to the overvoltage protection circuit shown in FIG. B1 or B5.

The on/off frequency of the switching transistors 1063*a* and 1063*b* is set by the control signal from the oscillation control circuit 14 at a frequency near the frequency in the primary mode of vertical vibration in the longitudinal direction wherein the half wavelength of the frequency signal is equal to the overall length of the piezoelectric transformer 1020.

FIG. B7 shows a displacement distribution and a stress distribution in the case when an resonator 1071 corresponding to a piezoelectric element 1029 is operated in the primary mode of vertical vibration in the longitudinal direction. The voltage waveform input to the primary electrode 1021D of the piezoelectric transformer 1020 can be brought close to a sine waveform by setting the resonance frequency of a series circuit comprising the inductor of the secondary winding 1062*a*-2 of the electromagnetic transformer 1062*a*, the inductor of the secondary winding 1062*b*-2 of the electromagnetic transformer 1062*b* and the capacitance between the primary electrodes 1021U and 1021D of the piezoelectric transformer 1020 at a frequency near the resonance frequency of the piezoelectric transformer 1020. In addition, a desired stepped-up sine waveform voltage is output from the secondary electrode 1022 of the piezoelectric transformer 1020 by carrying out predetermined switching control for the switching transistors 1063*a* and 1063*b* and by inputting a sine waveform signal to the piezoelectric transformer 1020.

In the case when a Rosen-type piezoelectric transformer is driven by a sine waveform signal, the half wavelength of which corresponds to the overall length of the piezoelectric transformer, the frequency components of the signal include secondary, tertiary and other harmonics in addition to the fundamental frequency component. In particular, the secondary mode of vertical vibration in the longitudinal direction is excited by the secondary harmonic components, thereby deforming the waveform of the output voltage and lowering the reliability of the piezoelectric transformer element and load. In this way, the excitation in the multi-modes including numerous harmonic components may cause malfunctions when the sensor electrode 1023D performs overvoltage protection.

However, in the present embodiment, the two electromagnetic transformers 1062*a* and 1062*b* and the two switching transistors 1063*a* and 1063*b* are used to drive the piezoelectric transformer 1020, whereby the even-numbered-order harmonic components of the switching frequency components included in the input voltage to the piezoelectric transformer 1020 can be decreased, and the unnecessary vibration of the piezoelectric transformer 1020 can be prevented. As a result, the sensor electrode 1023D does not detect any unnecessary vibration. Therefore, the drive apparatus is prevented from malfunctioning due to signal components other than desired frequency components.

Furthermore, a similar effect can be obtained from a piezoelectric transformer having other structure, provided that an electrode outputting a low voltage in proportion to the output voltage is used as a sensor electrode provided independently of the primary and secondary electrodes.

B Fourth Embodiment

FIG. B8 is a block diagram showing the configuration of a part of a cold cathode tube drive apparatus using a piezoelectric transformer in accordance with a B fourth embodiment of the present invention, that is, the configuration around a piezoelectric transformer drive portion 1011. The piezoelectric transformer used for the present embodiment has a sensor electrode provided independently of the primary and secondary electrodes thereof, just as in the case of the B first embodiment. The structure (FIG. B2), the lumped parameter approximate equivalent circuit (FIG. B3) at a frequency near the resonance frequency and the operation characteristic (FIG. B4) of the piezoelectric transformer are also similar to those of the B first embodiment; therefore, the explanations of these are omitted.

The present embodiment differs from the B third embodiment in that a half-wave sine waveform voltage signal, one wavelength of which is equal to the-overall length of the piezoelectric transformer, is applied to the piezoelectric transformer by using one electromagnetic transformer and one switching transistor to drive the piezoelectric transformer and by using the secondary mode of vertical vibration in the longitudinal direction as a vibration mode. This difference will be described below.

In FIG. B8, a DC power source (not shown) is connected to an input terminal 1065, and a capacitor 1061 is also connected thereto. One series circuit comprising the primary winding 1082-1 of an electromagnetic transformer 1082 for voltage amplification and a switching transistor 1083 constituting a switching circuit is connected in parallel with the capacitor 1061.

By virtue of the configuration of the piezoelectric transformer driver portion 1011 described above, the DC power source supplied to the primary winding 1082-1 of the electromagnetic transformer 1082 is switched by the switching transistor 1083 at a predetermined frequency on the basis of the control signal from an oscillation control circuit 1014. Therefore, a stepped-up AC voltage is generated at the secondary winding 1082-2 of the electromagnetic transformer 1082, and this voltage is used to drive the piezoelectric transformer 1020.

The on/off frequency of the switching transistor 1083 is set by the control signal from the oscillation control circuit 14 at a frequency near the frequency in the secondary mode of vertical vibration in the longitudinal direction wherein the one wavelength of the frequency signal is equal to the overall length of the piezoelectric transformer 1020.

FIG. B9 shows a displacement distribution and a stress distribution in the case when an resonator 1091 corresponding to a piezoelectric element 1029 is operated in the secondary mode of vertical vibration in the longitudinal direction. A desired stepped-up sine waveform voltage is output from the secondary electrode 1022 of the piezoelectric transformer 1020 by carrying out predetermined switching control for the switching transistors 1083 and by inputting a half-wave sine waveform to the piezoelectric transformer 1020.

In the case when a Rosen-type piezoelectric transformer is driven by a half-wave sine waveform signal, the frequency components of the signal include secondary, tertiary and other harmonics in addition to the fundamental frequency component. However, the Rosen-type piezoelectric transformer does not excite the quaternary mode of vertical vibration in the longitudinal direction for the secondary harmonic components. Therefore, unnecessary vibration hardly occurs, and the waveform of the output voltage becomes a sine-waveform.

Furthermore, in the case when the piezoelectric transformer drive portion 1011 comprises one set of the electromagnetic transformer 1082 and the switching transistor 1083 and when the piezoelectric transformer is driven in the secondary mode of vertical vibration in the longitudinal direction, unnecessary resonance does not occur. Therefore, the sensor electrode 1023D can detect a desired vibration.

Furthermore, the number of components, such as switching devices, inductive devices and the like, for the present embodiment can be made less than that for the B third embodiment. This effect of the reduction is very significant.

An electromagnetic transformer is used as an inductive device in the present embodiment. However, by using an inductor instead of the electromagnetic transformer, by using the electrode opposite to the sensor electrode as a ground electrode, and by using a configuration similar to that of the present embodiment, the apparatus can be made more compact, and an effect similar to that of the present embodiment can be obtained. Therefore, the effect is significant.

Furthermore, a similar effect can be obtained from a piezoelectric transformer having other structure, provided that an electrode outputting a low voltage in proportion to the output voltage is used as a sensor electrode provided independently of the primary and secondary electrodes.

B Fifth Embodiment

In the present embodiment, a cold cathode tube drive apparatus using a piezoelectric transformer will be described below referring to FIGS. B10 to B14 by paying attention to the inequality relationship between the impedance ($1/(\omega \cdot Cd2)$) calculated from the output capacitance (Cd2: corresponding to a bound capacitance shown in FIG. 3) at the secondary electrode of the piezoelectric transformer and the impedance of a load (a cold cathode tube) and the inequality relationship between the impedance ($1/(\omega \cdot Cs)$) calculated from the capacitance between the sensor electrodes (Cs: corresponding to a bound capacitance shown in FIG. 3) and the impedance of a load connected to the sensor electrode.

The piezoelectric transformer used for the present embodiment has sensor electrodes provided independently of the primary and secondary electrodes of the transformer, just as in the case of the B first embodiment.

In the piezoelectric transformer of the present embodiment, the force factor A1 is larger than A2 (A3), and voltage step-up is carried out by the two-equivalent ideal transformers shown in FIG. B3. In addition, the piezoelectric transformer includes a series resonance circuit comprising an equivalent mass and an equivalent compliance. Therefore, particularly when the value of the load resistor is large, the output voltage becomes larger than the value obtained on the basis of the transformation ratios of the transformers.

The voltage output from the sensor electrode 1023D of the piezoelectric transformer 1020 is determined by the load connected to the sensor electrode 1023D, and the voltage output from the secondary electrode 1022 is determined by the load connected to the secondary electrode 1022. Furthermore, in order that the output from the secondary electrode 1022 of the piezoelectric transformer can be monitored by the sensor electrode 1023D, the change of the step-up ratio at the sensor electrode 1023D is required to coincide with that at the secondary electrode 1022.

FIGS. B10 to B13 show the step-up ratio between the primary and secondary electrodes and the step-up ratio between the primary electrode and the sensor electrode of the piezoelectric transformer with respect to frequency.

First, a case is assumed wherein the inequality relationship between the impedance ($1/(\omega \cdot Cd2)$) calculated from the output capacitance at the secondary electrode of the piezoelectric transformer and the impedance of the load (the cold cathode tube) differs from the inequality relationship between the impedance $(1/(\omega \cdot Cs))$ calculated from the capacitance between the sensor electrodes (Cs: corresponding to the bound capacitance shown in FIG. 3) and the impedance of the load connected to the sensor electrode. FIGS. 10 and 11 show the frequency characteristics of the step-up ratio before and after the lighting start of the cold cathode tube in the above-mentioned case, respectively.

In the case of FIG. B10, the impedance calculated from the output capacitance Cd2 of the piezoelectric transformer is $1/(\omega \cdot Cd2)$, and this value is several hundred kΩ. The output load of the piezoelectric transformer is in a nearly open state before the lighting start of the cold cathode tube (the load is herein assumed to be a resistor of 6 MΩ), and the inequality relationship between these values becomes the relationship represented by expression 1 described below.

Expression 1

The impedance calculated from the output capacitance of the piezoelectric transformer < the impedance of the load On the other hand, it is assumed that a resistor of 1 k Ω, a load smaller than the impedance calculated by $1/(\omega Cs)$, is connected to the sensor electrode.

In this case, the inequality relationship between the two values becomes the relationship represented by expression 2 described below.

Expression 2

The impedance calculated from the capacitance between the sensor electrodes>the impedance of the load of the sensor electrode Herein, $\omega$ is represented by $\omega=2\times\pi fd$, and fd designates the resonance frequency of the piezoelectric transformer. In FIG. B10, T10 designates the step-up ratio at the secondary electrode of the piezoelectric transformer, and S10 designates the step-up ratio at the sensor electrode. Furthermore, in FIG. B11, the output load of the piezoelectric transformer is a resistor of 100 kΩ after the lighting start of the cold cathode tube. T11 designates the step-up ratio at the secondary electrode, and S11 designates the step-up ratio at the sensor electrode.

Accordingly, regarding the above-mentioned inequality relationship between the impedance obtained by the calculation and the impedance of the load, the expression 1 and the expression 2 represent inequality relationships different from each other. In this case, the following problem occurs.

That is to say, in order that overvoltage control can be carried out at the time of the opening of the output terminals of the piezoelectric transformer (before the lighting start of the cold cathode tube),the frequency characteristic of the step-up ratio at the secondary electrode is required to be identical with that at the sensor electrode as described above.

On the other hand, in the case when a load (1kΩ) sufficiently smaller than the load calculated by $1/(\omega Cs)$ is connected to the sensor electrode as shown in FIGS. B10 and B11, the output from the sensor electrode corresponds to the load of the sensor electrode. Therefore, the vibration of the piezoelectric transformer depends on the load of the sensor electrode, whereby disparities in frequency characteristics occur between T10 and S10 and between T11 and S11. Particularly when the frequencies corresponding to the peaks do not coincide with each other, overvoltage control using the sensor electrode becomes difficult.

Next, FIGS. B12 and B13 show the frequency characteristics of the step-up ratios before and after the lighting start of the cold cathode tube, respectively, in the case when the inequality relationship between the impedance $(1/\omega \cdot Cd2))$ calculated from the output capacitance at the secondary electrode of the piezoelectric transformer and the impedance of the load (the cold cathode tube) coincides with the inequality relationship between the impedance calculated from the capacitance between the sensor electrodes and the impedance of the load connected to the sensor electrode.

In FIG. B12, the output load of the piezoelectric transformer is 6 MΩ just as in the case of FIG. B10. In this case, as described above, the relationship represented by the expression 1 described below is obtained.

Expression 1

The impedance calculated from the output capacitance of the piezoelectric transformer<the impedance of the load On the other hand, the load connected to the sensor electrode is assumed to be 30 kΩ, that is, an impedance sufficiently larger than the impedance calculated by $1/\omega Cs$)

In this case, the inequality relationship between the two values becomes the relationship represented by the expression 3 described below.

Expression 3

The impedance calculated from the capacitance between the sensor electrodes<the resistance of the load of the sensor electrode Herein, T12 designates the step-up ratio at the secondary electrode, and S12 designates the step-up ratio at the sensor electrode. Furthermore, in FIG. B13, the output load of the piezoelectric transformer is a resistor of 100 kΩ just as in the case of FIG. B11. T13 designates the step-up ratio at the secondary electrode, and S13 designates the step-up ratio at the sensor electrode.

Accordingly, in this case, regarding the above-mentioned inequality relationship between the impedance obtained by the calculation and the impedance of the load, the expression 1 and the expression 3 represent inequality relationships identical to each other. The following effect is thus delivered.

That is to say, in the case when a large load is connected to the secondary electrode of the piezoelectric transformer in accordance with the load obtained at the time of the opening of the output terminals of the piezoelectric transformer, energy transmission from the piezoelectric transformer is mainly carried out from the secondary electrode and less affected by the load of the sensor electrode as shown in FIGS. B12 and B13. Therefore, unlike the cases shown in FIGS. B10 and B11, the frequency corresponding to the peak value of the step-up ratio at the secondary electrode coincides with the frequency corresponding to the peak value of the step-up ratio at the at the sensor electrode, whereby overvoltage control is made possible.

As described above, the load connected to the sensor electrode is determined so that the relationship (refer to the expression 1) between the output capacitance at the secondary electrode of the piezoelectric transformer and the load connected to the secondary electrode is equal to the relationship (refer to the expression 3) between the capacitance between the sensor electrodes and the load connected to the sensor electrode. Therefore, the overvoltage at the secondary electrode of the piezoelectric transformer can be controlled by the sensor electrode.

However, when it is assumed that the load connected to the sensor electrode of the piezoelectric transformer is a resistor having a high impedance, a sufficient effect can be obtained in view of preventing the reduction of energy transmission from the primary side to the secondary side. However, the overvoltage protection circuit may malfunction owing to variations in resistance values, parasitic capacitances to a PC board and the like, just as in the case when resistors are connected to the secondary electrode of the piezoelectric transformer in the conventional example. A solution to this problem will thus be described next.

FIG. B14 shows the relationship between the load connected to the sensor electrode and the difference between the frequency at the peak of the step-up ratio at the secondary electrode and that at the sensor electrode. As known from FIG. B14, when the magnitude of the load of the sensor electrode changes, the difference between the frequencies at the peaks of the step-up ratios also changes. However, by setting the load connected to the sensor electrode at least at double the impedance calculated by $1/\omega Cs$ ($\omega=2\times\pi\times fd$, wherein Cs is the capacitance between the pair of sensor electrodes, the frequency at the peak of the step-up ratio at the secondary electrode can be made nearly equal to that at the sensor electrode. Therefore, the overvoltage protection for the piezoelectric transformer can be carried out.

The above descriptions deal with the cases wherein both the load at the secondary electrode of the piezoelectric transformer and the load connected to the sensor electrode are resistors. However, the loads are not limited to resistors. For example, a load formed of a resistor and a capacitor connected in parallel may also be used for one or both of the loads. Even in such cases, an effect similar to that described above is delivered because of the same reason as that described above.

B Sixth Embodiment

FIG. B15 is a block diagram showing the configuration of a part of a cold cathode tube drive apparatus using a piezoelectric transformer in accordance with a B sixth embodiment of the present invention, that is, the configuration around a piezoelectric transformer drive portion 1011. The piezoelectric transformer used for the present embodiment has sensor electrodes provided independently of the primary and secondary electrodes thereof, just as in the case of the B first embodiment. The structure (FIG. B2), the lumped parameter approximate equivalent circuit (FIG. B3) at a frequency near the resonance frequency and the operation characteristic (FIG. B4) of the piezoelectric transformer are also similar to those of the B first embodiment; therefore, the explanations of these are omitted. The present embodiment differs from the B third embodiment shown in FIG. 36 in the method of driving the piezoelectric transformer and the configuration of the overvoltage protection circuit.

In FIG. B15, a DC power source (not shown) and a capacitor 1061 are connected to an input terminal 1065. The primary windings 1062a-1 and 1062b-1 of electromagnetic transformers 1062a and 1062b for voltage amplification are connected to switching transistors 1063a and 1063b for constituting switching circuits, respectively to form two series circuits. These two series circuits are connected in parallel with the capacitor 1061.

One of the primary electrodes, 1021U, of a piezoelectric transformer 1020 and one of the sensor electrodes, 1023U, thereof are connected to one of the terminals of the secondary winding 1062b-2 of the electromagnetic transformer 1062b. The other terminal of the secondary winding is grounded. In addition, the other primary electrode 1021D of the piezoelectric transformer 1020 is connected to one of the terminals of the secondary winding 1062a-2 of the electromagnetic transformer 1062a. The other terminal of the secondary winding is grounded.

By virtue of the configuration of the piezoelectric transformer drive portion 1011 described above, the DC power source supplied to the primary windings 1062a-1 and 1062b-1 of the electromagnetic transformers 1062a and 1062b is switched by the switching transistors 1063a and 1063b respectively at a predetermined frequency on the basis of the control signal from an oscillation control circuit 1014. Therefore, stepped-up AC voltages are generated at the secondary windings 1062a-2 and 1062b-2 of the electromagnetic transformers 1062a and 1062b respectively, and the voltages are used in parallel to drive the piezoelectric transformer 1020.

The secondary electrode 1022 of the piezoelectric transformer 1020 is connected to a series circuit comprising a load 1060 (a cold cathode tube for example) and a feedback resistor 1064. The voltage generated across the feedback resistor 1064 by the current flowing thorough this series circuit is sent as a current detection value to such an oscillation control circuit 1014 as that shown in FIG. B1 or B5.

In addition, the detection voltage from a sensor electrode 1023D is supplied to one of the inputs of a difference circuit 1056. The input voltage applied to the sensor electrode 1023U and the primary electrode 1021U is supplied to the other input of the difference circuit 1056. The difference value from the difference circuit 1056 is sent to the comparison circuit 1055 of such an overvoltage protection circuit 1050 as that shown in FIG. B5.

Just as in the case of the B third embodiment, the on/off frequency of the switching transistors 1063a and 1063b is set by the control signal from the oscillation control circuit 14 at a frequency near the frequency in the primary mode of vertical vibration in the longitudinal direction wherein the half wavelength of the frequency signal is equal to the overall length of the piezoelectric transformer 1020.

The voltage waveform input to the primary electrodes 1021U and 1021D of the piezoelectric transformer 1020 can be brought close to a sine waveform by setting the resonance frequency of a series circuit comprising the inductor of the secondary winding 1062a-2 of the electromagnetic transformer 1062a, the inductor of the secondary winding 1062b-2 of the electromagnetic transformer 1062b and the capacitance between the primary electrodes 1021U and 1021D of the piezoelectric transformer 1020 at a frequency near the resonance frequency of the piezoelectric transformer 1020. In addition, a desired stepped-up sine waveform voltage is output from the secondary electrode 1022 of the piezoelectric transformer 1020 by carrying out predetermined switching control for the switching transistors 1063a and 1063b and by inputting a sine waveform signal to the piezoelectric transformer 1020.

In the case when a Rosen-type piezoelectric transformer is driven by a sine waveform signal, the half wavelength of which corresponds to the overall length of the transformer, the frequency components of the signal include secondary, tertiary and other harmonics in addition to the fundamental frequency component. In particular, the secondary mode of vertical vibration in the longitudinal direction is excited by the secondary harmonic components, thereby deforming the waveform of the output voltage and lowering the reliability of the piezoelectric transformer element and load. In this way, the excitation in the multi-modes including numerous harmonic components may cause malfunctions when the sensor electrode 1023D performs overvoltage protection.

However, in the present embodiment, the two electromagnetic transformers 1062a and 1062b and the two switching transistors 1063a and 1063b are used to drive the piezoelectric transformer 1020, whereby the even-numbered-order harmonic components of the switching frequency components included in the input voltage to the piezoelectric transformer 1020 can be decreased, and the unnecessary vibration of the piezoelectric transformer 1020 can be prevented. As a result, the sensor electrode 1023D does not detect any unnecessary vibration. Therefore, the drive apparatus is prevented from malfunctioning due to signal components other than desired frequency components.

In the present embodiment, electromagnetic transformers are used as inductive devices. However, a similar effect can be obtained even when the inductive devices are formed of inductors or auto transformer structures.

Furthermore, a similar effect can be obtained from a piezoelectric transformer having other structure, provided that an electrode outputting a low voltage in proportion to the output voltage is used as a sensor electrode provided independently of the primary and secondary electrodes.

The above-mentioned embodiment of the present invention has been described by using the piezoelectric transformer having the structure shown in FIG. B2. However, it is possible to use a piezoelectric transformer provided with an insulation layer 1160 disposed between primary electrodes 1161U and 1161D and sensor electrodes 1163U and 1163D for example as shown in FIG. B16. Herein, numeral 1162 designates a secondary electrode, numeral 1164 designates a sensor portion, and numeral 1165 designates a low impedance portion and numeral 1166 designates a high impedance portion. In the case of the piezoelectric transformer shown in FIG. B16, it is not necessary to use one of the primary electrodes as a voltage reference electrode (ground electrode) Therefore, the drive circuit for the piezoelectric transformer can be configured just like the conventional drive circuit.

In the case when the piezoelectric transformer shown in FIG. 16 is used in the circuit shown in FIG. 1, the other secondary electrode of piezoelectric transformer is shared with the primary electrode 1161D or the sensor electrode 1163U.

As detailed above, in the cold cathode tube drive apparatus using a piezoelectric transformer in accordance with the present invention, the piezoelectric transformer is provided with sensor electrodes provided independently of the primary and secondary electrodes. Therefore, overvoltage protection at the secondary side of the piezoelectric transformer, in which a high voltage generates before the lighting start of the cold cathode tube, can be carried out by using a relatively low voltage from the sensor electrode. In addition, the vibration of the piezoelectric transformer can easily be fed back by the sensor electrode. As a result, at the time of protecting the piezoelectric transformer against overvoltage, routing high-voltage lines to the protection circuit can be eliminated, and the malfunction of the drive apparatus owing to the unnecessary vibration of the piezoelectric transformer can be prevented. It is thus possible to provide a compact, highly efficient, highly reliable cold cathode tube drive apparatus using a piezoelectric transformer. The effect is significant in practical use.

What is claimed is:

1. A piezoelectric transformer comprising:

a rectangular plate having its longitudinal direction as its main direction thereof and mainly formed of a piezoelectric material, a drive portion having a set of primary electrodes formed on the opposite faces of said rectangular plate in the direction of the thickness thereof and at a region retracted from an end face of said rectangular plate in the longitudinal direction thereof, a power generation portion having a set of secondary electrodes formed on said rectangular plate, and a set of third electrodes formed on the opposite faces of said rectangular plate in the direction of the width thereof and adjacent to a region from which said primary electrodes are retracted.

2. A piezoelectric transformer in accordance with claim 1, wherein one of said set of secondary electrodes is shared with one of said set of primary electrodes, and one of said set of third electrodes is shared with one of said set of primary electrodes.

3. A piezoelectric transformer in accordance with claim 1, wherein said primary electrodes are formed by stacking piezoelectric sheets and internal electrodes alternately.

* * * * *